US009740105B2

(12) United States Patent
Hori et al.

(10) Patent No.: US 9,740,105 B2
(45) Date of Patent: Aug. 22, 2017

(54) RESIST PATTERN FORMATION METHOD AND RESIST COMPOSITION

(71) Applicant: Tokyo Ohka Kogyo Co., Ltd., Kawasaki-shi (JP)

(72) Inventors: Yoichi Hori, Kawasaki (JP); Shinichi Hidesaka, Kawasaki (JP); Takeaki Shiroki, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/033,201

(22) Filed: Sep. 20, 2013

(65) Prior Publication Data

US 2014/0093827 A1 Apr. 3, 2014

(30) Foreign Application Priority Data

Sep. 28, 2012 (JP) ................................. 2012-217296

(51) Int. Cl.
*G03F 7/004* (2006.01)
*G03F 7/30* (2006.01)
*G03F 7/40* (2006.01)
*G03F 7/039* (2006.01)

(52) U.S. Cl.
CPC .............. *G03F 7/40* (2013.01); *G03F 7/0397* (2013.01); *G03F 7/30* (2013.01)

(58) Field of Classification Search
CPC .......... G03F 7/038; G03F 7/0397; G03F 7/30; G03F 7/40
USPC ........................................ 430/326, 330, 331
See application file for complete search history.

(56) References Cited

U.S. PATENT DOCUMENTS 7,767,379 B2 * 8/2010 Dazai .................... C08F 220/38 430/270.1
7,998,654 B2 * 8/2011 Nishiyama et al. ....... 430/270.1
7,998,664 B2 * 8/2011 Noya et al. ................... 430/331
8,192,915 B2 * 6/2012 Dazai et al. ............... 430/270.1
8,574,811 B2 * 11/2013 Masuyama et al. ....... 430/270.1
9,023,581 B2 * 5/2015 Kawaue ................ C07C 309/04 430/270.1
2003/0057507 A1 * 3/2003 Bozso ................. H01L 31/1133 257/428
2004/0029395 A1 2/2004 Zhang et al.
2004/0029396 A1 2/2004 Zhang et al.
2004/0053800 A1 3/2004 Zhang et al.
2004/0110085 A1 6/2004 Iwai et al.
2006/0154187 A1 * 7/2006 Wilson .................... G03F 7/322 430/331
2008/0206671 A1 * 8/2008 Thackeray ............ G03F 7/0045 430/270.1
2008/0248425 A1 10/2008 Nishiyama et al.
2009/0197204 A1 8/2009 Shiono et al.
2009/0317743 A1 12/2009 Shiono et al.
2010/0190106 A1 7/2010 Tsubaki
2010/0233634 A1 9/2010 Noya et al.
2010/0310985 A1 12/2010 Mori et al.
2011/0117499 A1 5/2011 Matsumiya et al.
2011/0177455 A1 * 7/2011 Harada et al. ............. 430/285.1
2011/0236828 A1 * 9/2011 Hirano ................. C07D 307/93 430/270.1
2011/0305991 A1 12/2011 Nishiyama et al.
2011/0311913 A1 * 12/2011 Suzuki .................. G03F 7/0045 430/270.1
2012/0009527 A1 1/2012 Hatakeyama et al.
2012/0129104 A1 5/2012 Aqad et al.
(Continued)

FOREIGN PATENT DOCUMENTS

JP A-2003-241385 8/2003
JP A-2004-078217 3/2004
(Continued)

OTHER PUBLICATIONS

Office Action in Japanese Patent Application No. 2012-217296, dated Mar. 8, 2016.

*Primary Examiner* — John S Chu
(74) *Attorney, Agent, or Firm* — Knobbe Martens Olson & Bear LLP

(57) ABSTRACT

A resist pattern formation method including formation of a resist film, exposure, development, and subsequent rinsing using a resist composition containing a high-molecular compound having a constituent unit represented by the formula (a0-1), a constituent unit containing an acid decomposable group whose polarity increases by the action of an acid, and a constituent unit containing a group represented by the formula (a2-r-1). R represents a hydrogen atom, an alkyl group, or a halogenated alkyl group; $Ra^{01}$ represents a lactone-containing polycyclic group, an —$SO_2$-containing polycyclic group, or a cyano group-containing polycyclic group; $Ra'^{21}$ represents a hydrogen atom, an alkyl group, an alkoxy group, a halogen atom, a halogenated alkyl group, a hydroxyl group, —COOR", —OC(═O)R", a hydroxyalkyl group, or a cyano group; R" represents a hydrogen atom or an alkyl group; and n' represents an integer of from 0 to 2.

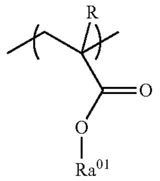

(a0-1)

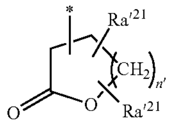

(a2-r-1)

8 Claims, 1 Drawing Sheet

(56) References Cited

U.S. PATENT DOCUMENTS

| | | | | |
|---|---|---|---|---|
| 2012/0135347 | A1* | 5/2012 | Utsumi | C07D 307/00 430/270.1 |
| 2012/0149916 | A1 | 6/2012 | Utsumi et al. | |
| 2012/0183904 | A1 | 7/2012 | Sagehashi et al. | |
| 2013/0164694 | A1 | 6/2013 | Wang et al. | |
| 2013/0230804 | A1 | 9/2013 | Sakakibara et al. | |
| 2015/0111135 | A1 | 4/2015 | Kataoka et al. | |
| 2016/0026090 | A1* | 1/2016 | Koh | G03F 7/426 430/311 |

FOREIGN PATENT DOCUMENTS

| | | | | |
|---|---|---|---|---|
| JP | A-2007-093910 | | 4/2007 | |
| JP | A-2007-140188 | | 6/2007 | |
| JP | A-2007-219009 | | 8/2007 | |
| JP | A-2008-268915 | | 11/2008 | |
| JP | A-2009-025723 | | 2/2009 | |
| JP | B-4323249 | | 9/2009 | |
| JP | A-2010-002870 | | 1/2010 | |
| JP | A-2010-032994 | | 2/2010 | |
| JP | A-2010-277043 | | 12/2010 | |
| JP | A-2011-013569 | | 1/2011 | |
| JP | A-2011-085814 | | 4/2011 | |
| JP | A-2011-128226 | | 6/2011 | |
| JP | WO 2011158817 | A1 * | 12/2011 | C07C 309/04 |
| JP | A-2012-032806 | | 2/2012 | |
| JP | A-2012-042531 | | 3/2012 | |
| JP | A-2012-111753 | | 6/2012 | |
| JP | A-2012-144666 | | 8/2012 | |
| JP | A-2014-026102 | | 2/2014 | |
| WO | WO 2008/153110 | A1 | 12/2008 | |
| WO | WO 2012/020747 | A1 | 2/2012 | |
| WO | WO 2012/053527 | A1 | 4/2012 | |
| WO | WO 2014/017269 | A1 | 1/2014 | |

* cited by examiner

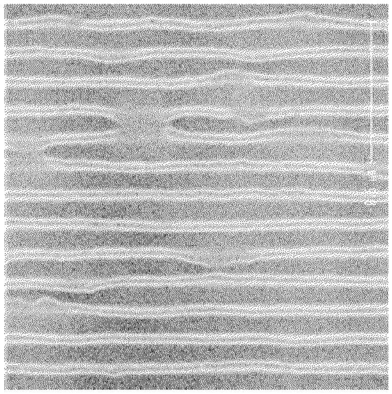
EVALUATION C
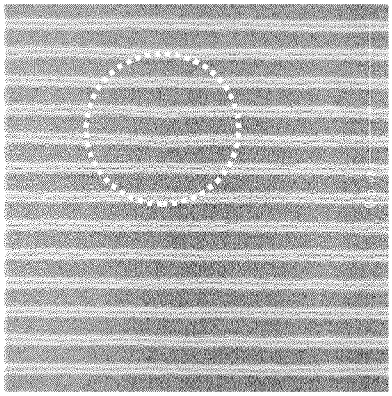
EVALUATION B
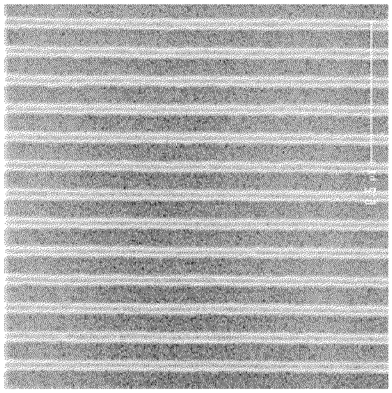
EVALUATION A

RESIST PATTERN FORMATION METHOD AND RESIST COMPOSITION

CROSS-REFERENCE TO RELATED APPLICATION

The present application claims priority under 35 U.S.C. §119(a)-(d) to Japanese Patent Application No. 2012-217296, filed Sep. 28, 2012, the content of which is incorporated herein by reference.

BACKGROUND OF THE INVENTION

Field of the Invention

The present invention relates to a resist pattern formation method and a resist composition.

Related Art

In the lithography technology, there is, for example, performed a process in which a resist film composed of a resist material is formed on a substrate, and the resist film is subjected to selective exposure and development treatment, thereby forming a resist pattern having a predetermined shape on the resist film. A resist material in which an exposed area becomes soluble in a developing solution is called a positive type, and a resist material in which an exposed area becomes insoluble in a developing solution is called a negative type.

In recent years, in the manufacture of semiconductor elements and liquid crystal display elements, advances in the lithography technology have led to rapid progress in the field of pattern miniaturization. As a method of miniaturization, in general, shortening (generation of high energy) of an exposure light source is performed. Specifically, ultraviolet rays typified by g-line and i-line have been conventionally used. But, at present, mass production of semiconductor elements using a KrF excimer laser or an ArF excimer laser is now started. In addition, research is also being made regarding the lithography technology using an exposure light source having a wavelength shorter (higher energy) than these excimer lasers, such as EUV (extreme ultraviolet ray), EB (electron beam), and an X ray.

The resist material is required to have sensitivity to these exposure light sources, high resolution capable of reproducing a pattern with minute dimensions, and lithography properties such as mask reproducibility and also have a satisfactory resist pattern shape.

As a resist material that satisfies these requirements, a chemically amplified resist composition containing a base material component whose solubility in a developing solution changes by the action of an acid and an acid generator component that generates an acid upon exposure has been conventionally used.

For example, in the case where the developing solution is an alkali developing solution (alkali development process), a resist composition containing a resin component (base resin) whose solubility in an alkali developing solution increases by the action of an acid and an acid generator component is generally used as a positive-type chemically amplified resist composition. In a resist film which is formed using such a resist composition, when selective exposure is performed at the time of forming a resist pattern, an acid is generated from the acid generator component in an exposed area, and the polarity of the base resin increases by the action of the acid, whereby the exposed area becomes soluble in the alkali developing solution. Accordingly, by performing the alkali development, a positive-type pattern in which an unexposed area remains as a pattern is formed.

On the other hand, in the case where such a chemically amplified resist composition is applied to a solvent development process using a developing solution containing an organic solvent (organic developing solution), when the polarity of the base resin increases, the solubility in the organic developing solution is relatively lowered. Thus, a negative-type resist pattern in which an unexposed area of the resist film is dissolved in the organic developing solution and removed, whereas an exposed area remains as a pattern is formed. The solvent development process for forming such a negative-type resist pattern is sometimes referred to as a negative-type development process (see, for example, Patent Document 1).

In general, the base resin which is used in the chemically amplified resist composition has plural constituent units for the purpose of enhancing lithography properties and the like. For example, in the case of a resin component whose solubility in an alkali developing solution increases by the action of an acid, a constituent unit containing an acid decomposable group whose polarity increases upon decomposition by the action of an acid generated from an acid generator or the like is used. Besides, a constituent unit containing a lactone-containing cyclic group, a constituent unit containing a polar group such as a hydroxyl group, and the like are used (see, for example, Patent Document 2).

In addition, a resin having a constituent unit containing a cyclic group containing an —$SO_2$— structure is proposed as the base resin. It is said that such a base resin contributes to enhancements of a resist pattern shape as well as mask reproducibility and lithography properties such as reduction of roughness.

Now, this roughness means roughness of the resist pattern surface and causes a defective shape of the resist pattern. For example, a roughness of line width (line width roughness (LWR)) causes a defective shape typified by ununiformity of line width in a line-and-space pattern. There is a concern that the defect of the resist pattern shape adversely affects the formation of a minute semiconductor element, or the like, and when the pattern is finer, its improvement becomes important.

Furthermore, with advances of miniaturization of the pattern, in addition to the above-described problem of roughness, problems such as attachment of extraneous matters onto the pattern surface at the time of development and pattern collapse become visualized. In order to solve such problems, a pattern formation method in which a resist film composed of a resist material is formed on a substrate and subjected to selective exposure and development treatment, followed by a rinse treatment with a rinse solution is proposed (see, for example, Patent Document 3).

Patent Document 1: JP-A-2009-025723
Patent Document 2: JP-A-2003-241385
Patent Document 3: JP-A-2007-219009

SUMMARY OF THE INVENTION

However, the present inventors have newly found that in forming a resist pattern, in the case of performing a rinse treatment with a rinse solution after a development treatment, there is involved such a problem that a resist pattern shape changes easily before and after the rinse treatment. This problem is remarkably generated especially on the occasion of forming a resist pattern of minute dimensions. For example, in the case of forming a line pattern, a phenomenon in which the line is partially curved (hereinafter referred to as "pattern slippage") is generated in apart or the whole of the line pattern, so that the resist pattern shape becomes defective.

In view of the foregoing circumstances, the present invention has been made, and an object thereof is to obtain a resist pattern having a satisfactory shape in forming a resist pattern by performing a rinse treatment after a development treatment.

In order to achieve the foregoing object, a first embodiment of the present invention is concerned with a resist pattern formation method comprising a step of forming a resist film on a support by using a resist composition which generates an acid upon exposure and in which a solubility thereof in a developing solution changes by the action of the acid; a step of exposing the resist film; a step of developing the resist film; and a step of after developing the resist film, performing a rinse treatment, wherein the resist composition contains a base material component (A) whose solubility in the developing solution changes by the action of an acid, the base material component (A) containing a high-molecular compound (A1) having a constituent unit (a0) represented by the following general formula (a0-1), a constituent unit (a1) containing an acid decomposable group whose polarity increases by the action of an acid, and a constituent unit (a2) containing a group represented by the following general formula (a2-r-1).

[Chemical Formula 1]

(a0-1)

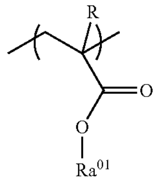

(a2-r-1)

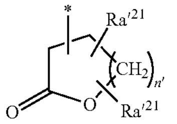

In the formula (a0-1), R represents a hydrogen atom, an alkyl group having from 1 to 5 carbon atoms, or a halogenated alkyl group having from 1 to 5 carbon atoms; and $Ra^{01}$ represents a lactone-containing polycyclic group, an —$SO_2$-containing polycyclic group, or a cyano group-containing polycyclic group. In the formula (a2-r-1), each of $Ra'^{21}$s independently represents a hydrogen atom, an alkyl group, an alkoxy group, a halogen atom, a halogenated alkyl group, a hydroxyl group, —COOR", —OC(═O)R", a hydroxyalkyl group, or a cyano group; R" represents a hydrogen atom or an alkyl group; n' represents an integer of from 0 to 2; and * represents a bond.

A second embodiment of the present invention is concerned with a resist composition which is used for a resist pattern formation method including a step of forming a resist film on a support by using a resist composition which generates an acid upon exposure and in which a solubility thereof in a developing solution changes by the action of the acid; a step of exposing the resist film; a step of developing the resist film; and a step of after developing the resist film, performing a rinse treatment, wherein the resist composition contains a base material component (A) whose solubility in the developing solution changes by the action of an acid, the base material component (A) containing a high-molecular compound (A1) having a constituent unit (a0) represented by the following general formula (a0-1), a constituent unit (a1) containing an acid decomposable group whose polarity increases by the action of an acid, and a constituent unit (a2) containing a group represented by the following general formula (a2-r-1).

[Chemical Formula 2]

(a0-1)

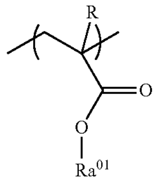

(a2-r-1)

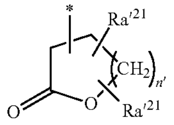

In the formula (a0-1), R represents a hydrogen atom, an alkyl group having from 1 to 5 carbon atoms, or a halogenated alkyl group having from 1 to 5 carbon atoms; and $Ra^{01}$ represents a lactone-containing polycyclic group, an —$SO_2$-containing polycyclic group, or a cyano group-containing polycyclic group. In the formula (a2-r-1), each of $Ra'^{21}$s independently represents a hydrogen atom, an alkyl group, an alkoxy group, a halogen atom, a halogenated alkyl group, a hydroxyl group, —COOR", —OC(═O)R", a hydroxyalkyl group, or a cyano group; R" represents a hydrogen atom or an alkyl group; n' represents an integer of from 0 to 2; and * represents a bond.

According to the resist pattern formation method of the present invention, a resist pattern having a satisfactory shape can be obtained.

By using the resist composition of the present invention, a resist pattern having a satisfactory shape can be obtained in forming a resist pattern by performing a rinse treatment after a development treatment.

BRIEF DESCRIPTION OF THE DRAWING

FIG. 1 is an SEM image of a line pattern observed from the upper side, showing evaluation criteria in evaluating a resist pattern shape.

DETAILED DESCRIPTION OF THE INVENTION

In the present specification and claims, the term "aliphatic" is a relative concept to the term "aromatic" and is defined to mean a group, a compound, or the like not having aromaticity.

The "alkyl group" includes linear, branched, and cyclic monovalent saturated hydrocarbon groups unless otherwise indicated. The "alkyl group" in the alkoxy group is also the same.

The "alkylene group" includes linear, branched, and cyclic divalent saturated hydrocarbon groups unless otherwise indicated.

The "halogenated alkyl group" refers to a group in which a part or all of the hydrogen atoms of the alkyl group are substituted with a halogen atom. Examples of the halogen atom include a fluorine atom, a chlorine atom, a bromine atom, and an iodine atom.

The "fluorinated alkyl group" or "fluorinated alkylene group" refers to a group in which a part or all of the hydrogen atoms of the alkyl group or alkylene group are substituted with a fluorine atom.

The term "constituent unit" means a monomer unit constituting the high-molecular compound (e.g., resins, polymers, or copolymers).

The terms "optionally substituted" include both the case where the hydrogen atom (—H) is substituted with a monovalent group and the case where the methylene group (—$CH_2$—) is substituted with a divalent group.

The "exposure" is concerned with a concept including the whole of irradiation with radial rays.

The "constituent unit derived from an acrylic acid ester" means a constituent unit which is constituted upon cleavage of an ethylenic double bond of an acrylic acid ester.

The "acrylic acid ester" is a compound in which the hydrogen atom at an end of the carboxyl group of acrylic acid ($CH_2$═CH—COOH) is substituted with an organic group.

In the acrylic acid ester, the hydrogen atom bonded to the carbon atom at the α-position may be substituted with a substituent. The substituent ($R^{\alpha 0}$) that substitutes the hydrogen atom bonded to the carbon atom at the α-position is an atom or group other than a hydrogen atom, and examples thereof include an alkyl group having from 1 to 5 carbon atoms and a halogenated alkyl group having from 1 to 5 carbon atoms. In addition, examples of the acrylic acid ester also include an itaconic acid diester in which the substituent ($R^{\alpha 0}$) is substituted with an ester bond-containing substituent and an α-hydroxyacrylic ester in which the substituent ($R^{\alpha 0}$) is substituted with a hydroxyalkyl group or a group in which the hydroxyl group of the hydroxyalkyl group is modified. It is to be noted that the carbon atom at the α-position of the acrylic acid ester means a carbon atom to which the carbonyl group of acrylic acid is bonded unless otherwise indicated.

The acrylic acid ester in which the hydrogen atom bonded to the carbon atom at the α-position is substituted with a substituent is hereinafter sometimes referred to as "α-substituted acrylic acid ester". In addition, the acrylic acid ester and the α-substituted acrylic acid ester are hereinafter sometimes referred to as "(α-substituted) acrylic acid ester" comprehensively.

The "constituent unit derived from acrylamide" means a constituent unit which is constituted upon cleavage of an ethylenic double bond of acrylamide.

In the acrylamide, the hydrogen atom bonded to the carbon atom at the α-position may be substituted with a substituent, or one or both of the hydrogen atoms of the amino group of the acrylamide may be substituted with a substituent. It is to be noted that the carbon atom at the α-position of the acrylamide means a carbon atom to which the carbonyl group of the acrylamide is bonded unless otherwise indicated.

Examples of the substituent that substitutes the hydrogen atom bonded to the carbon atom at the α-position of the acrylamide include the same substituents as those exemplified above for the substituent at the α-position (substituent ($R^{\alpha 0}$)) in the α-substituted acrylic acid ester.

The "constituent unit derived from hydroxystyrene or a hydroxystyrene derivative" means a constituent unit which is constituted upon cleavage of an ethylenic double bond of hydroxystyrene or a hydroxystyrene derivative.

The "hydroxystyrene derivative" is concerned with a concept including compounds in which the hydrogen atom at the α-position of the hydroxystyrene is substituted with another substituent such as an alkyl group and a halogenated alkyl group, and derivatives thereof. Examples of those derivatives include a compound in which the hydrogen atom of the hydroxyl group of hydroxystyrene in which the hydrogen atom at the α-position may be substituted with a substituent is substituted with an organic group; and a compound in which a substituent other than a hydroxyl group is bonded to the benzene ring of the hydroxystyrene in which the hydrogen atom at the α-position may be substituted with a substituent. It is to be noted that the α-position (carbon atom at the α-position) refers to a carbon atom bonded to the benzene ring unless otherwise indicated.

Examples of the substituent that substitutes the hydrogen atom at the α-position of the hydroxystyrene include the same substituents as those exemplified above for the substituent at the α-position in the α-substituted acrylic acid ester.

The "constituent unit derived from vinylbenzoic acid or a vinylbenzoic acid derivative" means a constituent unit which is constituted upon cleavage of an ethylenic double bond of vinylbenzoic acid or a vinylbenzoic acid derivative.

The "vinylbenzoic acid derivative" is concerned with a concept including compounds in which the hydrogen atom at the α-position of the vinylbenzoic acid is substituted with another substituent such as an alkyl group and a halogenated alkyl group, and derivatives thereof. Examples of those derivatives include a compound in which the hydrogen atom of the carboxyl group of vinylbenzoic acid in which the hydrogen atom at the α-position may be substituted with a substituent is substituted with an organic group; and a compound in which a substituent other than a hydroxyl group and a carboxyl group is bonded to the benzene ring of the vinylbenzoic acid in which the hydrogen atom at the α-position may be substituted with a substituent. It is to be noted that the α-position (carbon atom at the α-position) refers to a carbon atom bonded to the benzene ring unless otherwise indicated.

The "styrene" is concerned with a concept including styrene and compounds in which the hydrogen atom at the α-position of the styrene is substituted with another substituent such as an alkyl group and a halogenated alkyl group.

The "constituent unit derived from styrene" and the "constituent unit derived from a styrene derivative" mean a constituent unit which is constituted upon cleavage of an ethylenic double bond of styrene or a styrene derivative.

The alkyl group as the substituent at the α-position is preferably a linear or branched alkyl group. Specifically, examples thereof include an alkyl group having from 1 to 5 carbon atoms (for example, a methyl group, an ethyl group, a propyl group, an isopropyl group, an n-butyl group, an isobutyl group, a tert-butyl group, a pentyl group, an isopentyl group, or a neopentyl group).

In addition, specifically, examples of the halogenated alkyl group as the substituent at the α-position include a group in which a part or all of the hydrogen atoms of the above-described "alkyl group as the substituent at the α-position" are substituted with a halogen atom. Examples of the halogen atom include a fluorine atom, a chlorine atom, a bromine atom, and an iodine atom, with a fluorine atom being especially preferable.

In addition, specifically, examples of the hydroxyalkyl group as the substituent at the α-position include a group in which a part or all of the hydrogen atoms of the above-described "alkyl group as the substituent at the α-position" are substituted with a hydroxyl group. The hydroxyl group number in the hydroxyalkyl group is preferably from 1 to 5, and most preferably 1.

<<Resist Pattern Formation Method>>

A resist pattern formation method of the present invention includes a step of forming a resist film on a support by using a resist composition which generates an acid upon exposure and in which a solubility thereof in a developing solution changes by the action of the acid; a step of exposing the resist film; a step of developing the resist film; and a step of after developing the resist film, performing a rinse treatment.

In such a resist pattern formation method, the resist composition contains a base material component (A) whose solubility in the developing solution changes by the action of an acid, the base material component (A) containing a high-molecular compound (A1) having a constituent unit (a0), a constituent unit (a1), and a constituent unit (a2) as described later.

As the resist composition, a resist composition of the present invention as described later can be used.

The resist pattern formation method of the present invention can be, for example, performed in the following manner.

First of all, a resist composition of the present invention as described later is coated on a support by using a spinner or the like, and a bake (post-apply bake (PAB)) treatment is, for example, performed under a temperature condition at from 80 to 150° C. for from 40 to 120 seconds, and preferably from 60 to 90 seconds, thereby forming a resist film.

Subsequently, the resist film is subjected to selective exposure by means of drawing upon direct irradiation with an electron beam via a mask formed with a prescribed pattern (mask pattern) or not via a mask pattern using an exposure apparatus, for example, an ArF exposure apparatus, an electron beam drawing apparatus, an EUV exposure apparatus, etc., and thereafter, a bake (post-exposure bake (PEB)) treatment is, for example, performed under a temperature condition at from 80 to 150° C. for from 40 to 120 seconds, and preferably from 60 to 90 seconds.

Subsequently, the resist film is subjected to a development treatment. In the case of an alkali development process, the development treatment is performed using an alkali developing solution, and in the case of a solvent development process, the development treatment is performed using a developing solution containing an organic solvent (organic developing solution).

After the development treatment, a rinse treatment is performed. In the case of an alkali development process, the rinse treatment is preferably performed with a rinse solution using pure water, and in the case of a solvent development process, the rinse treatment is preferably performed with a rinse solution containing an organic solvent. Above all, in the resist pattern formation method of the present invention, in the case of performing the rinse treatment with a rinse solution containing a surfactant, an effect for suppressing the shape change of a resist pattern before and after the rinse treatment is obtained more easily.

In the case of a solvent development process, a treatment for removing the developing solution or rinse solution attached onto the pattern after the development treatment or rinse treatment may be performed with a supercritical fluid.

After the development treatment or rinse treatment, drying is performed. In addition, a bake treatment (post bake) may be performed after the development treatment or rinse treatment as the case may be.

The support is not particularly limited, and those which are conventionally known can be used. Examples thereof include substrates for electronic components and those substrates formed with a prescribed wiring pattern. More specifically, examples thereof include a silicon wafer, a substrate made of a metal such as copper, chromium, iron, and aluminum, and a glass substrate. As a material of the wiring pattern, for example, copper, aluminum, nickel, gold, and the like can be used.

In addition, the support may also be a material in which an inorganic and/or organic film is provided on the above-described substrate. Examples of the inorganic film include an inorganic antireflection film (inorganic BARC). Examples of the organic film include an organic film such as an organic antireflection film (organic BARC) and a lower organic film in the multilayer resist method.

The multilayer resist method as referred to herein is a method in which at least one organic film (lower organic film) and at least one resist film (upper resist film) are provided on a substrate, and patterning of the lower organic film is performed while using, as a mask, a resist pattern formed on the upper resist film, and it is considered that a pattern with a high aspect ratio can be formed. That is, according to the multilayer resist method, since a required thickness can be ensured by the lower organic film, the resist film can be made thin, and it becomes possible to form a fine pattern with a high aspect ratio.

The multiplayer resist method is basically classified into a method of taking a two-layer structure of an upper resist film and a lower organic film (two-layer resist method); and a method of taking a multilayer structure of three or more layers in which one or more interlayers (e.g., a metal thin film, etc.) are provided between an upper resist film and a lower organic film (three-layer resist method).

The wavelength which is used for the exposure is not particularly limited. The exposure can be performed with a radial ray such as an ArF excimer laser, a KrF excimer laser, an $F_2$ excimer laser, EUV (extreme ultraviolet ray), VUV (vacuum ultraviolet ray), EB (electron beam), an X ray, and a soft X ray. The resist composition of the present invention as described later is highly useful for a KrF excimer laser, an ArF excimer laser, EB, or EUV, and especially useful for an ArF excimer laser, EB, or EUV.

The exposure method of the resist film may be usual exposure which is performed in an inert gas such as air and nitrogen (dry exposure), or may be liquid immersion lithography.

The liquid immersion lithography is an exposure method in which a solvent (liquid immersion medium) having a refractive index larger than a refractive index of air is previously filled between the resist film and a lens at the lowest position of an exposure apparatus, and exposure (immersion lithography) is performed in that state.

The liquid immersion medium is preferably a solvent having a refractive index larger than a refractive index of air and smaller than a refractive index of the resist film to be exposed. The refractive index of such a solvent is not particularly limited so long as it falls within the foregoing range.

Examples of the solvent having a refractive index larger than a refractive index of air and smaller than a refractive index of the resist film include water, a fluorine-based inert liquid, a silicon-based solvent, and a hydrocarbon-based solvent.

Specific examples of the fluorine-based inert liquid include a liquid composed mainly of a fluorine-based compound such as $C_3HCl_2F_5$, $C_4H_9OCH_3$, $C_4F_9OC_2H_5$, and $C_5H_3F_7$. A fluorine-based inert liquid having a boiling point of from 70 to 180° C. is preferable, and a fluorine-based inert liquid having a boiling point of from 80 to 160° C. is more preferable. The fluorine-based inert liquid having a boiling point falling within the foregoing range is preferable because after completion of the exposure, the removal of the medium used for the liquid immersion can be performed by a simple and easy method.

The fluorine-based inert liquid is especially preferably a perfluoroalkyl compound in which all of the hydrogen atoms of the alkyl group are substituted with a fluorine atom. Specifically, examples of the perfluoroalkyl compound include a perfluoroalkyl ether compound and a perfluoroalkylamine compound.

Furthermore, specifically, examples of the perfluoroalkyl ether compound include perfluoro(2-butyl-tetrahydrofuran) (boiling point: 102° C.); and examples of the perfluoroalkylamine compound include perfluorotributylamine (boiling point: 174° C.).

From the viewpoints of costs, safety, an environmental issue, a multiplicity of uses, and the like, water is preferably used as the liquid immersion medium.

Examples of the alkali developing solution which is used for the development treatment in the alkali development process include a 0.1 to 10% by mass tetramethylammonium hydroxide (TMAH) aqueous solution.

The organic solvent which an organic developing solution used for the development treatment in the solvent development process contains may be one capable of dissolving the component (A) (component (A) before the exposure) therein, and it can be properly selected from known organic solvents. Specifically, examples thereof include a polar solvent such as a ketone-based solvent, an ester-based solvent, an alcohol-based solvent, a nitrile-based solvent, an amide-based solvent, and an ether-based solvent; and a hydrocarbon-based solvent.

The ketone-based solvent is an organic solvent containing C—C(=O)—C in a structure thereof. The ester-based solvent is an organic solvent containing C—C(=O)—O—C in a structure thereof. The alcohol-based solvent is an organic solvent containing an alcoholic hydroxyl group in a structure thereof, and the "alcoholic hydroxyl group" means a hydroxyl group bonded to the carbon atom of an aliphatic hydrocarbon group. The nitrile-based solvent is an organic solvent containing a nitrile group in a structure thereof. The amide-based solvent is an organic solvent containing an amide group in a structure thereof. The ether-based solvent is an organic solvent containing C—O—C in a structure thereof.

Among the organic solvents, organic solvents containing plural kinds of functional groups characterizing each of the above-described solvents in the structure are present. In that case, such organic solvents are corresponding to all of solvent kinds containing a functional group which the organic solvent has. For example, diethylene glycol monomethyl ether is corresponding to all of the alcohol-based solvent and the ether-based solvent in the above-described classification.

The hydrocarbon-based solvent is a hydrocarbon solvent composed of a hydrocarbon which may be halogenated and not having a substituent other than a halogen atom. Examples of the halogen atom include a fluorine atom, a chlorine atom, a bromine atom, and an iodine atom, with a fluorine atom being preferable.

Of the foregoing, the organic solvent which the organic developing solution contains is preferably a polar solvent, and a ketone-based solvent, an ester-based solvent, a nitrile-based solvent, and the like are preferable. A known additive (e.g., a surfactant, etc.) can be blended in the organic developing solution as the need arises.

As for specific examples of each of the solvents, examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, γ-butyrolactone, and methyl amyl ketone (2-heptanone).

The ketone-based solvent is preferably methyl amyl ketone (2-heptanone).

Examples of the ester-based solvent include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate.

The ester-based solvent is preferably butyl acetate.

Examples of the nitrile-based solvent include acetonitrile, propionitrile, valeronitrile, and butyronitrile.

The development treatment can be carried out by a known development method. Examples thereof include a method of dipping a support in a developing solution for a fixed time (dip method); a method of lifting a developing solution on the surface of a support by means of a surface tension and keeping the support still for a fixed time (puddle method); a method of spraying a developing solution onto the surface of a support (spray method); and a method of continuously dispensing a developing solution onto a support rotating at a fixed rate while scanning a dispense nozzle of the developing solution at a fixed rate (dynamic dispense method).

The rinse treatment (washing treatment) with a rinse solution can be carried out by a known rinse method. Examples of the subject method include a method of continuously dispensing a rinse solution onto a support rotating at a fixed rate (rotary coating method); a method of dipping a support in a rinse solution for a fixed time (dip method); and a method of spraying a rinse solution onto the surface of a support (spray method).

(Rinse Solution)

As the organic solvent in the rinse solution containing an organic solvent which is used for the rinse treatment after the development treatment in the solvent development process, among the above-exemplified organic solvents which are used in the organic developing solution, for example, those that hardly dissolve the resist pattern therein can be properly selected and used. In general, at least one solvent selected from a hydrocarbon-based solvent, a ketone-based solvent, an ester-based solvent, an alcohol-based solvent, an amide-based solvent, and an ether-based solvent is used. Of these, at least one member selected from a hydrocarbon-based solvent, a ketone-based solvent, an ester-based solvent, an alcohol-based solvent, and an amide-based solvent is preferable, at least one member selected from an alcohol-based solvent and an ester-based solvent is more preferable, and an alcohol-based solvent is especially preferable.

The alcohol-based solvent which is used in the rinse solution is preferably a monohydric alcohol having from 6 to 8 carbon atoms, and the monohydric alcohol may be linear, branched, or cyclic. Specifically, examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Of these, 1-hexanol, 2-heptanol, or 2-hexanol is preferable, and 1-hexanol or 2-hexanol is more preferable.

These organic solvents may be used solely, or may be used in admixture of two or more kinds thereof. In addition, such an organic solvent may be mixed with an organic solvent other than the foregoing or water and used. However, taking into consideration the development properties, in the solvent development process, a blending amount of water in the rinse solution is preferably not more than 30% by mass, more preferably not more than 10% by mass, still more preferably not more than 5% by mass, and especially preferably not more than 3% by mass relative to the whole amount of the rinse solution.

A known additive can be blended in the rinse solution as the need arises. Suitably, examples of the additive include a surfactant.

Though the surfactant is not particularly limited, for example, an ionic surfactant, a nonionic surfactant, and the like can be used. Of these, from the standpoint of improving the roughness, it is preferable to use a nonionic surfactant.

Examples of the nonionic surfactant include a polyoxyalkylene alkyl ether and an alkylamide ether. Above all, it is preferable to use a polyoxyalkylene alkyl ether.

In this polyoxyalkylene alkyl ether, an oxyalkylene chain thereof is preferably an oxyethylene chain ($-(EO)_x—$) or an oxypropylene chain ($—(PO)_y—$). These oxyalkylene chains may form a linear structure, or may form a branched structure. In addition, in these chain structures, each oxyalkylene chain may be arranged in any form. The chain structure may be composed of a single kind of an oxyalkylene group, or plural oxyalkylene groups may coexist. In the case where plural oxyalkylene groups coexist, these may be arranged in a random form, or may be arranged in a block form. As such a polyoxyalkylene alkyl ether, for example, a compound represented by the following general formula can be used.

General formula of nonionic surfactant: $R''—O—(PO)_y-(EO)_x—H$

R″ represents a linear or branched alkyl group having from 8 to 50 carbon atoms. The carbon number in R″ is preferably from 8 to 30, and more preferably from 8 to 20.

PO represents an oxypropylene group; and EO represents an oxyethylene group.

x represents an average repeating number of the oxyethylene group and is the number of from 0 to 20, and preferably the number of from 5 to 15.

y represents an average repeating number of the oxypropylene group and is the number of from 0 to 20, and preferably the number of from 0 to 15. However, x and y are not 0 at the same time.

The surfactant may be used solely, or may be used in combination of two or more kinds thereof.

In the case of blending the surfactant in the rinse solution, its blending amount is generally from 0.001 to 5% by mass, preferably from 0.005 to 2% by mass, and more preferably from 0.01 to 0.5% by mass relative to the whole amount of the rinse solution.

Conventionally, for example, so far as the formation of a line pattern is concerned, in the case where after the development treatment, the rinse treatment is performed, there is involved such a problem that in a finally formed line pattern, a phenomenon in which the line is partially curved (pattern slippage) is easily caused. This problem of pattern slippage is more easily caused in the case of performing the rinse treatment with a rinse solution containing a surfactant. This problem of pattern slippage is a problem which is easily caused particularly in the case of performing the rinse treatment with a rinse solution having a surfactant dissolved in pure water, and more specifically, a nonionic surfactant aqueous solution as a rinse solution.

As for this problem, by applying the resist pattern formation method of the present invention, an effect for suppressing the shape change of a resist pattern before and after the rinse treatment is obtained. That is, according to the resist pattern formation method of the present invention, even in the case of performing the rinse treatment after the development treatment, the pattern slippage or the like is hardly generated, and a resist pattern having a satisfactory shape can be obtained.

<<Resist Composition>>

The resist composition of the present invention is a resist composition which is used for a resist pattern formation method including a step of forming a resist film on a support by using a resist composition which generates an acid upon exposure and in which a solubility thereof in a developing solution changes by the action of the acid; a step of exposing the resist film; a step of developing the resist film; and a step of after developing the resist film, performing a rinse treatment.

Such a resist pattern formation method is the same as the above-described resist pattern formation method of the present invention.

The resist composition of the present invention is a resist composition which generates an acid upon exposure and in which a solubility thereof in a developing solution changes by the action of the acid and contains a base material component (A) (hereinafter also referred to as "component (A)") whose solubility in the developing solution changes by the action of an acid.

When a resist film is formed using such a resist composition, and the resist film is subjected to selective exposure, an acid is generated in an exposed area, and a solubility of the component (A) in a developing solution changes by the action of the acid. On the other hand, since a solubility of the component (A) in a developing solution does not change in an unexposed area, a difference in the solubility in a developing solution between the exposed area and the unexposed area is generated. Accordingly, when the resist film is developed, in the case where the resist composition is a positive type, the exposed area is dissolved and removed, whereby a positive-type resist pattern is formed, whereas in the case where the resist composition is a negative type, the unexposed area is dissolved and removed, whereby a negative-type resist pattern is formed.

In the present specification, the resist composition in which the exposed area is dissolved and removed to form a positive-type resist pattern is referred to as a positive-type resist composition, and the resist composition in which the unexposed area is dissolved and removed to form a negative-type resist pattern is referred to as a negative-type resist composition.

The resist composition of the present invention may be either a positive-type resist composition or a negative-type resist composition.

In addition, the resist composition of the present invention may be either one for an alkali development process using an alkali developing solution for the development treatment at the time of resist pattern formation or one for a solvent development process using a developing solution containing an organic solvent (organic developing solution) for the development treatment.

The resist composition of the present invention has acid generating ability of generating an acid upon exposure, and the component (A) may generate an acid upon exposure, or an additive component blended separately from the component (A) may generate an acid upon exposure.

Specifically, in the resist composition of the present invention, (1) the resist composition may contain an acid generator component (B) (hereinafter referred to as "component (B)") that generates an acid upon exposure;

(2) the component (A) may be a component that generates an acid upon exposure; and (3) not only the component (A) may be a component that generates an acid upon exposure, but the resist composition may further contain the component (B).

That is, in the foregoing cases (2) and (3), the component (A) is the "base material component which generates an acid upon exposure and in which a solubility thereof in a developing solution changes by the action of the acid". As such a component (A), a resin which has a constituent unit that generates an acid upon exposure and in which a solubility thereof in a developing solution changes by the action of the acid can be used. As the constituent unit that generates an acid upon exposure, a known unit can be used.

Above all, the resist composition of the present invention is preferably the foregoing case (1).

<Component (A)>

In the present invention, the "base material component" is an organic compound having film forming ability, and an organic compound having a molecular weight of 500 or more is preferably used. When the molecular weight of the organic compound is 500 or more, the film forming ability is enhanced, and in addition thereto, a resist pattern of a nano level is easily formed.

The organic compound which is used as the base material component is roughly classified into a non-polymer and a polymer.

As the non-polymer, a compound having a molecular weight of 500 or more and less than 4,000 is generally used. In the following, the case of referring to a "low-molecular compound" refers to a non-polymer having a molecular weight of 500 or more and less than 4,000.

As the polymer, a compound having a molecular weight of 1,000 or more is generally used. In the following, the case of referring to a "resin" or "high-molecular compound" refers to a polymer having a molecular weight of 1,000 or more.

As the molecular weight of the polymer, a mass average molecular weight as reduced into polystyrene by means of GPC (gel permeation chromatography) is used.

The component (A) which is used in the resist composition of the present invention contains a high-molecular compound (A1) (hereinafter referred to as "component (A1)") having a constituent unit (a0) represented by the general formula (a0-1), a constituent unit (a1) containing an acid decomposable group whose polarity increases by the action of an acid, and a constituent unit (a2) containing a group represented by the general formula (a2-r-1).

As the component (A), at least the component (A1) is used, and other high-molecular compounds and/or low-molecular compounds may be used together with the component (A1).

[Component (A1)]

The component (A1) is a high-molecular compound having a constituent unit (a0) represented by the general formula (a0-1), a constituent unit (a1) containing an acid decomposable group whose polarity increases by the action of an acid, and a constituent unit (a2) containing a group represented by the general formula (a2-r-1).

(Constituent Unit (a0))

The constituent unit (a0) is a constituent unit represented by the following general formula (a0-1).

[Chemical Formula 3]

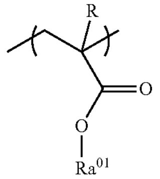

(a0-1)

In the formula (a0-1), R represents a hydrogen atom, an alkyl group having from 1 to 5 carbon atoms, or a halogenated alkyl group having from 1 to 5 carbon atoms; and $Ra^{01}$ represents a lactone-containing polycyclic group, an $—SO_2$-containing polycyclic group, or a cyano group-containing polycyclic group.

In the foregoing formula (a0-1), the alkyl group having from 1 to 5 carbon atoms as represented by R is preferably a linear or branched alkyl group having from 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having from 1 to 5 carbon atoms is a group in which a part or all of the hydrogen atoms of the above-descried alkyl group having from 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having from 1 to 5 carbon atoms, or a fluorinated alkyl group having from 1 to 5 carbon atoms. Of these, a hydrogen atom or a methyl group is the most preferable in view of easiness of industrial availability.

In the foregoing formula (a0-1), $Ra^{01}$ represents a lactone-containing polycyclic group, an —$SO_2$-containing polycyclic group, or a cyano group-containing polycyclic group.

The "lactone-containing polycyclic group" refers to a polycyclic group containing a ring (lactone ring) containing —O—C(=O)— in a ring skeleton thereof. When the lactone ring is counted as a first ring, a group having only the lactone ring is referred to as a monocyclic group, and a group further having other ring structures is referred to as a polycyclic group regardless of its structure.

The lactone-containing polycyclic group in the constituent unit (a0) is not particularly limited, and an arbitrary group can be used. Specifically, examples thereof include groups represented by the following general formulae (a0-r-1) to (a0-r-6). In the formulae, the * mark represents a bond (hereinafter the same).

[Chemical Formula 4]

(a0-r-1)

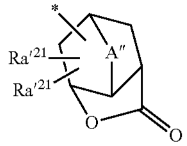

(a0-r-2)

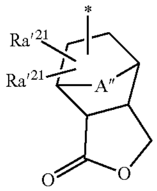

(a0-r-3)

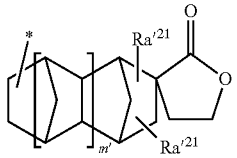

(a0-r-4)

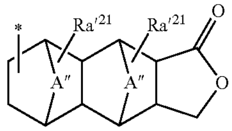

(a0-r-5)

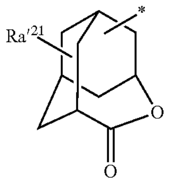

(a0-r-6)

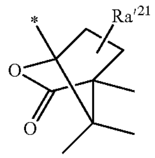

In the formulae, each of $Ra'^{21}$s independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; A" represents an alkylene group having from 1 to 5 carbon atoms, which may contain an oxygen atom (—O—) or a sulfur atom (—S—), an oxygen atom, or a sulfur atom; and m' is 0 or 1.

In the foregoing formulae (a0-r-1) to (a0-r-6), the alkyl group in $Ra'^{21}$ is preferably an alkyl group having from 1 to 6 carbon atoms. The alkyl group is preferably either linear or branched. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is especially preferable.

The alkoxy group in $Ra'^{21}$ is preferably an alkoxy group having from 1 to 6 carbon atoms. The alkoxy group is preferably either linear or branched. Specifically, examples thereof include a group in which the alkyl group exemplified above for the alkyl group in $Ra'^{21}$ is connected to an oxygen atom (—O—).

Examples of the halogen atom in $Ra'^{21}$ include a fluorine atom, a chlorine atom, a bromine atom, and an iodine atom, with a fluorine atom being preferable.

Examples of the halogenated alkyl group in $Ra'^{21}$ include a group in which a part or all of the hydrogen atoms of the above-described alkyl group are substituted with the above-described halogen atom. The halogenated alkyl group is preferably a fluorinated alkyl group, and especially preferably a perfluoroalkyl group.

In each of —COOR" and —OC(=O)R" in $Ra'^{21}$, R" is a hydrogen atom or an alkyl group.

The alkyl group in R" may be linear, branched, or cyclic, and the carbon number thereof is preferably from 1 to 15.

In the case where R" is a linear or branched alkyl group, the carbon number thereof is preferably from 1 to 10, and more preferably from 1 to 5. Above all, R" is especially preferably a methyl group or an ethyl group.

In the case where R" is a cyclic alkyl group, the carbon number thereof is preferably from 3 to 15, more preferably from 4 to 12, and most preferably from 5 to 10. Specifically, examples thereof include a group in which one or more hydrogen atoms are eliminated from a monocycloalkane or a polycycloalkane such as a bicycloalkane, a tricycloalkane, and a tetracycloalkane, which may or may not be substituted with a fluorine atom or a fluorinated alkyl group. More specifically, examples thereof include a group in which one or more hydrogen atoms are eliminated from a monocycloalkane such as cyclopentane and cyclohexane, or a polycycloalkane such as adamantane, norbornane, isobornane, tricyclodecane, and tetracyclododecane.

The hydroxyalkyl group in $Ra'^{21}$ is preferably one having from 1 to 6 carbon atoms. Specifically, examples thereof include a group in which at least one of the hydrogen atoms of the alkyl group exemplified above for the alkyl group as the substituent is substituted with a hydroxyl group.

In the foregoing formulae (a0-r-1), (a0-r-2), and (a0-r-4), the alkylene group having from 1 to 5 carbon atoms in A" is preferably a linear or branched alkylene group, and examples thereof include a methylene group, an ethylene group, an n-propylene group, and an isopropylene group. In the case where the alkylene group contains an oxygen atom or a sulfur atom, specific examples thereof include a group in which —O— or —S— intervenes at the end or between the carbon atoms of the above-described alkylene group. Examples thereof include —O—$CH_2$—, —$CH_2$—O—$CH_2$—, —S—$CH_2$—, and —$CH_2$—S—$CH_2$—. A" is preferably an alkylene group having from 1 to 5 carbon atoms or —O—, more preferably an alkylene group having from 1 to 5 carbon atoms, and most preferably a methylene group.
Specific examples of each of the groups represented by the general formulae (a0-r-1) to (a0-r-6) are given below.
[Chemical Formula 5]
(r-Ic-2-1)
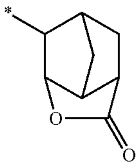
(r-Ic-2-2)
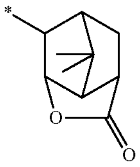
(r-Ic-2-3)
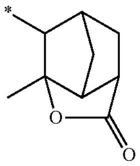
(r-Ic-2-4)
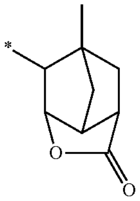
(r-Ic-2-5)
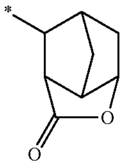
(r-Ic-2-6)
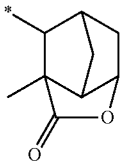
(r-Ic-2-7)
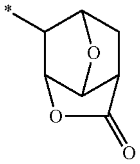
(r-Ic-2-8)
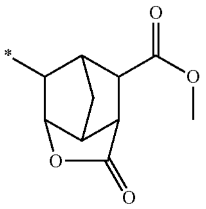
-continued
(r-Ic-2-9)
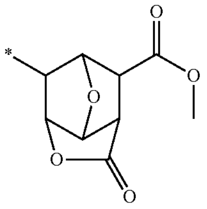
(r-Ic-2-10)
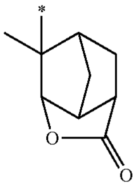
(r-Ic-2-11)
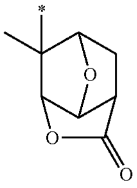
(r-Ic-2-12)
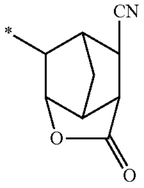
(r-Ic-2-13)
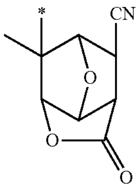
(r-Ic-3-1)
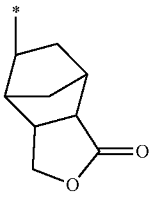
(r-Ic-3-2)
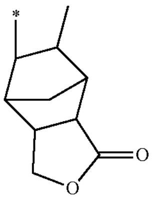
(r-Ic-3-3)
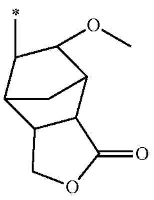

-continued
(r-Ic-3-4)
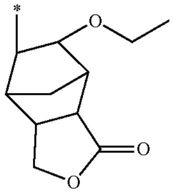
(r-Ic-3-5)
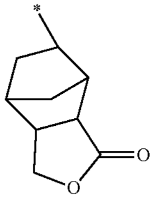
[Chemical Formula 6]
(r-Ic-4-1)
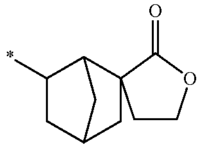
(r-Ic-4-2)
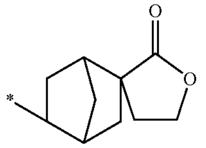
(r-Ic-4-3)
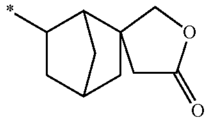
(r-Ic-4-4)
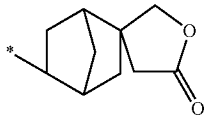
(r-Ic-4-5)
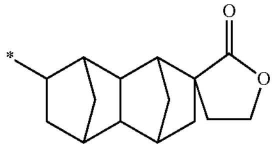
(r-Ic-4-6)
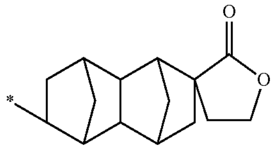
(r-Ic-4-7)
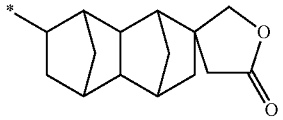
(r-Ic-4-8)
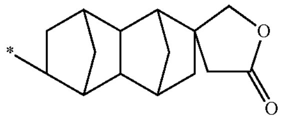
-continued
(r-Ic-4-9)
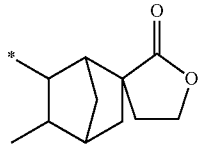
(r-Ic-5-1)
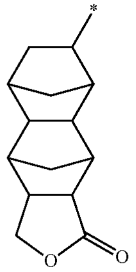
(r-Ic-5-2)
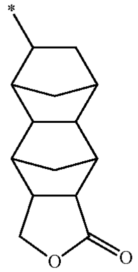
(r-Ic-5-3)
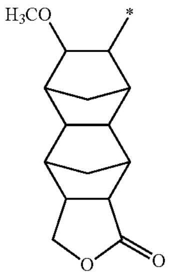
(r-Ic-5-4)
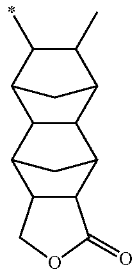
(r-Ic-6-1)
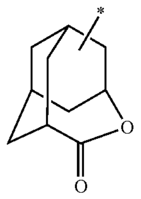

-continued (r-Ic-7-1)

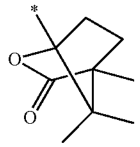

The "—$SO_2$-containing polycyclic group" refers to a polycyclic group containing a ring containing —$SO_2$— in a ring skeleton thereof, and specifically, it is a polycyclic group in which the sulfur atom (S) in —$SO_2$— forms a part of the ring skeleton. When the ring containing —$SO_2$— in a ring skeleton thereof is counted as a first ring, a group having only the subject ring is referred to as a monocyclic group, and a group further having other ring structures is referred to as a polycyclic group regardless of its structure.

The —$SO_2$-containing polycyclic group is especially preferably a polycyclic group containing —O—$SO_2$— in a ring skeleton thereof, namely a polycyclic group containing a sultone ring in which —O—S— in —O—$SO_2$— forms a part of the ring skeleton.

More specifically, examples of the —$SO_2$-containing polycyclic group include groups represented by the following general formulae (a0-r-7) to (a0-r-8), respectively.

[Chemical Formula 7]

(a0-r-7)

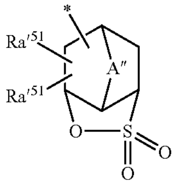

(a0-r-8)

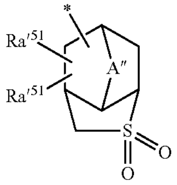

In the formulae, each of Ra'[51]s independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; and A" represents an alkylene group having from 1 to 5 carbon atoms, which may contain an oxygen atom or a sulfur atom, an oxygen atom, or a sulfur atom.

In the foregoing general formulae (a0-r-7) to (a0-r-8), A" is the same as A" in the foregoing formulae (a0-r-1), (a0-r-2), and (a0-r-4).

Examples of the alkyl group, the alkoxy group, the halogen atom, the halogenated alkyl group, —COOR", —OC(=O)R", and the hydroxyalkyl group in Ra'[51] include the same groups as those exemplified above for Ra'[21] in the foregoing formulae (a0-r-1) to (a0-r-6).

Specific examples of each of the groups represented by the general formulae (a0-r-7) to (a0-r-8) are given below. In the formulae, "Ac" represents an acetyl group.

[Chemical Formula 8]

(r-sl-1-1)

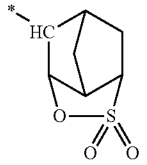

(r-sl-1-2)

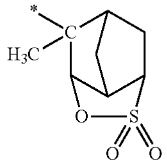

(r-sl-1-3)

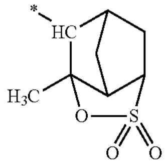

(r-sl-1-4)

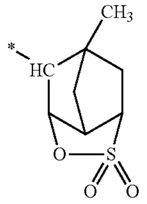

(r-sl-1-5)

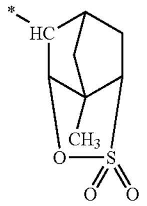

(r-sl-1-6)

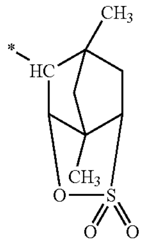

(r-sl-1-7)

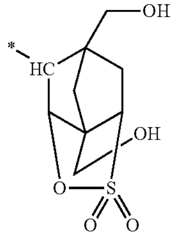

-continued
(r-sl-1-8)
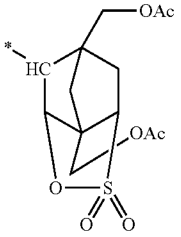
(r-sl-1-9)
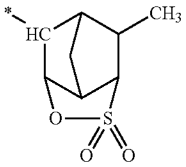
(r-sl-1-10)
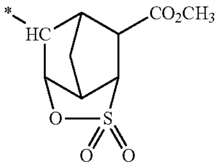
(r-sl-1-11)
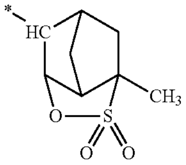
(r-sl-1-12)
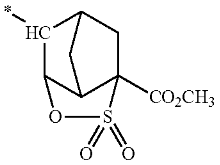
(r-sl-1-13)
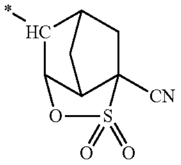
(r-sl-1-14)
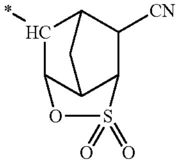
(r-sl-1-15)
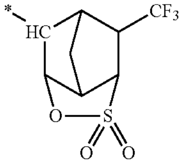
-continued
(r-sl-1-16)
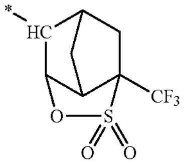
(r-sl-1-17)
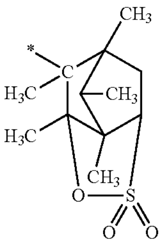
(r-sl-1-18)
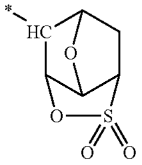
(r-sl-1-19)
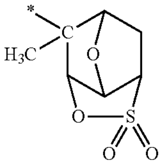
(r-sl-1-20)
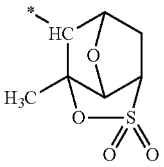
(r-sl-1-21)
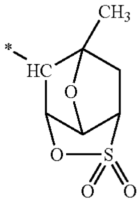
[Chemical Formula 9]
(r-sl-1-22)
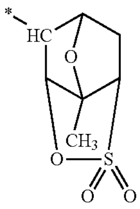

-continued (r-sl-1-23)

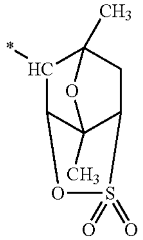

(r-sl-1-24)

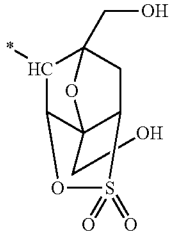

(r-sl-1-25)

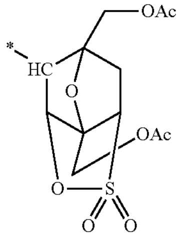

(r-sl-1-26)

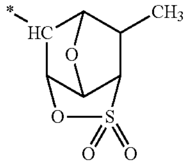

(r-sl-1-27)

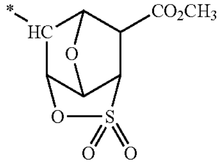

(r-sl-1-28)

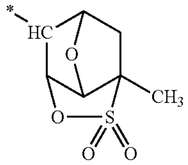

(r-sl-1-29)

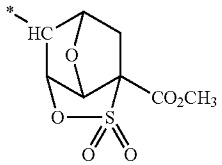

(r-sl-1-30)

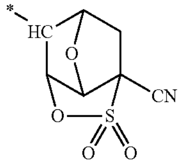

-continued (r-sl-1-31)

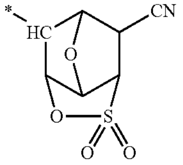

(r-sl-1-32)

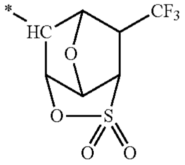

(r-sl-1-33)

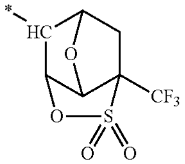

[Chemical Formula 10]

(r-sl-2-1)

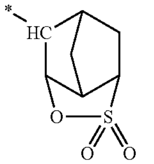

(r-sl-2-2)

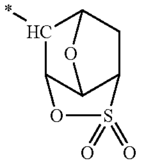

The "cyano group-containing polycyclic group" refers to a polycyclic group having at least one cyano group (—CN) connected thereto.

More specifically, examples of the cyano group-containing polycyclic group include groups represented by the following general formulae (a0-r-9) to (a0-r-11), respectively.

[Chemical Formula 11]

(a0-r-9)

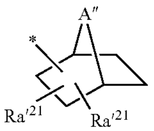

(a0-r-10)

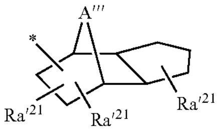

-continued (a0-r-11)

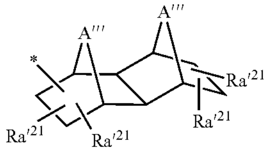

In the formulae, each of Ra'[21]s independently represents a hydrogen atom, an alkyl group, an alkoxy group, a halogen atom, a halogenated alkyl group, a hydroxyl group, —COOR", —OC(═O)R", a hydroxyalkyl group, or a cyano group, and at least one of plural Ra'[21]s is a cyano group; R" represents a hydrogen atom or an alkyl group; A" represents an alkylene group having from 1 to 5 carbon atoms, which may contain an oxygen atom (—O—) or a sulfur atom (—S—), an oxygen atom, or a sulfur atom; and A'" represents a single bond, an alkylene group having from 1 to 5 carbon atoms, which may contain an oxygen atom (—O—) or a sulfur atom (—S—), an oxygen atom, or a sulfur atom.

In the foregoing formula (a0-r-9), Ra'[21] and A" are the same as Ra'[21] and A" in the foregoing formula (a0-r-1), respectively. R" is the same as that described above for R".

In the foregoing formulae (a0-r-10) to (a0-r-11), Ra'[21] is the same as Ra'[21] in the foregoing formula (a0-r-1), and R" is the same as that described above for R". The "alkylene group having from 1 to 5 carbon atoms, which may contain an oxygen atom (—O—) or a sulfur atom (—S—)" in A'" is the same as the "alkylene group having from 1 to 5 carbon atoms, which may contain an oxygen atom (—O—) or a sulfur atom (—S—)" as described above for A" in the foregoing formula (a0-r-1).

Specific examples of the cyano group-containing polycyclic group are given below.

[Chemical Formula 12]

(r-cn-1-1)

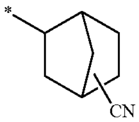

(r-cn-1-2)

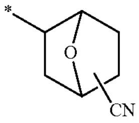

(r-cn-1-3)

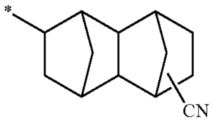

(r-cn-1-4)

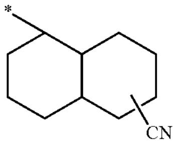

(r-cn-1-5)

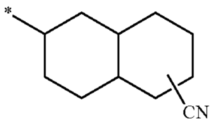

-continued (r-cn-1-6)

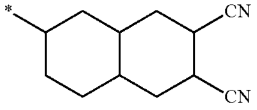

(r-cn-1-7)

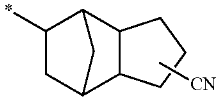

Above all, in view of the facts that on the occasion of forming a resist film, the resist film is more hardly affected by the rinse solution, and a satisfactory pattern shape is easily obtained, $Ra^{01}$ is preferably an $—SO_2$-containing polycyclic group or a cyano group-containing polycyclic group, and especially preferably an $—SO_2$-containing polycyclic group.

Specifically, the group represented by the foregoing general formula (a0-r-7) and the groups represented by the foregoing general formulae (a0-r-9) to (a0-r-11), respectively are preferable, the group represented by the foregoing general formula (a0-r-7) and the group represented by the foregoing general formula (a0-r-9) are more preferable, and the group represented by the foregoing general formula (a0-r-7) is especially preferable.

The constituent unit (a0) which the component (A1) has may exist solely or in combination of two or more kinds thereof.

A proportion of the constituent unit (a0) in the component (A1) is preferably not more than 40% by mole, more preferably not more than 35% by mole, still more preferably from 5 to 30% by mole, and especially preferably from 10 to 25% by mole relative to a total sum of all of the constituent units constituting the component (A1).

When the proportion of the constituent unit (a0) is the lower limit value or more, the sensitivity is increased. In addition thereto, lithography properties such as roughness are more enhanced. When the proportion of the constituent unit (a0) is not more than the upper limit value, balance with other constituent units can be taken, and a satisfactory resist pattern shape is easily obtained.

(Constituent Unit (a1))

The constituent unit (a1) is a constituent unit containing an acid decomposable group whose polarity increases by the action of an acid.

The "acid decomposable group" is a group having acid decomposability such that at least a part of bonds in the structure of the acid decomposable group can be cleaved by the action of an acid.

Examples of the acid decomposable group whose polarity increases by the action of an acid include a group which is decomposed by the action of an acid to produce a polar group.

Examples of the polar group include a carboxyl group, a hydroxyl group, an amino group, and a sulfo group ($—SO_3H$). Of these, a polar group containing —OH in a structure thereof (hereinafter also referred to as "OH-containing polar group") is preferable, a carboxyl group or a hydroxyl group is more preferable, and a carboxyl group is especially preferable.

More specifically, examples of the acid decomposable group include a group in which the polar group is protected by an acid dissociable group (for example, a group in which the hydrogen atom of the OH-containing polar group is protected by an acid dissociable group).

Here, the "acid dissociable group" refers to both of (i) a group having acid dissociability such that a bond between the acid dissociable group and an atom adjacent to the acid dissociable group can be cleaved; and (ii) a group in which after a part of bonds is cleaved by the action of an acid, a decarboxylation reaction is further generated, whereby a bond between the acid dissociable group and an atom adjacent to the acid dissociable group can be cleaved.

The acid dissociable group constituting the acid decomposable group is required to be a group with lower polarity than a polar group produced by dissociation of the acid dissociable group. According to this, on the occasion when the acid dissociable group is dissociated by the action of an acid, a polar group with higher polarity than the acid dissociable group is produced, whereby the polarity increases. As a result, the polarity of the whole of the component (A1) increases. When the polarity increases, solubility in a developing solution changes relatively, and in the case where the developing solution is an alkali developing solution, the solubility increases, whereas in the case where the developing solution is an organic developing solution, the solubility decreases.

The acid dissociable group is not particularly limited, and those which have been proposed so far as an acid dissociable group of a base resin for a chemically amplified resist can be used.

Examples of the acid dissociable group that protects a carboxyl group or a hydroxyl group among the polar groups include an acid dissociable group represented by the following general formula (a1-r-1) (hereinafter also referred to as "acetal type acid dissociable group").

[Chemical Formula 13]

(a1-r-1)

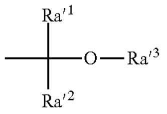

In the formula, each of $Ra'^1$ and $Ra'^2$ represents a hydrogen atom or an alkyl group; and $Ra'^3$ represents a hydrocarbon group, and $Ra'^3$ may be bonded to either one of $Ra'^1$ and $Ra'^2$ to form a ring.

In the formula (a1-r-1), it is preferable that at least one of $Ra'^1$ and $Ra'^2$ is a hydrogen atom, and it is more preferable that both of $Ra'^1$ and $Ra'^2$ are hydrogen atoms.

In the case where $Ra'^1$ or $Ra'^2$ is an alkyl group, examples of the alkyl group include the same alkyl groups as those exemplified as the substituent which may be bonded to the carbon atom at the α-position with respect to the above-described α-substituted acrylic acid ester, and an alkyl group having from 1 to 5 carbon atoms is preferable. Specifically, there is preferably exemplified a linear or branched alkyl group. More specifically, examples thereof include a methyl group, an ethyl group, a propyl group, an isopropyl group, an n-butyl group, an isobutyl group, a tert-butyl group, a pentyl group, an isopentyl group, and a neopentyl group. Of these, a methyl group or an ethyl group is more preferable, and a methyl group is especially preferable.

In the formula (a1-r-1), examples of the hydrocarbon group represented by $Ra'^3$ include a linear or branched alkyl group and a cyclic hydrocarbon group.

The carbon number of the linear alkyl group is preferably from 1 to 5, more preferably from 1 to 4, and still more preferably 1 or 2. Specifically, examples thereof include a methyl group, an ethyl group, an n-propyl group, an n-butyl group, and an n-pentyl group. Of these, a methyl group, an ethyl group, or an n-butyl group is preferable, and a methyl group or an ethyl group is more preferable.

The carbon number of the branched alkyl group is preferably from 3 to 10, and more preferably from 3 to 5. Specifically, examples thereof include an isopropyl group, an isobutyl group, a tert-butyl group, an isopentyl group, a neopentyl group, a 1,1-diethylpropyl group, and a 2,2-dimethylbutyl group, with an isopropyl group being preferable.

In the case where $Ra'^3$ is a cyclic hydrocarbon group, the hydrocarbon group may be aliphatic or aromatic, and it may be a polycyclic group or a monocyclic group.

The monocyclic alicyclic hydrocarbon group is preferably a group in which one hydrogen atom is eliminated from a monocycloalkane. The monocycloalkane is preferably one having from 3 to 6 carbon atoms, and specifically, examples thereof include cyclopentane and cyclohexane.

The polycyclic alicyclic hydrocarbon group is preferably a group in which one hydrogen atom is eliminated from a polycycloalkane. The polycycloalkane is preferably one having from 7 to 12 carbon atoms, and specifically, examples thereof include adamantane, norbornane, isobornane, tricyclodecane, and tetracyclododecane.

In the case where the cyclic hydrocarbon group represented by $Ra'^3$ is an aromatic hydrocarbon group, specifically, examples of the aromatic ring to be contained include an aromatic hydrocarbon ring such as benzene, biphenyl, fluorene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group in which one hydrogen atom is eliminated from the above-described aromatic hydrocarbon ring (aryl group); and a group in which one hydrogen atom of the above-described aryl group is substituted with an alkylene group (an arylalkyl group, for example, a benzyl group, a phenethyl group, a 1-naphthylmethyl group, a 2-naphthylmethyl group, a 1-naphthylethyl group, a 2-naphthylethyl group, etc.). The carbon number of the alkylene group (the alkyl chain in the arylalkyl group) is preferably from 1 to 4, more preferably from 1 to 2, and especially preferably 1.

In the case where $Ra'^3$ is bonded to either one of $Ra'^1$ and $Ra'^2$ to form a ring, the cyclic group is preferably a 4-membered to 7-membered ring, and more preferably a 4-membered to 6-membered ring. Specific examples of the cyclic group include a tetrahydropyranyl group and a tetrahydrofuranyl group.

Examples of the acid dissociable group that protects a carboxyl group among the polar groups include an acid dissociable group represented by the following general formula (a1-r-2). It is to be noted that among the acid dissociable groups represented by the following formula (a1-r-2), a group constituted of an alkyl group is hereinafter sometimes referred to as a "tertiary alkyl ester type acid dissociable group" for the sake of convenience.

[Chemical Formula 14]

(a1-r-2)

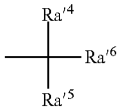

In the formula, each of Ra'4 to Ra'6 represents a hydrocarbon group, and Ra'5 and Ra'6 may be bonded to each other to form a ring.

Examples of the hydrocarbon group represented by Ra'4 to Ra'6 include the same hydrocarbon groups as those exemplified above for Ra'3.

Ra'4 is preferably an alkyl group having from 1 to 5 carbon atoms. In the case where Ra'5 and Ra'6 are bonded to each other to form a ring, a group represented by the following general formula (a1-r2-1) is exemplified. On the other hand, in the case where Ra'4 to Ra'6 are not bonded to each other and are each an independent hydrocarbon group, a group represented by the following general formula (a1-r2-2) is exemplified.

[Chemical Formula 15]

(a1-r2-1)

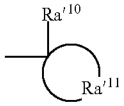

(a1-r2-2)

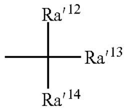

In the formulae, Ra'10 represents an alkyl group having from 1 to 10 carbon atoms; Ra'11 represents a group that forms an aliphatic cyclic group together with the carbon atom to which Ra'10 is bonded; and each of Ra'12 to Ra'14 independently represents a hydrocarbon group.

In the formula (a1-r2-1), as the alkyl group having from 1 to 10 carbon atoms as represented by Ra'10, the groups exemplified for the linear or branched alkyl group represented by Ra'3 in the formula (a1-r-1) are preferable. In the formula (a1-r2-1), as the aliphatic cyclic group which Ra'11 forms together with the carbon atom to which Ra'3 is bonded, the groups exemplified for the cyclic alkyl group represented by Ra'3 in the formula (a1-r-1) are preferable.

In the formula (a1-r2-2), it is preferable that each of Ra'12 and Ra'14 is independently an alkyl group having from 1 to 10 carbon atoms. As the alkyl group, the groups exemplified for the linear or branched alkyl group represented by Ra'3 in the formula (a1-r-1) are preferable. The alkyl group is more preferably a linear alkyl group having from 1 to 5 carbon atoms, and especially preferably a methyl group or an ethyl group.

In the formula (a1-r2-2), as Ra'13, the linear, branched, or cyclic alkyl groups exemplified for the hydrocarbon group represented by Ra'3 in the formula (a1-r-1) are preferable. Of these, the groups exemplified for the cyclic alkyl group represented by Ra'3 are more preferable.

Specific examples of the group represented by the foregoing formula (a1-r1-1) are given below.

[Chemical Formula 16]

(r-pr-m1)

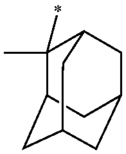

(r-pr-m2)

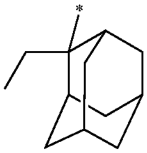

(r-pr-m3)

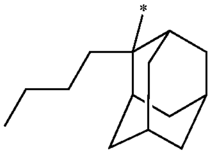

(r-pr-m4)

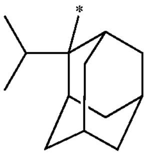

(r-pr-m5)

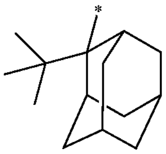

(r-pr-m6)

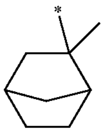

(r-pr-m7)

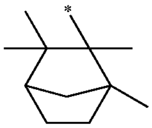

(r-pr-m8)

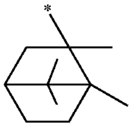

(r-pr-m9)

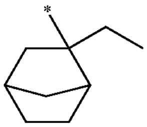

(r-pr-m10)

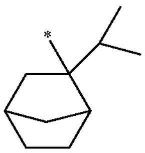

-continued
(r-pr-m11)
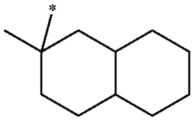
(r-pr-m12)
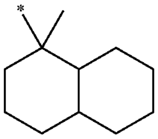
(r-pr-m13)
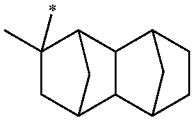
(r-pr-m14)
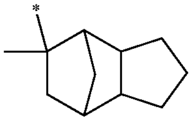
(r-pr-m15)
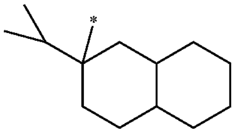
(r-pr-m16)
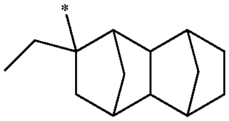
(r-pr-m17)
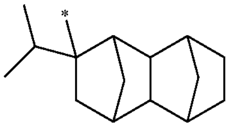
[Chemical Formula 17]
(r-pr-s1)
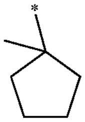
(r-pr-s2)
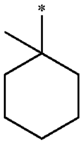
(r-pr-s3)
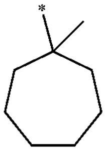
-continued
(r-pr-s4)
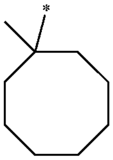
(r-pr-s5)
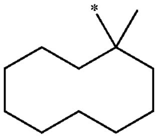
(r-pr-s6)
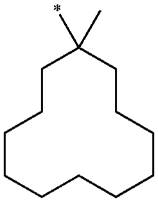
(r-pr-s7)
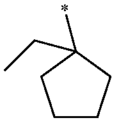
(r-pr-s8)
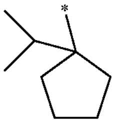
(r-pr-s9)
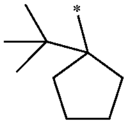
(r-pr-s10)
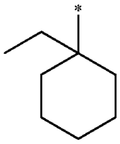
(r-pr-s11)
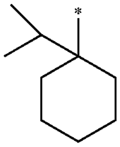
(r-pr-s12)
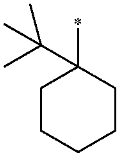
(r-pr-s13)
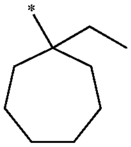

-continued
(r-pr-s14)
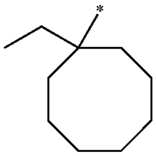
(r-pr-s15)
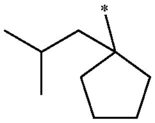
(r-pr-s16)
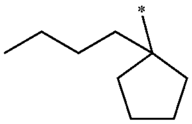
(r-pr-s17)
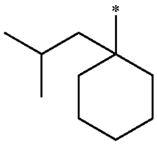
(r-pr-s18)
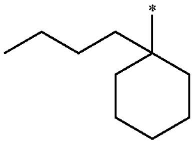
Specific examples of the group represented by the foregoing formula (a1-r2-2) are given below.
[Chemical Formula 18]
(r-pr-cm1)
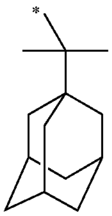
(r-pr-cm2)
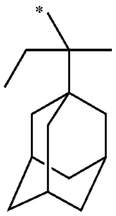
(r-pr-cm3)
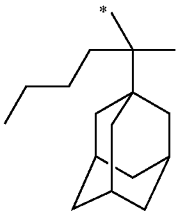
-continued
(r-pr-cm4)
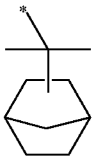
(r-pr-cm5)
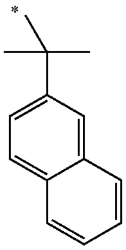
(r-pr-cm6)
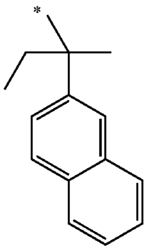
(r-pr-cm7)
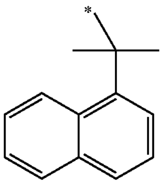
(r-pr-cm8)
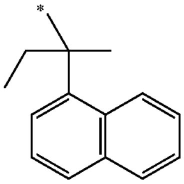
(r-pr-cs1)
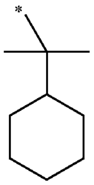
(r-pr-cs2)
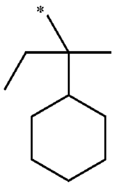

-continued (r-pr-cs3)

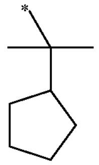

(r-pr-cs4)

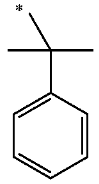

(r-pr-cs5)

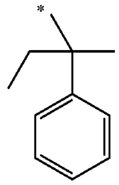

(r-pr-c1)

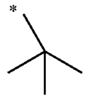

(r-pr-c2)

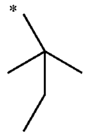

(r-pr-c3)

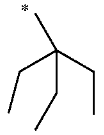

Examples of the acid dissociable group that protects a hydroxyl group among the polar groups include an acid dissociable group represented by the following general formula (a1-r-3) (hereinafter sometimes referred to as a "tertiary alkyloxycarbonyl acid dissociable group" for the sake of convenience).

[Chemical Formula 19]

(a1-r-3)

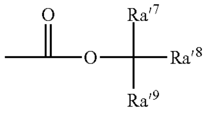

In the formula, each of Ra'7 to Ra'9 represents an alkyl group.

In the formula (a1-r-3), each of Ra'7 to Ra'9 is an alkyl group having preferably from 1 to 5 carbon atoms, and more preferably from 1 to 3 carbon atoms.

In addition, the carbon number of a total sum of the respective alkyl groups is preferably from 3 to 7, more preferably 3 to 5, and most preferably from 3 to 4.

Examples of the constituent unit (a1) include a constituent unit derived from an acrylic acid ester in which the hydrogen atom bonded to the carbon atom at the α-position may be substituted with a substituent, the constituent unit containing an acid decomposable group whose polarity increases by the action of an acid; a constituent unit derived from acrylamide, the constituent unit containing an acid decomposable group whose polarity increases by the action of an acid; a constituent unit in which at least a part of the hydrogen atom of the hydroxyl group of a constituent unit derived from hydroxystyrene or a hydroxystyrene derivative is protected by a substituent containing the above-described acid decomposable group; and a constituent unit in which at least a part of the hydrogen atom in —C(═O)—OH of the constituent unit derived from vinylbenzoic acid or a vinylbenzoic acid derivative.

Of the foregoing, the constituent unit (a1) is preferably a constituent unit derived from an acrylic acid ester in which the hydrogen atom bonded to the carbon atom at the α-position may be substituted with a substituent.

Preferred specific examples of such a constituent unit (a1) include a constituent unit represented by the following general formula (a1-1) or (a1-2).

[Chemical Formula 20]

(a1-1)

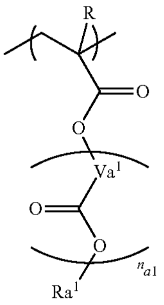

(a1-2)

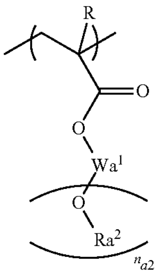

In the formulae, R represents a hydrogen atom, an alkyl group having from 1 to 5 carbon atoms, or a halogenated alkyl group having from 1 to 5 carbon atoms; $Va^1$ represents a divalent hydrocarbon group which may have an ether bond; $n_{a1}$ is from 0 to 2: $Ra^1$ represents an acid dissociable group represented by the foregoing formula (a1-r-1) or (a1-r-2); $Wa^1$ represents an $(n_{a2}+1)$-valent hydrocarbon group; $n_{a2}$ is from 1 to 3; and $Ra^2$ represents an acid dissociable group represented by the foregoing formula (a1-r-1) or (a1-r-3).

In the foregoing formula (a1-1), the alkyl group having from 1 to 5 carbon atoms as represented by R is preferably a linear or branched alkyl group having from 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having from 1 to 5 carbon atoms is a group in which a part or all of the hydrogen atoms of the above-descried alkyl group having from 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having from 1 to 5 carbon atoms, or a fluorinated alkyl group having from 1 to 5 carbon atoms. Of these, a hydrogen atom or a methyl group is the most preferable in view of easiness of industrial availability.

The hydrocarbon group represented by $Va^1$ may be an aliphatic hydrocarbon group, or may be an aromatic hydrocarbon group. The aliphatic hydrocarbon group means a hydrocarbon group not having aromaticity. The aliphatic hydrocarbon group as the divalent hydrocarbon group in $Va^1$ may be saturated, or may be unsaturated, and in general, it is preferably saturated.

More specifically, examples of the aliphatic hydrocarbon group include a linear or branched aliphatic hydrocarbon group and an aliphatic hydrocarbon group containing a ring in a structure thereof.

In addition, $Va^1$ may have an ether bond (—O—) between the carbon atoms of the above-described divalent hydrocarbon group. The ether bond number existing in $Va^1$ may be 1 or 2 or more.

The carbon number of the above-described linear or branched aliphatic hydrocarbon group is preferably from 1 to 10, more preferably from 1 to 6, still more preferably from 1 to 4, and most preferably from 1 to 3.

The linear aliphatic hydrocarbon group is preferably a linear alkylene group. Specifically, examples thereof include a methylene group [$—CH_2—$], an ethylene group [$—(CH_2)_2—$], a trimethylene group [$—(CH_2)_3—$], a tetramethylene group [$—(CH_2)_4—$], and a pentamethylene group [$—(CH_2)_5—$].

The branched aliphatic hydrocarbon group is preferably a branched alkylene group. Specifically, examples thereof include an alkylalkylene group such as an alkylmethylene group, e.g., $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, $—C(CH_2CH_3)_2—$, etc.; an alkylethylene group, e.g., $—CH(CH_3)CH_2—$, $—CH(CH_3)CH(CH_3)—$, $—C(CH_3)_2CH_2—$, $—CH(CH_2CH_3)CH_2—$, $—C(CH_2CH_3)_2—CH_2—$, etc.; an alkyltrimethylene group, e.g., $—CH(CH_3)CH_2CH_2—$, $—CH_2CH(CH_3)CH_2—$, etc.; and an alkyltetramethylene group, e.g., $—CH(CH_3)CH_2CH_2CH_2—$, $—CH_2CH(CH_3)CH_2CH_2—$, etc. The alkyl group in the alkylalkylene group is preferably a linear alkyl group having from 1 to 5 carbon atoms.

Examples of the above-described aliphatic hydrocarbon group containing a ring in a structure thereof include an alicyclic hydrocarbon group (a group in which two hydrogen atoms are eliminated from an aliphatic hydrocarbon ring); a group in which an alicyclic hydrocarbon group is bonded to an end of a linear or branched aliphatic hydrocarbon group; and a group in which an alicyclic hydrocarbon group intervenes on the way of a linear or branched aliphatic hydrocarbon group. Examples of the linear or branched aliphatic hydrocarbon group include the same linear or branched aliphatic hydrocarbon groups as those exemplified above.

The carbon number of the alicyclic hydrocarbon group is preferably from 3 to 20, and more preferably from 3 to 12.

The alicyclic hydrocarbon group may be a polycyclic group, or may be a monocyclic group. The monocyclic alicyclic hydrocarbon group is preferably a group in which two hydrogen atoms are eliminated from a monocycloalkane. The monocycloalkane is preferably one having from 3 to 6 carbon atoms, and specifically, examples thereof include cyclopentane and cyclohexane.

The polycyclic alicyclic hydrocarbon group is preferably a group in which two hydrogen atoms are eliminated from a polycycloalkane. The polycycloalkane is preferably one having from 7 to 12 carbon atoms, and specifically, examples thereof include adamantane, norbornane, isobornane, tricyclodecane, and tetracyclododecane.

The aromatic hydrocarbon group is a hydrocarbon group having an aromatic ring.

The carbon number of the aromatic hydrocarbon group as the divalent hydrocarbon group in $Va^1$ is preferably from 3 to 30, more preferably from 5 to 30, still more preferably from 5 to 20, especially preferably from 6 to 15, and most preferably from 6 to 10. However, the subject carbon number does not include the carbon number in a substituent.

Specifically, examples of the aromatic ring which the aromatic hydrocarbon group has include an aromatic hydrocarbon ring such as benzene, biphenyl, fluorene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group in which two hydrogen atoms are eliminated from the above-described aromatic hydrocarbon ring (arylene group); and a group in which one of hydrogen atoms of a group in which one hydrogen atom is eliminated from the above-described aromatic hydrocarbon ring (aryl group) is substituted with an alkylene group (a group in which one hydrogen atom is further eliminated from an aryl group in an arylalkyl group, for example, a benzyl group, a phenethyl group, a 1-naphthylmethyl group, a 2-naphthylmethyl group, a 1-naphthylethyl group, a 2-naphthylethyl group, etc.). The carbon number of the alkylene group (the alkyl chain in the arylalkyl group) is preferably from 1 to 4, more preferably from 1 to 2, and especially preferably 1.

In the foregoing formula (a1-2), the $(n_{a2}+1)$-valent hydrocarbon group in $Wa^1$ may be an aliphatic hydrocarbon group, or may be an aromatic hydrocarbon group. The aliphatic hydrocarbon group means a hydrocarbon group not having aromaticity. The aliphatic hydrocarbon group may be saturated, or may be unsaturated, and in general, it is preferably saturated. Examples of the aliphatic hydrocarbon group include a linear or branched aliphatic hydrocarbon group, an aliphatic hydrocarbon group containing a ring in a structure thereof, and a group composed of a combination of a linear or branched aliphatic hydrocarbon group and an aliphatic hydrocarbon group containing a ring in a structure thereof.

The $(n_{a2}+1)$ valence is preferably from divalent to tetravalent, and more preferably divalent or trivalent.

Specific examples of the constituent unit represented by the foregoing formula (a1-1) are given below. In the following respective formulae, $R^{\alpha}$ represents a hydrogen atom, a methyl group, or a trifluoromethyl group.

[Chemical Formula21]
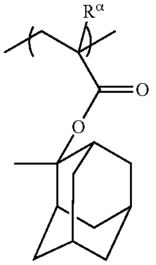
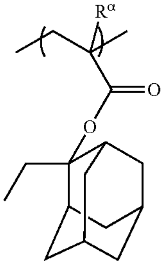
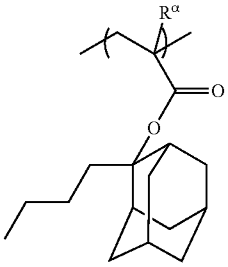
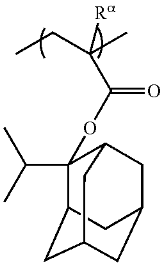
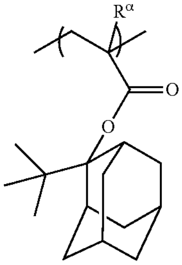
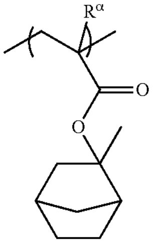
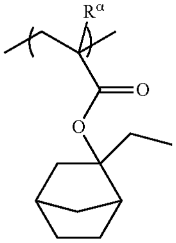
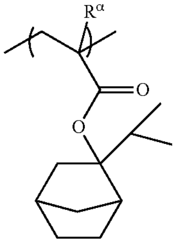
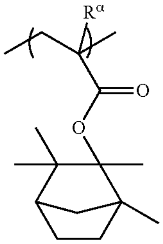
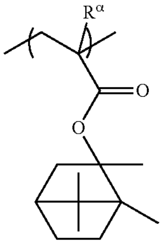
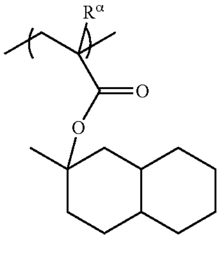
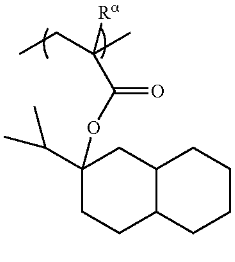
-continued
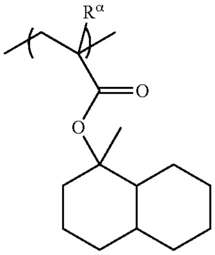
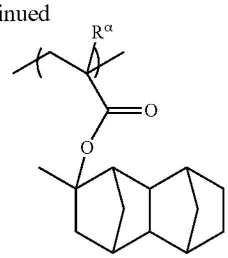
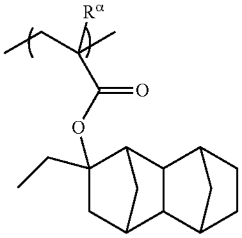
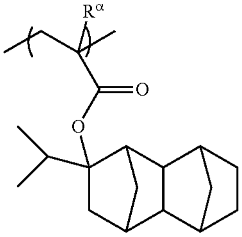
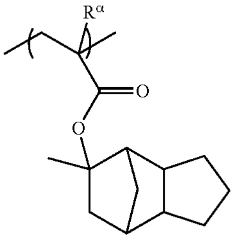
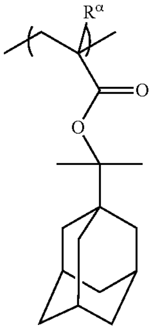
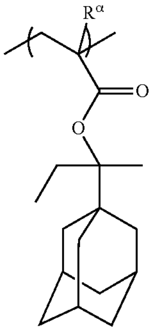
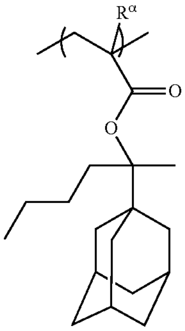
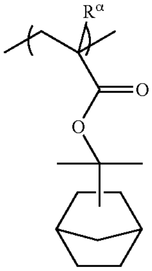
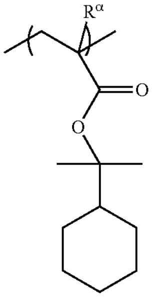
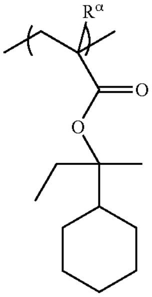
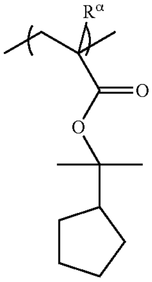
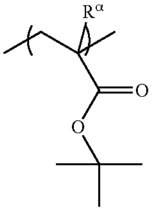
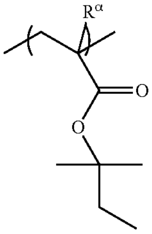

-continued
[Chemical Formula22]
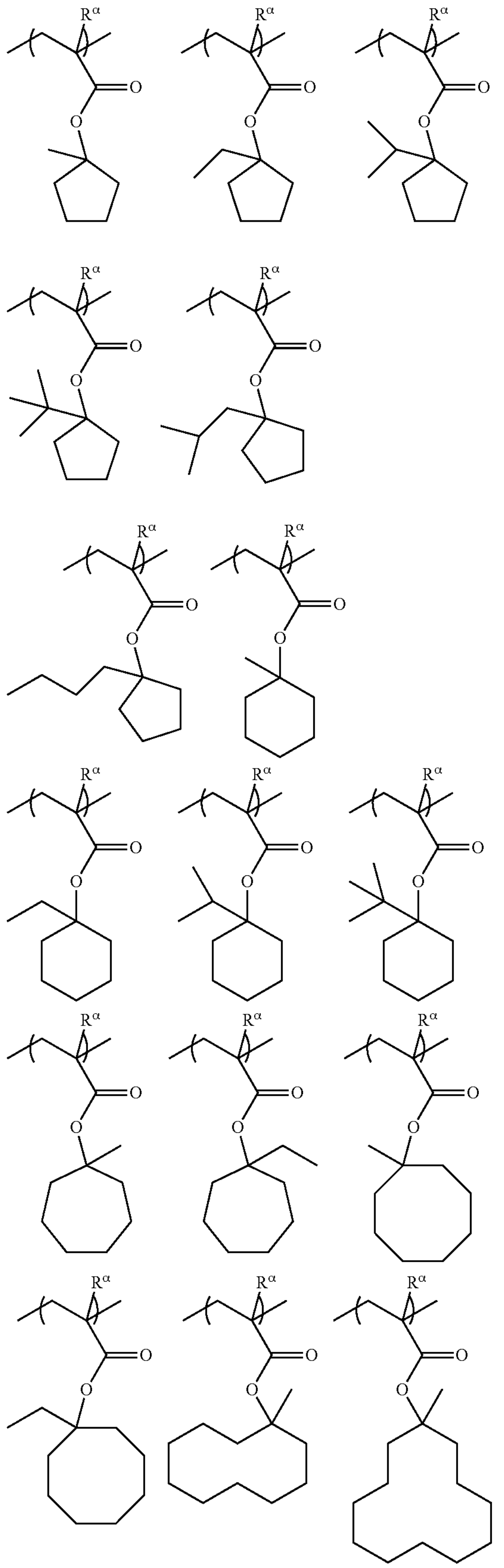
-continued
[Chemical Formula23]
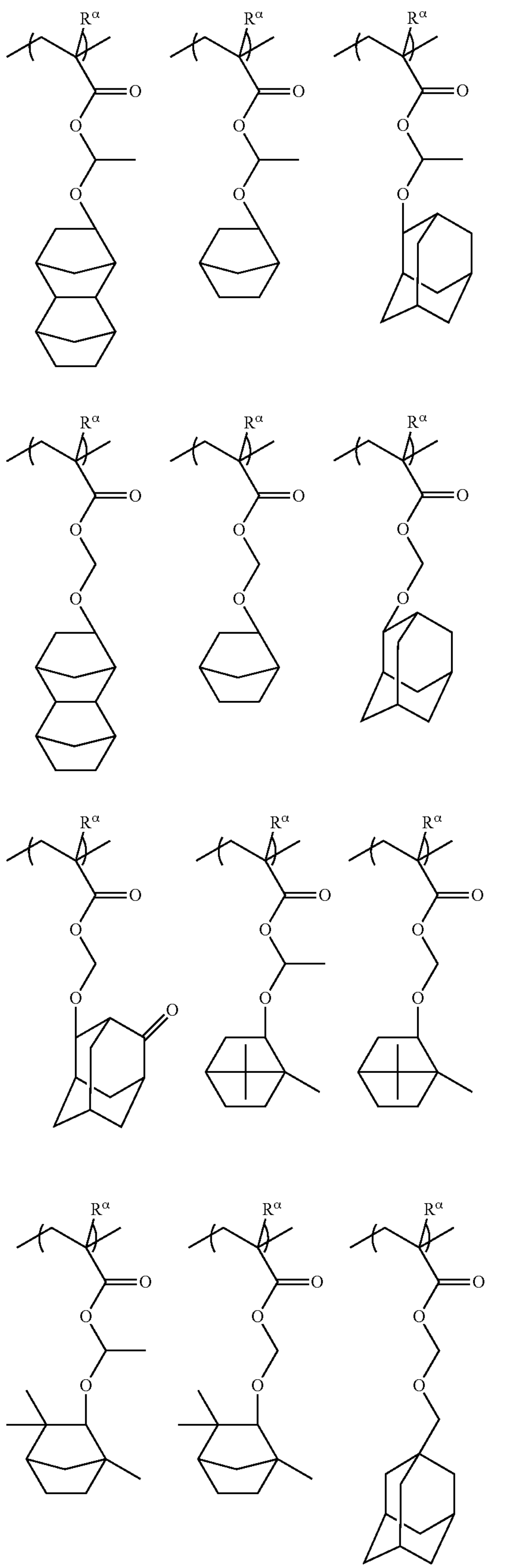

-continued
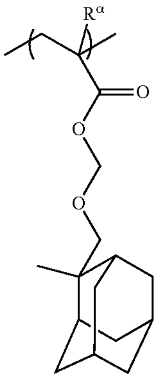
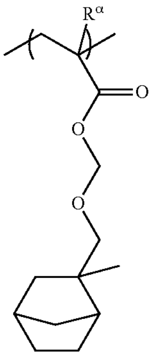
[Chemical Formula 24]
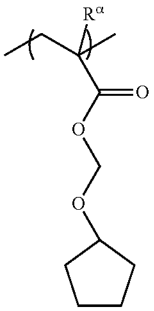
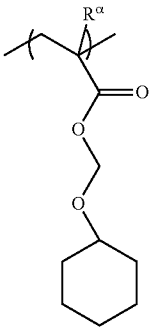
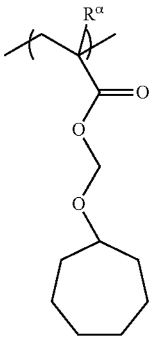
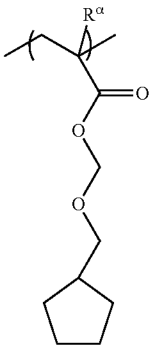
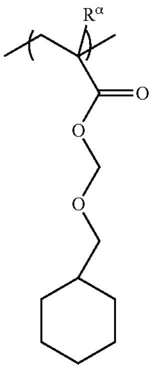
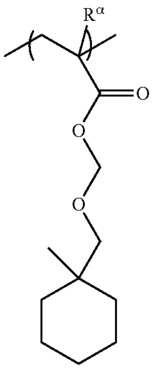
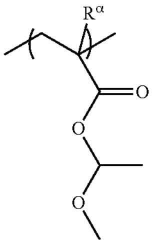
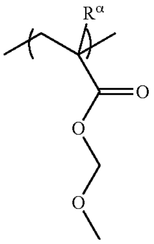
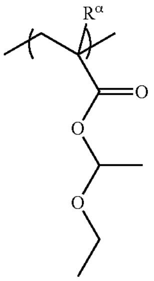
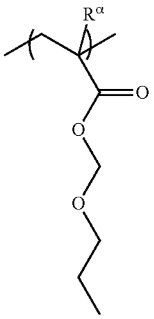
-continued
[Chemical Formula 25]
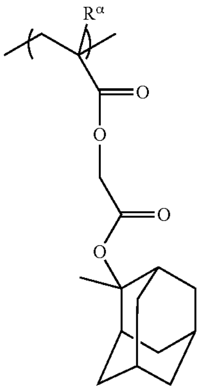
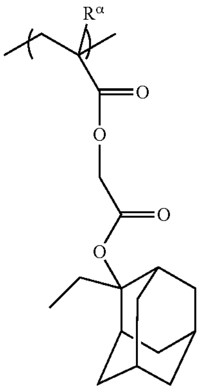
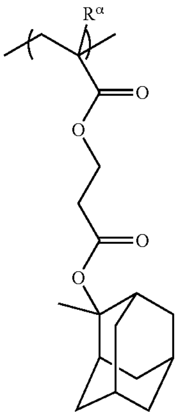
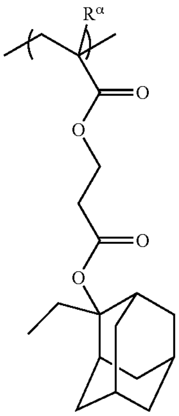
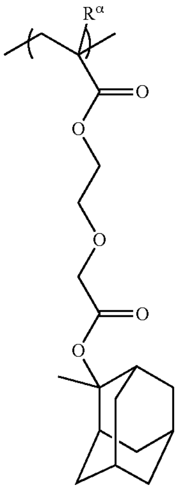
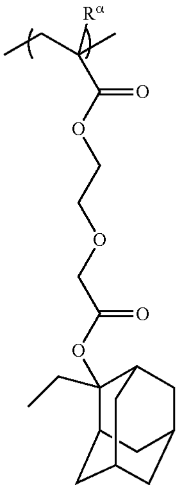

-continued
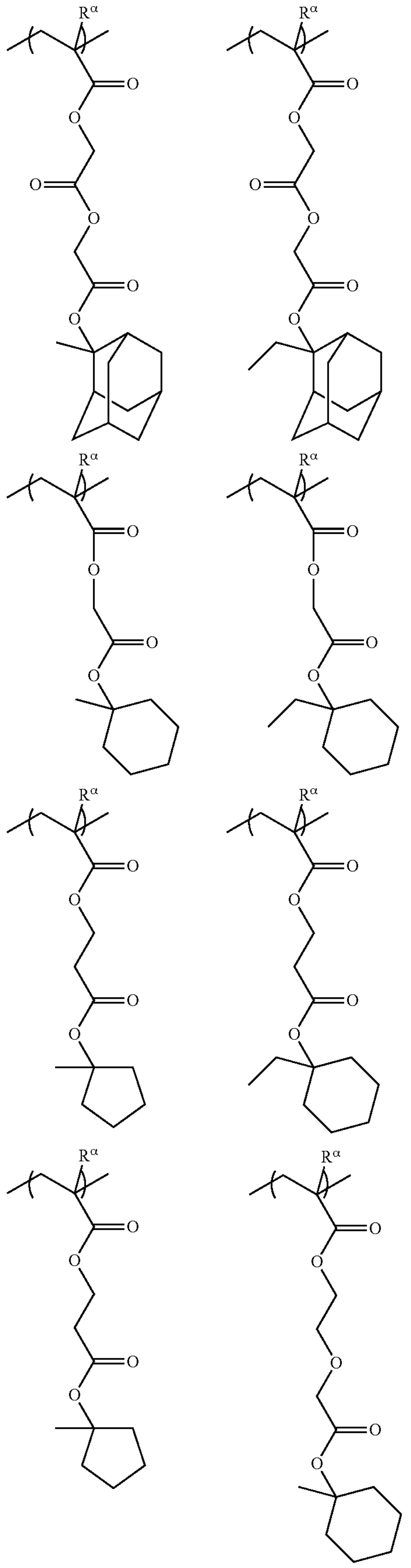
-continued
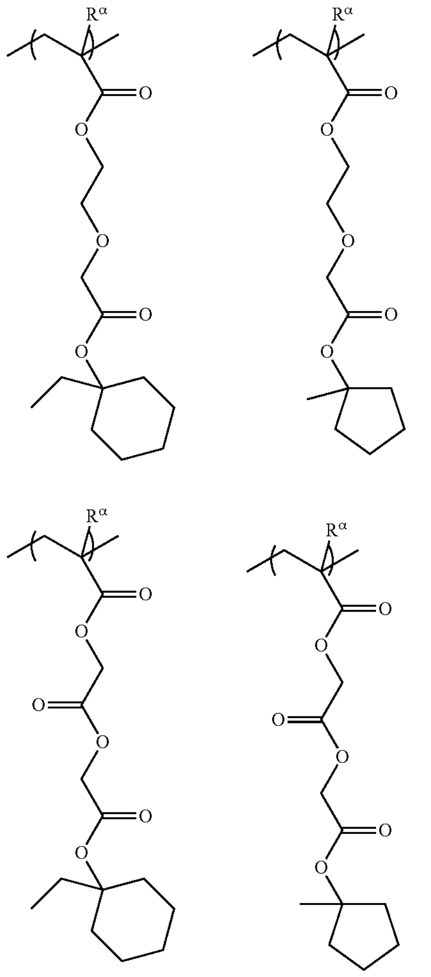
Specific examples of the constituent unit represented by the foregoing formula (a1-2) are given below.
[Chemical Formula 26]
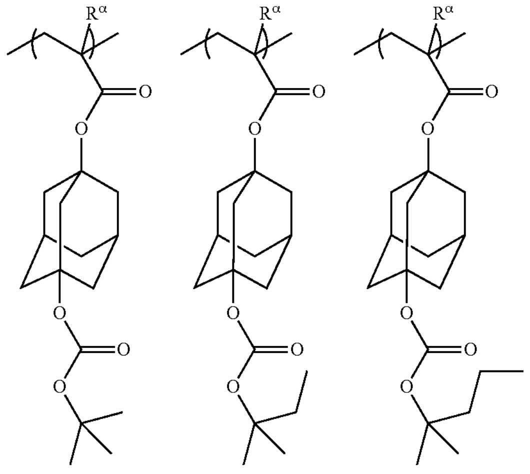

-continued

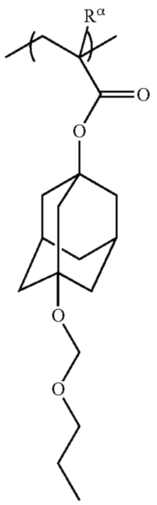

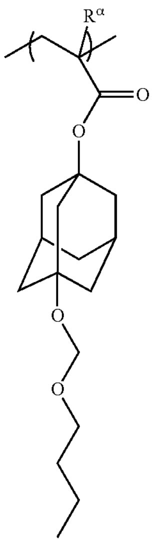

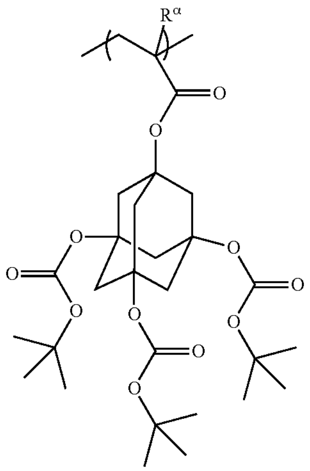

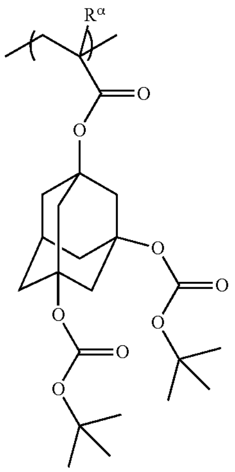

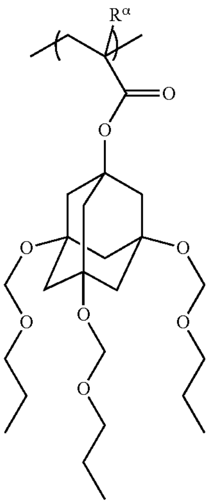

-continued

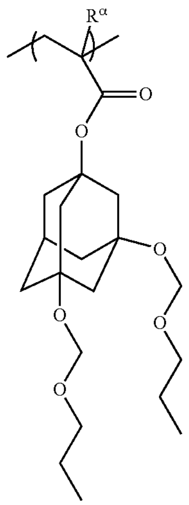

The constituent unit (a1) which the component (A1) has may exist solely or in combination of two or more kinds thereof.

Above all, in view of the fact that the sensitivity increases, and lithography properties such as reduction of roughness are more enhanced, it is preferable to use a constituent unit (a1c) containing an aliphatic monocyclic group-containing group as the acid decomposable group.

As for the constituent unit (a1c), a constituent unit that is the constituent unit represented by the foregoing general formula (a1-1), in which $Ra^1$ (acid dissociable group) in the formula (a1-1) is an aliphatic monocyclic group-containing group, is more preferable.

Above all, a constituent unit in which $Ra^1$ (acid dissociable group) is represented by the foregoing general formula (a1-r-2) and is an aliphatic monocyclic group-containing group is still more preferable. In that case, examples of $Ra^1$ include the groups represented by the foregoing general formulae (r-pr-s1) to (r-pr-s18), respectively and the groups represented by the foregoing general formulae (r-pr-cs1) to (r-pr-cs3), respectively.

Furthermore, above all, a constituent unit in which $Ra^1$ (acid dissociable group) is represented by the foregoing general formula (a1-r2-1) and is an aliphatic monocyclic group-containing group is especially preferable. In that case, examples of $Ra^1$ include the groups represented by the foregoing general formulae (r-pr-s1) to (r-pr-s18), respectively.

A proportion of the constituent unit (a1) in the component (A1) is preferably not more than 45% by mole, more preferably from 10 to 40% by mole, still more preferably from 20 to 40% by mole, and especially preferably from 25 to 35% by mole relative to a total sum of all of the constituent units constituting the component (A1).

When the proportion of the constituent unit (a1) is the lower limit value or more, a resist pattern can be easily obtained, and high sensitivity, high resolution, and lithography properties such as reduction of roughness are also enhanced. In addition, when the proportion of the constituent unit (a1) is not more than the upper limit value, a resist pattern having a satisfactory shape, in which, for example, the generation of pattern slippage is more suppressed, is easily obtained.

(Constituent Unit (a2))

The constituent unit (a2) is a constituent unit containing a group represented by the following general formula (a2-r-1), namely, a lactone-containing monocyclic group.

In the case of using the component (A1) for forming a resist film, the lactone-containing monocyclic group of the constituent unit (a2) is effective for increasing the adhesion of the resist film to a substrate.

[Chemical Formula 27]

(a2-r-1)

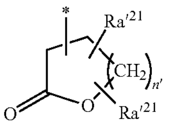

In the formula (a2-r-1), each of $Ra'^{21}$s independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; n' represents an integer of from 0 to 2; and * represents a bond.

In the foregoing formula (a2-r-1), $Ra'^{21}$ is the same as $Ra'^{21}$ in the foregoing formulae (a0-r-1) to (a0-r-6). R" is the same as that described above for R". n' is preferably 1 or 2, and more preferably 2.

Specific examples of the group represented by the general formula (a2-r-1) are given below.

[Chemical Formula 28]

(r-lc-1-1)

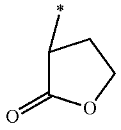

(r-lc-1-2)

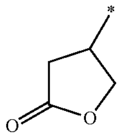

(r-lc-1-3)

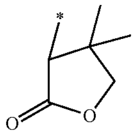

(r-lc-1-4)

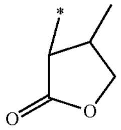

(r-lc-1-5)

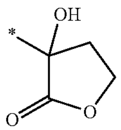

-continued (r-lc-1-6)

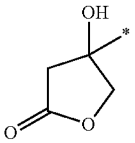

(r-lc-1-7)

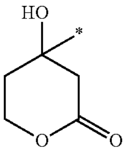

The constituent unit (a2) is preferably a constituent unit derived from an acrylic acid ester in which the hydrogen atom bonded to the carbon atom at the α-position may be substituted with a substituent.

Preferred specific examples of such a constituent unit (a2) include a constituent unit represented by the following general formula (a2-1).

[Chemical Formula 29]

(a2-1)

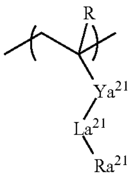

In the formula, R represents a hydrogen atom, an alkyl group having from 1 to 5 carbon atoms, or a halogenated alkyl group having from 1 to 5 carbon atoms; $Ya^{21}$ represents a single bond or a divalent connecting group; $La^{21}$ represents —O—, —COO—, —CON(R')—, —OCO—, —CONHCO—, or —CONHCS—; R' represents a hydrogen atom or a methyl group, provided that when $La^{21}$ is —O—, then $Ya^{21}$ is not —CO—; and $Ra^{21}$ is a group represented by the foregoing general formula (a2-r-1).

In the foregoing (a2-1), R is the same as that described above.

Though the divalent connecting group represented by $Ya^{21}$ is not particularly limited, suitable examples thereof include an optionally substituted divalent hydrocarbon group and a hetero atom-containing divalent connecting group.

(Optionally Substituted Divalent Hydrocarbon Group)

The hydrocarbon group as the divalent connecting group may be an aliphatic hydrocarbon group, or may be an aromatic hydrocarbon group.

The aliphatic hydrocarbon group in $Ya^{21}$ may be saturated, or may be unsaturated, and in general, it is preferably saturated.

Examples of the aliphatic hydrocarbon group include a linear or branched aliphatic hydrocarbon group and an aliphatic hydrocarbon group containing a ring in a structure thereof.

The carbon number of the above-described linear or branched aliphatic hydrocarbon group is preferably from 1 to 10, more preferably from 1 to 6, still more preferably from 1 to 4, and most preferably from 1 to 3.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group. Specifically, examples thereof include an alkylalkylene group such as an alkylmethylene group, e.g., —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, —$C(CH_2CH_3)_2$—, etc.; an alkylethylene group, e.g., —$CH(CH_3)CH_2$—, —$CH(CH_3)CH(CH_3)$—, —$C(CH_3)_2CH_2$—, —$CH(CH_2CH_3)CH_2$—, —$C(CH_2CH_3)_2$—$CH_2$—, etc.; an alkyltrimethylene group, e.g., —$CH(CH_3)CH_2CH_2$—, —$CH_2CH(CH_3)CH_2$—, etc.; and an alkyltetramethylene group, e.g., —$CH(CH_3)CH_2CH_2CH_2$—, —$CH_2CH(CH_3)CH_2CH_2$—, etc. The alkyl group in the alkylalkylene group is preferably a linear alkyl group having from 1 to 5 carbon atoms.

The above-described linear or branched aliphatic hydrocarbon group may or may not have a substituent. Examples of the substituent include a fluorine atom, a fluorine atom-substituted fluorinated alkyl group having from 1 to 5 carbon atoms, and a carbonyl group.

Examples of the above-described aliphatic hydrocarbon group containing a ring in a structure thereof include an optionally substituted cyclic aliphatic hydrocarbon group containing a hetero atom in a ring structure thereof (a group in which two hydrogen atoms are eliminated from an aliphatic hydrocarbon ring); a group in which the above-described cyclic aliphatic hydrocarbon group is bonded to an end of a linear or branched aliphatic hydrocarbon group; and a group in which the above-described cyclic aliphatic hydrocarbon group intervenes on the way of a linear or branched aliphatic hydrocarbon group. Examples of the linear or branched aliphatic hydrocarbon group include the same linear or branched aliphatic hydrocarbon groups as those exemplified above.

The carbon number of the cyclic aliphatic hydrocarbon group is preferably from 3 to 20, and more preferably from 3 to 12.

The cyclic aliphatic hydrocarbon group may be a polycyclic group, or may be a monocyclic group. The monocyclic alicyclic hydrocarbon group is preferably a group in which two hydrogen atoms are eliminated from a monocycloalkane. The monocycloalkane is preferably one having from 3 to 6 carbon atoms, and specifically, examples thereof include cyclopentane and cyclohexane. The polycyclic alicyclic hydrocarbon group is preferably a group in which two hydrogen atoms are eliminated from a polycycloalkane. The polycycloalkane is preferably one having from 7 to 12 carbon atoms, and specifically, examples thereof include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having from 1 to 5 carbon atoms, and most preferably a methyl group, an ethyl group, a propyl group, an n-butyl group, or a tert-butyl group.

The alkoxy group as the substituent is preferably an alkoxy group having from 1 to 5 carbon atoms, and preferred examples thereof include a methoxy group, an ethoxy group, an n-propoxy group, an isopropoxy group, an n-butoxy group, and a tert-butoxy group, with a methoxy group or an ethoxy group being the most preferable.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

In the cyclic aliphatic hydrocarbon group, a part of the carbon atoms constituting a ring structure thereof may be substituted with a hetero atom-containing substituent. The hetero atom-containing substituent is preferably —O—, —C(=O)—O—, —S—, —$S(=O)_2$—, or —$S(=O)_2$—O—.

The aromatic hydrocarbon group in $Ya^{21}$ is a hydrocarbon group having at least one aromatic ring.

This aromatic ring is not particularly limited so long as it is a cyclic conjugated system having (4n+2)πelectrons, and it may be either monocyclic or polycyclic. The carbon number of the aromatic ring is preferably from 5 to 30, more preferably from 5 to 20, still more preferably 6 to 15, and especially preferably from 6 to 12. However, the subject carbon number does not include the carbon number in a substituent. Specifically, examples of the aromatic ring include an aromatic hydrocarbon ring such as benzene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom. Specifically, examples of the aromatic heterocyclic ring include a pyridine ring and a thiophene ring.

Specifically, examples of the aromatic hydrocarbon group include a group in which two hydrogen atoms are eliminated from the above-described aromatic hydrocarbon ring or aromatic heterocyclic ring (an arylene group or a heteroarylene group); a group in which two hydrogen atoms are eliminated from an aromatic compound containing two or more aromatic rings (for example, biphenyl, fluorene, etc.); and a group in which one of hydrogen atoms of a group in which one hydrogen atom is eliminated from the above-described aromatic hydrocarbon ring or aromatic heterocyclic ring (an aryl group or a heteroaryl group) is substituted with an alkylene group (for example, a group in which one hydrogen atom is further eliminated from an aryl group in an arylalkyl group such as a benzyl group, a phenethyl group, a 1-naphthylmethyl group, a 2-naphthylmethyl group, a 1-naphthylethyl group, and a 2-naphthylethyl group). The carbon number of the alkylene group bonded to the above-described aryl group or heteroaryl group is preferably from 1 to 4, more preferably from 1 to 2, and especially preferably 1.

In the above-described aromatic hydrocarbon group, the hydrogen atom(s) which the aromatic hydrocarbon group has may be substituted with a substituent. For example, the hydrogen atom(s) bonded to the aromatic ring in the aromatic hydrocarbon group may be substituted with a substituent. Examples of the substituent include an alkyl group, an alkoxy group, a halogen atom, a halogenated alkyl group, and a hydroxyl group.

The alkyl group as the substituent is preferably an alkyl group having from 1 to 5 carbon atoms. The alkyl group is most preferably a methyl group, an ethyl group, a propyl group, an n-butyl group, or a tert-butyl group.

Examples of the alkoxy group, the halogen atom, and the halogenated alkyl group as the substituent include those exemplified above for the substituent that substitutes the hydrogen atom(s) which the cyclic aliphatic hydrocarbon group has.

(Hetero Atom-Containing Divalent Connecting Group)

The hetero atom in the hetero atom-containing divalent group is an atom other than a carbon atom and a hydrogen atom, and examples thereof include an oxygen atom, a nitrogen atom, a sulfur atom, and a halogen atom.

In the case where $Ya^{21}$ is a hetero atom-containing divalent connecting group, preferred examples of the connecting group include —O—, —C(═O)—O—, —C(═O)—, —O—C(═O)—O—, —C(═O)—NH—, —NH—, —NH—C(═NH)— (H may be substituted with a substituent such as an alkyl group and an acyl group), —S—, $—S(═O)_2—$, $—S(═O)_2—O—$, and a group represented by the general formula: $—Y^{21}—O—Y^{22}—$, $—Y^{21}—O—$, $—Y^{21}—C(═O)—O—$, $—[Y^{21}—C(═O)—O]_{m''}—Y^{22}—$, $—Y^{21}—O—C(═O)—Y^{22}—$, or $—Y^{21}—S(═O)_2—O—Y^{22}—$ [in the formulae, each of $Y^{21}$ and $Y^{22}$ independently represents an optionally substituted divalent hydrocarbon group; 0 represents an oxygen atom; m" represents an integer of from 0 to 3].

In the case where the hetero atom-containing divalent connecting group is —C(═O)—NH—, —C(═O)—NH—C(═O)—, —NH—, or —NH—C(═NH)—, the H may be substituted with a substituent such as an alkyl group and an acyl group. The carbon number of the substituent (such as an alkyl group and an acyl group) is preferably from 1 to 10, more preferably from 1 to 8, and especially preferably from 1 to 5.

In the general formula: $—Y^{21}—O—Y^{22}—$, $—Y^{21}—O—$, $—Y^{21}—C(═O)—O—$, $[Y^{21}—C(═O)—O]_{m''}—Y^{22}—$, $—Y^{21}—O—C(═O)—Y^{22}—$, or $—Y—S(═O)_2—O—Y^{22}—$, each of $Y^{21}$ and $Y^{22}$ independently represents an optionally substituted divalent hydrocarbon group. Examples of the divalent hydrocarbon group include the same divalent hydrocarbon groups as those exemplified above for the divalent connecting group (optionally substituted divalent hydrocarbon group).

$Y^{21}$ is preferably a linear aliphatic hydrocarbon group, more preferably a linear alkylene group, still more preferably a linear alkylene group having from 1 to 5 carbon atoms, and especially preferably a methylene group or an ethylene group.

$Y^{22}$ is preferably a linear or branched aliphatic hydrocarbon group, and more preferably a methylene group, an ethylene group, or an alkylmethylene group. The alkyl group in the alkylmethylene group is preferably a linear alkyl group having from 1 to 5 carbon atoms, more preferably a linear alkyl group having from 1 to 3 carbon atoms, and most preferably a methyl group.

In the group represented by the formula: $—[Y^{21}—C(═O)—O]_{m''}—Y^{22}—$, m" represents an integer of from 0 to 3, preferably an integer of from 0 to 2, more preferably 0 or 1, and especially preferably 1. Namely, the group represented by the formula: $—[Y^{21}—C(═O)—O]_{m''}—Y^{22}—$ is especially preferably a group represented by the formula: $—Y^{21}—C(═O)—O—Y^{22}—$. Above all, a group represented by the formula: $—(CH_2)_{a'}—C(═O)—O—(CH_2)_{b'}—$ is preferable. In the foregoing formula, a' is an integer of from 1 to 10, preferably an integer of from 1 to 8, more preferably an integer of from 1 to 5, still more preferably 1 or 2, and most preferably 1. b' is an integer of from 1 to 10, preferably an integer of from 1 to 8, more preferably an integer of from 1 to 5, still more preferably 1 or 2, and most preferably 1.

$Ya^{21}$ is preferably a single bond, an ester bond [—C(═O)—O—], an ether bond (—O—), a linear or branched alkylene group, or a combination thereof.

The constituent unit (a2) which the component (A1) has may exist solely or in combination of two or more kinds thereof.

A proportion of the constituent unit (a2) in the component (A1) is preferably 20% by mole or more, more preferably from 25 to 70% by mole, and still more preferably from 30 to 60% by mole relative to a total sum of all of the constituent units constituting the component (A1).

When the proportion of the constituent unit (a2) is the lower limit value or more, the adhesion of the resist film to a substrate more increases. In addition, when the proportion of the constituent unit (a2) is not more than the upper limit value, a balance with the constituent unit (a1) becomes satisfactory, and the sensitivity more increases. In addition thereto, lithography properties such as reduction of roughness are more enhanced.

(Other Constituent Units)

The component (A1) may have, in addition to the constituent unit (a0), the constituent unit (a1), and the constituent unit (a2), other constituent units which are not corresponding to the foregoing constituent units.

The foregoing other constituent units are not particularly limited so long as they are a constituent unit which is not classified into the above-described constituent units. A large number of constituent units which have been conventionally known to be used for resins for resist such as those for ArF excimer laser and KrF excimer laser (preferably those for ArF excimer laser), and the like can be used. Examples thereof include a constituent unit (a3) and a constituent unit (a4) as described below.

Constituent Unit (a3):

The constituent unit (a3) is a constituent unit containing a polar group-containing aliphatic hydrocarbon group (exclusive of those corresponding to the foregoing constituent units (a0), (a1) and (a2)).

In view of the fact that the component (A1) has the constituent unit (a3), the hydrophilicity of the component (A) increases, resulting in contribution to an enhancement of resolution.

Examples of the polar group include a hydroxyl group, a carboxyl group, and a hydroxyalkyl group in which a part of hydrogen atoms of an alkyl group is substituted with a fluorine atom. In particular, a hydroxyl group is preferable.

Examples of the aliphatic hydrocarbon group include a linear or branched hydrocarbon group having from 1 to 10 carbon atoms (preferably an alkylene group) and a cyclic aliphatic hydrocarbon group (cyclic group). The cyclic group may be either a monocyclic group or a polycyclic group, and for example, it can be properly selected and used among a large number of groups proposed in resins for resist compositions for ArF excimer laser. The cyclic group is preferably a polycyclic group, and more preferably a polycyclic group having from 7 to 30 carbon atoms.

Above all, a constituent unit derived from an acrylic acid ester containing an aliphatic polycyclic group containing a hydroxyl group, a carboxyl group, or a hydroxyalkyl group in which a part of hydrogen atoms of an alkyl group is substituted with a fluorine atom is more preferable. Examples of the polycyclic group include a group in which two or more hydrogen atoms are eliminated from a bicycloalkane, a tricycloalkane, a tetracycloalkane, or the like.

Specifically, examples thereof include a group in which two or more hydrogen atoms are eliminated from a polycycloalkane such as adamantane, norbornane, isobornane, tricyclodecane, and tetracyclododecane. Among these polycyclic groups, a group in which two or more hydrogen atoms are eliminated from adamantane, a group in which two or more hydrogen atoms are eliminated from norbornane, or a group in which two or more hydrogen atoms are eliminated from tetracyclododecane is preferable from the industrial standpoint.

As the constituent unit (a3), an arbitrary constituent unit can be used without particular limitations so long as it contains a polar group-containing aliphatic hydrocarbon group.

The constituent unit (a3) is preferably a constituent unit derived from an acrylic acid ester in which the hydrogen atom bonded to the carbon atom at the α-position may be substituted with a substituent, the constituent unit being a constituent unit containing a polar group-containing aliphatic hydrocarbon group.

When the hydrocarbon group in the polar group-containing aliphatic hydrocarbon group is a linear or branched hydrocarbon group having from 1 to 10 carbon atoms, the constituent unit (a3) is preferably a constituent unit derived from a hydroxyethyl ester of acrylic acid, and when the subject hydrocarbon group is a polycyclic group, the constituent unit (a3) is preferably a constituent unit represented by the following formula (a3-1) or a constituent unit represented by the following formula (a3-3).

[Chemical Formula 30]

(a3-1)

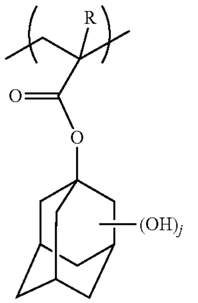

(a3-3)

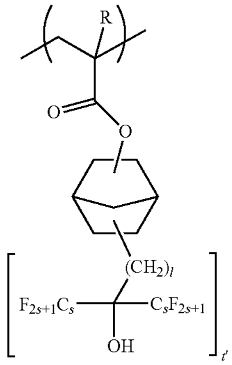

In the formulae, R is the same as that described above; j represents an integer of from 1 to 3; t' represents an integer of from 1 to 3; 1 represents an integer of from 1 to 5; and s represents an integer of from 1 to 3.

In the formula (a3-1), j is preferably 1 or 2, and more preferably 1. In the case where j is 2, a unit in which the hydroxyl group is bonded to the 3-position and 5-position of the adamantyl group is preferable. In the case where j is 1, a unit in which the hydroxyl group is bonded to the 3-position of the adamantyl group is preferable.

j is preferably 1, and a unit in which the hydroxyl group is bonded to the 3-position of the adamantyl group is especially preferable.

In the formula (a3-3), t' is preferably 1. l is preferably 1. s is preferably 1. In these, it is preferable that the 2-norbonyl group or the 3-norbornyl group is bonded to an end of the carboxyl group of acrylic acid. The fluorinated alkyl alcohol is preferably bonded to the 5- or 6-position of the norbornyl group.

The constituent unit (a3) which the component (A1) has may exist solely or in combination of two or more kinds thereof.

In the case where the component (A1) has the constituent unit (a3), a proportion of the constituent unit (a3) is preferably not more than 20% by mole, and more preferably from 0 to 10% by mole relative to a total sum of all of the constituent units constituting the component (A1). When the proportion of the constituent unit (a3) is the lower limit value or more, the effect to be brought by containing the constituent unit (a3) is sufficiently obtained, and when the proportion of the constituent unit (a3) is not more than the upper limit value, balance with other constituent units is easily taken.

Constituent Unit (a4):

The constituent unit (a4) is a constituent unit containing an acid-nondissociable aliphatic cyclic group.

In view of the fact that the component (A1) has the constituent unit (a4), dry etching resistance of the formed resist pattern is enhanced.

The "acid-nondissociable cyclic group" in the constituent unit (a4) is a cyclic group which on the occasion of generation of an acid in the resist composition upon exposure (for example, on the occasion of generation of an acid from a component (B) as described later), even when the acid acts, remains in the constituent unit as it is without being dissociated.

The constituent unit (a4) is, for example, preferably a constituent unit derived from an acrylic acid ester containing an acid-nondissociable aliphatic cyclic group, or the like. Examples of the cyclic group include the same cyclic groups as those exemplified for the case of the above-described constituent unit (a1). A large number of constituent units which have been conventionally known to be used for resin components for resist composition such as those for ArF excimer laser and KrF excimer laser (preferably those for ArF excimer laser), and the like can be used.

In particular, from the standpoint of easiness of industrial availability or the like, the constituent unit (a4) is preferably at least one member selected from a tricyclodecyl group, an adamantyl group, a tetracyclododecyl group, an isobornyl group, and a norbornyl group. Such a polycyclic group may have a linear or branched alkyl group having from 1 to 5 carbon atoms as a substituent.

Specifically, examples of the constituent unit (a4) include constituent units represented by the following general formulae (a4-1) to (a4-7), respectively.

[Chemical Formula 31]

(a4-1)

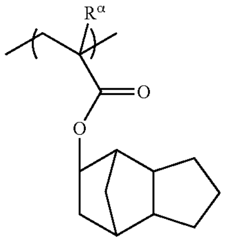

(a4-2)

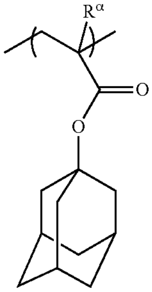

(a4-3)

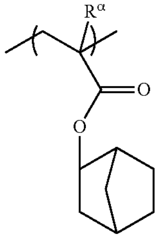

(a4-4)

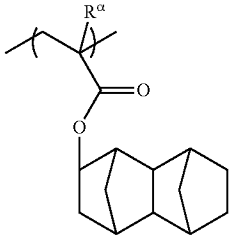

(a4-5)

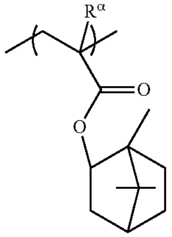

(a4-6)

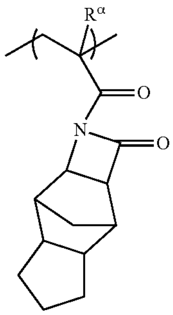

-continued (a4-7)

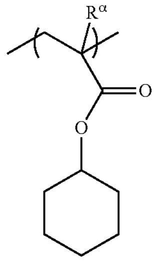

In the formulae, $R^{\alpha}$ is the same as that described above. The constituent unit (a4) which the component (A1) has may exist solely or in combination of two or more kinds thereof.

In the case where the component (A1) has the constituent unit (a4), a proportion of the constituent unit (a4) is preferably not more than 40% by mole, more preferably from 5 to 30% by mole, and still more preferably from 10 to 20% by mole relative to a total sum of all of the constituent units constituting the component (A1).

When the proportion of the constituent unit (a4) is the lower limit value or more, the effect to be brought by containing the constituent unit (a4) is sufficiently obtained, and when the proportion of the constituent unit (a4) is not more than the upper limit value, balance with other constituent units is easily taken.

The component (A1) is a high-molecular compound having the constituent unit (a0), the constituent unit (a1), and the constituent unit (a2). Above all, the component (A1) is preferably a high-molecular compound having the constituent unit (a0), the constituent unit (a1c), and the constituent unit (a2).

Suitable examples of such a component (A1) include a high-molecular compound composed of a repeating structure of the constituent unit (a0) containing the group represented by the foregoing general formula (a0-r-7), the constituent unit (a1c), and the constituent unit (a2); and a high-molecular compound composed of a repeating structure of the constituent unit (a0) containing the group represented by the foregoing general formula (a0-r-9), the constituent unit (a1c), and the constituent unit (a2).

In particular, in view of the fact that in the formation of a resist pattern by performing a rinse treatment after the development treatment, a resist pattern having a satisfactory shape is easily obtained, and for example, so far as the formation of a line pattern is concerned, the generation of pattern slippage is more suppressed, a proportion of the above-described constituent unit (a1c) in such a component (A1) is preferably not more than 45% by mole, more preferably from 10 to 40% mole, still more preferably from 20 to 40% by mole, and especially preferably from 25 to 35% by mole relative to a total sum of all of the constituent units constituting the component (A1); and a proportion of the above-described constituent unit (a0) is preferably from 10 to 25% by mole relative to a total sum of all of the constituent units constituting the component (A1).

A mass average molecular weight (Mw) (as reduced into polystyrene by means of gel permeation chromatography (GPC)) of the component (A1) is not particularly limited, and it is preferably from 1,000 to 50,000, more preferably from 1,500 to 30,000, and most preferably from 2,000 to 20,000. When the mass average molecular weight of the component (A1) is not more than the upper limit value of the foregoing range, sufficient solubility in a resist solvent for the use as a resist is revealed, and when it is not less than the lower limit value of the foregoing range, satisfactory dry etching resistance and resist pattern cross-sectional shape are revealed.

A dispersity (Mw/Mn) is not particularly limited, and it is preferably from 1.0 to 5.0, more preferably from 1.0 to 4.0, and most preferably from 1.0 to 3.0. It is to be noted that Mn represents a number average molecular weight.

The component (A1) may be used solely or in combination of two or more kinds thereof.

A proportion of the component (A1) in the component (A) is preferably 25% by mass or more, more preferably 50% by mass or more, and still more preferably 75% by mass or more, and may be even 100% by mass relative to a total mass of the component (A). When the proportion of the component (A1) is 25% by mass or more, in the formation of a resist pattern by performing a rinse treatment after the development treatment, a resist pattern having a satisfactory shape is easily obtained, and for example, so far as the formation of a line pattern is concerned, the generation of pattern slippage is more suppressed.

In the resist composition of the present embodiment, the component (A) may be used solely or in combination of two or more kinds thereof.

In the resist composition of the present embodiment, the content of the component (A) may be adjusted depending upon a thickness of the resist film to be formed, or the like.

In the resist composition of the present embodiment, a base material component which is not corresponding to the above-described component (A1), whose solubility in a developing solution changes by the action of an acid (hereinafter referred to as "component (A2)"), may be used jointly as the base material component.

The component (A2) is not particularly limited, and it may be arbitrarily selected from a large number of materials which have been conventionally known as a base material component for chemically amplified resist composition (for example, base resins for ArF excimer laser, KrF excimer laser (preferably those for ArF excimer laser), etc.) to be used. The component (A2) may be used solely or in combination of two or more kinds thereof.

<<Other Components>>

The resist composition of the present embodiment may also be one further containing, in addition to the above-described component (A), an acid generator component (B) that generates an acid upon exposure (hereinafter referred to as "component (B)").

[Component (B)]

The component (B) is not particularly limited, and those which have been proposed so far as an acid generator for a chemically amplified resist can be used.

Examples of such an acid generator include many kinds of acid generators such as an onium salt-based acid generator, e.g., an iodonium salt, a sulfonium salt, etc.; an oxime sulfonate-based acid generator; a diazomethane-based acid generator, e.g., a bisalkyl- or bisarylsulfonyl diazomethane, a poly(bissulfonyl)diazomethane, etc.; a nitrobenzyl sulfonate-based acid generator; an imino sulfonate-based acid generator; and a disulfone-based acid generator. Above all, it is preferable to use an onium salt-based acid generator.

As the onium salt-based acid generator, for example, a compound represented by the following general formula (b-1) (hereinafter also referred to as "component (b-1)"), a compound represented by the following general formula (b-2) (hereinafter also referred to as "component (b-2)"), or a compound represented by the following general formula (b-3) (hereinafter also referred to as "component (b-3)") can be used.

[Chemical Formula 32]

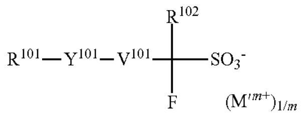

(b-1)

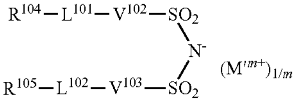

(b-2)

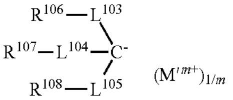

(b-3)

In the formulae, each of $R^{101}$ and $R^{104}$ to $R^{108}$ independently represents an optionally substituted cyclic group, an optionally substituted chain alkyl group, or an optionally substituted chain alkenyl group; $R^{104}$ and $R^{105}$ may be bonded to each other to form a ring; $R^{102}$ represents a fluorine atom or a fluorinated alkyl group having from 1 to 5 carbon atoms; $Y^{101}$ represents a single bond or an oxygen atom-containing divalent connecting group; each of $V^{101}$ to $V^{103}$ independently represents a single bond, an alkylene group, or a fluorinated alkylene group; each of $L^{101}$ to $L^{102}$ independently represents a single bond or an oxygen atom; each of $L^{103}$ to $L^{105}$ independently represents a single bond, —CO—, or —$SO_2$—; and $M'^{m+}$ represents an m-valent onium cation.

{Anion Part}

Anion Part of Component (b-1):

In the formula (b-1), $R^{101}$ represents an optionally substituted cyclic group, an optionally substituted chain alkyl group, or an optionally substituted chain alkenyl group.

(Optionally Substituted Cyclic Group)

The subject cyclic group is preferably a cyclic hydrocarbon group, and the cyclic hydrocarbon group may be an aromatic hydrocarbon group, or may be an aliphatic hydrocarbon group. The aliphatic hydrocarbon group means a hydrocarbon group not having aromaticity. In addition, the aliphatic hydrocarbon group may be saturated, or may be unsaturated, and in general, it is preferably saturated.

The aromatic hydrocarbon group in $R^{101}$ is a hydrocarbon group having an aromatic ring. The carbon number of the aromatic hydrocarbon group is preferably from 3 to 30, more preferably from 5 to 30, still more preferably from 5 to 20, especially preferably from 6 to 15, and most preferably from 6 to 10. However, the subject carbon number does not include the carbon number in a substituent.

Specifically, examples of the aromatic ring which the aromatic hydrocarbon group in $R^{101}$ has include benzene, fluorene, naphthalene, anthracene, phenanthrene, and biphenyl; and an aromatic heterocyclic ring in which a part of the carbon atoms constituting the above-described aromatic ring is substituted with a hetero atom. Examples of the hetero atom in the aromatic heterocyclic ring include an oxygen atom, a sulfur atom, and a nitrogen atom.

Specifically, examples of the aromatic hydrocarbon group in $R^{101}$ include a group in which one hydrogen atom is eliminated from the above-described aromatic ring (an aryl group, for example, a phenyl group, a naphthyl group, etc.); and a group in which one of the hydrogen atoms of the above-described aromatic ring is substituted with an alkylene group (an arylalkyl group, for example, a benzyl group, a phenethyl group, a 1-naphthylmethyl group, a 2-naphthylmethyl group, a 1-naphthylethyl group, a 2-naphthylethyl group, etc.). The carbon number of the above-described alkylene group (alkyl chain in the arylalkyl group) is preferably from 1 to 4, more preferably from 1 to 2, and especially preferably 1.

Examples of the cyclic aliphatic hydrocarbon group in $R^{101}$ include an aliphatic hydrocarbon group containing a ring in a structure thereof.

Examples of the aliphatic hydrocarbon group containing a ring in a structure thereof include an alicyclic hydrocarbon group (a group in which one hydrogen atom is eliminated from an aliphatic hydrocarbon ring); a group in which an alicyclic hydrocarbon group is bonded to an end of a linear or branched aliphatic hydrocarbon group; and a group in which an alicyclic hydrocarbon group intervenes on the way of a linear or branched aliphatic hydrocarbon group.

The carbon number of the above-described alicyclic hydrocarbon group is preferably from 3 to 20, and more preferably from 3 to 12.

The above-described alicyclic hydrocarbon group may be a polycyclic group, or may be a monocyclic group. The monocyclic alicyclic hydrocarbon group is preferably a group in which one or more hydrogen atoms are eliminated from a monocycloalkane. The monocycloalkane is preferably one having from 3 to 6 carbon atoms, and specifically, examples thereof include cyclopentane and cyclohexane. The polycyclic alicyclic hydrocarbon group is preferably a group in which one or more hydrogen atoms are eliminated from a polycycloalkane. The polycycloalkane is preferably one having from 7 to 12 carbon atoms, and specifically, examples thereof include adamantane, norbornane, isobornane, tricyclodecane, and tetracyclododecane.

Above all, the cyclic aliphatic hydrocarbon group in $R^{101}$ is preferably a group in which one or more hydrogen atoms are eliminated from a monocycloalkane or a polycycloalkane, more preferably a group in which one hydrogen atom is eliminated from a polycycloalkane, especially preferably an adamantyl group or a norbornyl group, and most preferably an adamantyl group.

The carbon number of the linear or branched aliphatic hydrocarbon group which may be bonded to an alicyclic hydrocarbon group is preferably from 1 to 10, more preferably from 1 to 6, still more preferably from 1 to 4, and most preferably from 1 to 3.

The linear aliphatic hydrocarbon group is preferably a linear alkylene group. Specifically, examples thereof include a methylene group [$—CH_2—$], an ethylene group [$—(CH_2)_2—$], a trimethylene group [$—(CH_2)_3—$], a tetramethylene group [$—(CH_2)_4—$], and a pentamethylene group [$—(CH_2)_5—$].

The branched aliphatic hydrocarbon group is preferably a branched alkylene group. Specifically, examples thereof include an alkylalkylene group such as an alkylmethylene group, e.g., $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$, $—C(CH_2CH_3)_2—$, etc.; an alkylethylene group, e.g., $—CH(CH_3)CH_2—$, $—CH(CH_3)CH(CH_3)—$, $—C(CH_3)_2CH_2—$, $—CH(CH_2CH_3)CH_2—$, $—C(CH_2CH_3)_2—CH_2—$, etc.; an alkyltrimethylene group, e.g., $—CH(CH_3)CH_2CH_2—$, $—CH_2CH(CH_3)CH_2—$, etc.; and an alkyltetramethylene group, e.g., $—CH(CH_3)CH_2CH_2CH_2—$, $—CH_2CH(CH_3)CH_2CH_2—$, etc. The alkyl group in the alkylalkylene group is preferably a linear alkyl group having from 1 to 5 carbon atoms.

In addition, the cyclic hydrocarbon group in $R^{101}$ may contain a hetero atom as in a heterocyclic ring or the like. Specifically, examples thereof include the lactone-containing cyclic groups represented by the foregoing general formulae (a0-r-1) to (a0-r-6) and (a2-r-1), respectively, the $—SO_2$-containing polycyclic groups represented by the foregoing general formulae (a0-r-7) to (a0-r-8), respectively, $—SO_2$-containing monocyclic groups represented by the following general formulae (a5-r-1) to (a5-r-2), respectively, and besides, heterocyclic groups as exemplified below.

[Chemical Formula 33]

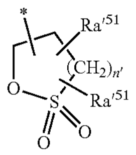

(a5-r-1)

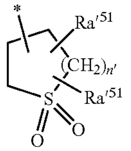

(a-5-r-2)

In the formulae, $Ra'^{51}$ is the same as $Ra'^{51}$ in the foregoing general formulae (a0-r-7) to (a0-r-8); and n' represents an integer of from 0 to 2.

[Chemical Formula 34]

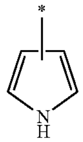

(r-hr-1)

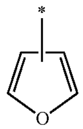

(r-hr-2)

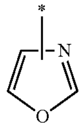

(r-hr-3)

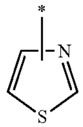

(r-hr-4)

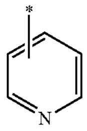

(r-hr-5)

-continued (r-hr-6)
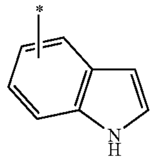

(r-hr-7)
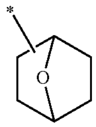

(r-hr-8)
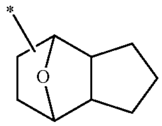

(r-hr-9)
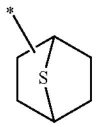

(r-hr-10)
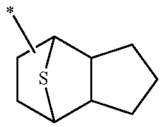

(r-hr-11)
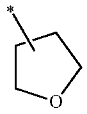

(r-hr-12)
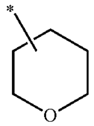

(r-hr-13)
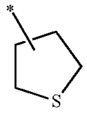

(r-hr-14)
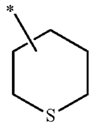

(r-hr-15)
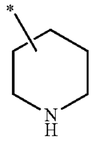

(r-hr-16)
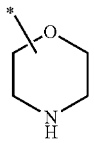

Examples of the substituent in the cyclic hydrocarbon group represented by $R^{101}$ include an alkyl group, an alkoxy group, a halogen atom, a halogenated alkyl group, a hydroxyl group, a carbonyl group, and a nitro group.

The alkyl group as the substituent is preferably an alkyl group having from 1 to 5 carbon atoms, and most preferably a methyl group, an ethyl group, a propyl group, an n-butyl group, or a tert-butyl group.

The alkoxy group as the substituent is preferably an alkoxy group having from 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of an alkyl group having from 1 to 5 carbon atoms, for example, a methyl group, an ethyl group, a propyl group, an n-butyl group, a tert-butyl group, etc., are substituted with the above-described halogen atom.

The carbonyl group as the substituent is a group that substitutes a methylene group (—$CH_2$—) constituting the cyclic hydrocarbon group.

(Optionally Substituted Chain Alkyl Group)

The chain alkyl group represented by $R^{101}$ may be either linear or branched.

The carbon number of the linear alkyl group is preferably from 1 to 20, more preferably from 1 to 15, and most preferably from 1 to 10. Specifically, examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an eicosyl group, a heneicosyl group, and a docosyl group.

The carbon number of the branched alkyl group is preferably from 3 to 20, more preferably from 3 to 15, and most preferably from 3 to 10. Specifically, examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

(Optionally Substituted Chain Alkenyl Group)

The chain alkenyl group represented by $R^{101}$ may be either linear or branched. The carbon number of the chain alkenyl group is preferably from 2 to 10, more preferably from 2 to 5, still more preferably from 2 to 4, and especially preferably 3. Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group.

Above all, the chain alkenyl group is more preferably a vinyl group or a propenyl group, and especially preferably a vinyl group.

Examples of the substituent in the chain alkyl group or alkenyl group represented by $R^{10l}$ include an alkoxy group, a halogen atom, a halogenated alkyl group, a hydroxyl group, a carbonyl group, a nitro group, an amino group, and the cyclic groups in the above-described $R^{101}$.

Above all, $R^{101}$ is preferably an optionally substituted cyclic group, and more preferably an optionally substituted cyclic hydrocarbon group. More specifically, a group in which one or more hydrogen atoms are eliminated from a phenyl group, a naphthyl group, or a polycycloalkane; the lactone-containing cyclic groups represented by the foregoing general formulae (a0-r-1) to (a0-r-6) and (a2-r-1), respectively; and the —$SO_2$-containing cyclic groups represented by the foregoing general formulae (a0-r-7) to (a0-r-8) and (a5-r-1) to (a5-r-2), respectively are preferable.

In the formula (b-1), $Y^{101}$ represents a single bond or an oxygen atom-containing divalent connecting group.

In the case where $Y^{101}$ is an oxygen atom-containing divalent connecting group, $Y^{101}$ may contain an atom other than an oxygen atom. Examples of the atom other than an oxygen atom include a carbon atom, a hydrogen atom, a sulfur atom, and a nitrogen atom.

Examples of the oxygen atom-containing divalent connecting group include a non-hydrocarbon-based oxygen atom-containing connecting group such as an oxygen atom (ether bond: —O—), an ester bond (—C(═O)—O—), an oxycarbonyl group (—O—C(═O)—), an amide bond (—C(═O)—NH—), a carbonyl group (—C(═O)—), and a carbonate bond (—O—C(═O)—O—); and a combination of the subject non-hydrocarbon-based oxygen atom-containing connecting group with an alkylene group. A sulfonyl group (—$SO_2$—) may be further connected to the subject combination. Examples of the combination include connecting groups represented by the following formulae (y-al-1) to (y-al-7), respectively.

[Chemical Formula 35]

(y-al-1)

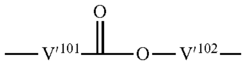

(y-al-2)

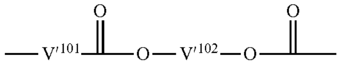

(y-al-3)

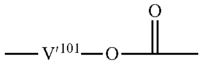

(y-al-4)

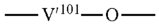

(y-al-5)

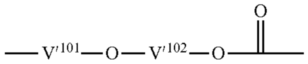

(y-al-6)

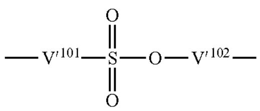

(y-al-7)

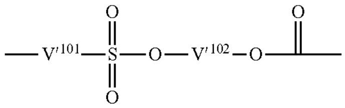

In the formulae, $V'^{101}$ represents a single bond or an alkylene group having from 1 to 5 carbon atoms; and $V'^{102}$ represents a divalent saturated hydrocarbon group having from 1 to 30 carbon atoms.

The divalent saturated hydrocarbon group represented by $V'^{102}$ is preferably an alkylene group having from 1 to 30 carbon atoms.

The alkylene group in $V'^{101}$ and $V'^{102}$ may be a linear alkylene group, or may be a branched alkylene group, and it is preferably a linear alkylene group.

Specifically, examples of the alkylene group in $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; an ethylene group [—$CH_2$—$CH_2$—]; an alkylethylene group such as —$CH(CH_3)CH_2$—, —$CH(CH_3)CH(CH_3)$—, —$C(CH_3)_2CH_2$—, and —$CH(CH_2CH_3)CH_2$—; a trimethylene group (n-propylene group) [—$CH_2CH_2CH_2$—]; an alkyltrimethylene group such as —$CH(CH_3)CH_2CH_2$— and —$CH_2CH(CH_3)CH_2$—; a tetramethylene group [—$CH_2CH_2CH_2CH_2$—]; an alkyltetramethylene group such as —$CH(CH_3)CH_2CH_2CH_2$— and —$CH_2CH(CH_3)CH_2CH_2$—; and a pentamethylene group [—$CH_2CH_2CH_2CH_2CH_2$—].

In addition, a part of the methylene groups in the above-described alkylene group in $V'^{101}$ or $V'^{102}$ may be substituted with a divalent aliphatic cyclic group having from 5 to 10 carbon atoms. The subject aliphatic cyclic group is preferably a divalent group in which one hydrogen atom is further eliminated from the cyclic aliphatic hydrocarbon group represented by $Ra'^{3}$ in the foregoing formula (a1-r-1), and more preferably a cyclohexylene group, a 1,5-adamantylene group, or a 2,6-adamantylene group.

$Y^{101}$ is preferably a divalent connecting group containing an ester bond or an ether bond, and the connecting groups represented by the formulae (y-a1-1) to (y-a1-5), respectively are preferable.

In the formula (b-1), $V^{101}$ represents a single bond, an alkylene group, or a fluorinated alkylene group. The carbon number of each of the alkylene group and the fluorinated alkylene group in $V^{101}$ is preferably from 1 to 4. Examples of the fluorinated alkylene group in $V^{101}$ include a group in which a part or all of the hydrogen atoms of the alkylene group in $V^{101}$ are substituted with a fluorine atom. Above all, $V^{101}$ is preferably a single bond or a fluorinated alkylene group having from 1 to 4 carbon atoms.

In the formula (b-1), $R^{102}$ represents a fluorine atom or a fluorinated alkyl group having from 1 to 5 carbon atoms. $R^{102}$ is preferably a fluorine atom or a perfluoroalkyl group having from 1 to 5 carbon atoms, and more preferably a fluorine atom.

As for specific examples of the anion part of the component (b-1), in the case where $Y^{101}$ is a single bond, examples thereof include a fluorinated alkyl sulfonate anion such as a trifluoromethane sulfonate anion and a perfluorobutane sulfonate anion; and in the case where $Y^{101}$ is an oxygen atom-containing divalent connecting group, examples thereof include anions represented by the following formulae (an-1) to (an-3), respectively.

[Chemical Formula 36]

(an-1)

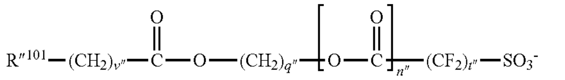

(an-2)

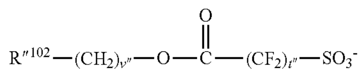

-continued (an-3)

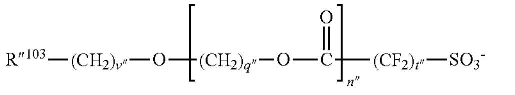

In the formulae, R"[101] represents an optionally substituted aliphatic cyclic group, a group represented by each of the foregoing formulae (r-hr-1) to (r-hr-6), or an optionally substituted chain alkyl group; R"[102] represents an optionally substituted aliphatic cyclic group, a lactone-containing cyclic group represented by each of the foregoing general formulae (a0-r-1) to (a0-r-6) and (a2-r-1), or an —$SO_2$-containing cyclic group represented by each of the foregoing general formulae (a0-r-7) to (a0-r-8) and (a5-r-1) to (a5-r-2); R"[103] represents an optionally substituted aromatic cyclic group, an optionally substituted aliphatic cyclic group, or an optionally substituted chain alkenyl group; each of v"s independently represents an integer of from 0 to 3; each of q"s independently represents an integer of from 1 to 20; t" represents an integer of from 1 to 3; and n" is 0 or 1.

The optionally substituted aliphatic cyclic group represented by each of R"[101], R"[102], and R"[103] is preferably a group exemplified above for the cyclic aliphatic hydrocarbon group in R[101]. Examples of the substituent include the same substituents as those with which the cyclic aliphatic hydrocarbon group in R[101] may be substituted.

The optionally substituted aromatic cyclic group in R"[103] is preferably the group exemplified above for the aromatic hydrocarbon group in the cyclic hydrocarbon group in R[101]. Examples of the substituent include the same substituents as those with which the aromatic hydrocarbon group in R[101] may be substituted.

The optionally substituted chain alkyl group in R"[101] is preferably the group exemplified above for the chain alkyl group in R[101]. The optionally substituted chain alkenyl group in R"[103] is preferably the group exemplified above for the chain alkenyl group in R[101].

Anion Part of Component (b-2):

In the formula (b-2), each of R[104] and R[105] independently represents an optionally substituted cyclic group, an optionally substituted chain alkyl group, or an optionally substituted chain alkenyl group, and examples thereof include the same groups as those in R[101] in the formula (b-1). However, R[104] and R[105] may be bonded to each other to form a ring.

Each of R[104] and R[105] is preferably an optionally substituted chain alkyl group, and more preferably a linear or branched alkyl group or a linear or branched fluorinated alkyl group.

The carbon number of the chain alkyl group is preferably from 1 to 10, more preferably from 1 to 7, and still more preferably from 1 to 3. The carbon number of the chain alkyl group represented by each of R[104] and R[105] is preferably smaller within the above-described range of the carbon number for reasons such as satisfactory solubility in a resist solvent. In addition, in the chain alkyl group represented by each of R[104] and R[105], the number of the hydrogen atoms substituted with a fluorine atom is preferably larger because the intensity of the acid is higher, and the transparency to a high energy light or electron beam of not more than 200 nm is enhanced. A proportion of the fluorine atom in the chain alkyl group, namely a fluorination rate, is preferably from 70 to 100%, and more preferably from 90 to 100%. A perfluoroalkyl group in which all of the hydrogen atoms are substituted with a fluorine atom is the most preferable.

In the formula (b-2), each of V[102] and V[103] independently represents a single bond, an alkylene group, or a fluorinated alkylene group, and examples thereof include the same groups as those in V[101] in the formula (b-1).

In the formula (b-2), each of L[101] to L[102] independently represents a single bond or an oxygen atom.

Anion Part of Component (b-3):

In the formula (b-3), each of R[106] to R[108] independently represents an optionally substituted cyclic group, an optionally substituted chain alkyl group, or an optionally substituted chain alkenyl group, and examples thereof include the same groups as those in R[101] in the formula (b-1).

Each of L[103] to L[105] independently represents a single bond, —CO—, or —$SO_2$—.

{Cation Part}

In the formulae (b-1), (b-2), and (b-3), $M'^{m+}$ represents an m-valent onium cation, and suitably, examples thereof include a sulfonium cation and an iodonium cation. Organic cations represented by the following general formulae (ca-1) to (ca-4), respectively are especially preferable.

[Chemical Formula 37]

(ca-1)

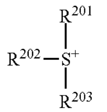

(ca-2)

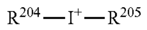

(ca-3)

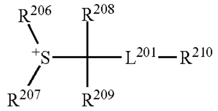

(ca-4)

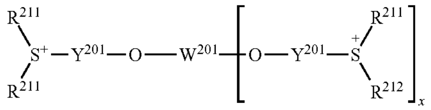

In the formulae, each of R[201] to R[207] and R[211] to R[212] independently represents an optionally substituted aryl group, alkyl group or alkenyl group, and R[201] to R[203], R[206] to R[207], or R[211] to R[212] may be bonded to each other to form a ring together with a sulfur atom in each formula; each of R[208] to R[209] independently represents a hydrogen atom or an alkyl group having from 1 to 5 carbon atoms; R[210] represents an optionally substituted aryl group, alkyl group or alkenyl group, or an —$SO_2$-containing cyclic group; L[201] represents —C(═O)— or —C(═O)—O—; each of Y[201]s independently represents an arylene group, an alkylene group, or an alkenylene group; x is 1 or 2; and W[201] represents an (x+1)-valent connecting group.

Examples of the aryl group in R[201] to R[207] and R[211] to R[212] include an unsubstituted aryl group having from 6 to 20 carbon atoms, and the aryl group is preferably a phenyl group or a naphthyl group.

The alkyl group in R[201] to R[207] and R[211] to R[212] is preferably a chain or cyclic alkyl group having from 1 to 30 carbon atoms.

The alkenyl group in R[201] to R[207] and R[211] to R[212] is preferably an alkenyl group having from 2 to 10 carbon atoms.

Examples of the substituent which each of R[201] to R[207] and R[211] to R[212] may have include an alkyl group, a halogen atom, a halogenated alkyl group, a carbonyl group, a cyano group, an amino group, an aryl group, and groups represented by the following formulae (ca-r-1) to (ca-r-7), respectively.

[Chemical Formula 38]

[ca-r-1]

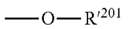

[ca-r-2]

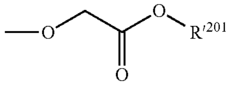

[ca-r-3]

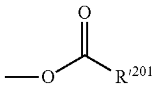

[ca-r-4]

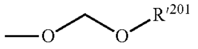

[ca-r-5]

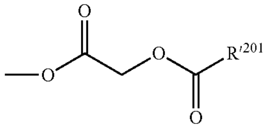

[ca-r-6]

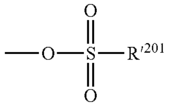

[ca-r-7]

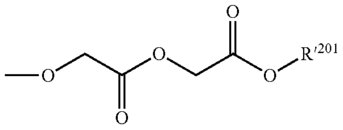

In the formulae, each of $R'^{201}$s independently represents a hydrogen atom or an optionally substituted cyclic group, chain alkyl group or chain alkenyl group.

Examples of the optionally substituted cyclic group, the optionally substituted chain alkyl group, or the optionally substituted chain alkenyl group represented by $R'^{201}$ include the same groups as those for $R^{101}$ in the formula (b-1) as described later. Besides, examples of the optionally substituted cyclic group or the optionally substituted chain alkyl group include the same acid dissociable groups as those represented by the foregoing formula (a1-r-2).

In the case where $R^{201}$ to $R^{203}$, $R^{206}$ to $R^{207}$, or $R^{211}$ to $R^{212}$ may be bonded to each other to form a ring together with a sulfur atom in each formula, they may be bonded to each other via a hetero atom such as a sulfur atom, an oxygen atom, and a nitrogen atom, or a functional group such as a carbonyl group, —SO—, —$SO_2$—, —$SO_3$—, —COO—, —CONH—, and —N($R_N$)— ($R_N$ represents an alkyl group having from 1 to 5 carbon atoms). As for the ring to be formed, one ring containing a sulfur atom in the formula in a ring skeleton thereof is preferably a 3- to 10-membered ring, and especially preferably a 5- to 7-membered ring containing the sulfur atom. Specific examples of the ring to be formed include a thiophene ring, a thiazole ring, a benzothiophene ring, a thianthrene ring, a dibenzothiophene ring, a 9H-thioxanthene ring, a thioxanthone ring, a phenoxathiin group, a tetrahydrothiophenium ring, and a tetrahydrothiopyranium ring.

Each of $R^{208}$ to $R^{209}$ independently represents a hydrogen atom or an alkyl group having from 1 to 5 carbon atoms. Of these, a hydrogen atom or an alkyl group having from 1 to 3 carbon atoms is preferable. In the case where each of $R^{208}$ to $R^{209}$ is an alkyl group, they may be bonded to each other to form a ring.

$R^{210}$ represents an optionally substituted aryl group, an optionally substituted alkyl group, an optionally substituted alkenyl group, or an optionally substituted —$SO_2$-containing cyclic group.

Examples of the aryl group in $R^{210}$ include an unsubstituted aryl group having from 6 to 20 carbon atoms. Above all, a phenyl group or a naphthyl group is preferable.

Examples of the alkyl group in $R^{210}$ include a chain or cyclic alkyl group. Above all, an alkyl group having from 1 to 30 carbon atoms is preferable.

The carbon number of the alkenyl group in $R^{210}$ is preferably from 2 to 10.

Examples of the optionally substituted —$SO_2$-containing cyclic group in $R^{210}$ include the same —$SO_2$-containing cyclic groups as those as exemplified above for the "—$SO_2$-containing cyclic group". Above all, a group represented by the general formula (a0-r-7) is preferable.

Each of $Y^{201}$s independently represents an arylene group, an alkylene group, or an alkenylene group.

Examples of the arylene group in $Y^{201}$ include a group in which one hydrogen atom is eliminated from an aryl group exemplified for the aromatic hydrocarbon group in $R^{101}$ in the formula (b-1) as described later.

Examples of the alkylene group and the alkenylene group in $Y^{201}$ include the same aliphatic hydrocarbon groups as those in the divalent hydrocarbon group in $Va^1$ in the foregoing general formula (a1-1).

In the foregoing formula (ca-4), x is 1 or 2.

$W^{201}$ represents an (x+1)-valent (i.e., divalent or trivalent) connecting group.

The divalent connecting group in $W^{201}$ is preferably an optionally substituted divalent hydrocarbon group, and examples thereof include the same divalent hydrocarbon groups as those exemplified for $Ya^{21}$ in the foregoing general formula (a2-1). The divalent connecting group in $W^{201}$ may be linear, branched, or cyclic, and it is preferably cyclic. Above all, a group in which two carbonyl groups are combined at the both ends of an arylene group is preferable. Examples of the arylene group include a phenylene group and a naphthylene group, with a phenylene group being especially preferable.

Examples of the trivalent connecting group in $W^{201}$ include a group in which one hydrogen atom is eliminated from the above-described divalent connecting group in $W^{201}$ and a group in which the above-described divalent connecting group is further bonded to the above-described divalent connecting group. The trivalent connecting group in $W^{201}$ is preferably a group in which two carbonyl groups are bonded to an arylene group.

Specifically, suitable examples of the cation represented by the formula (ca-1) include cations represented by the following formulae (ca-1-1) to (ca-1-67), respectively.

[Chemical Formula 39]

(ca-1-1)

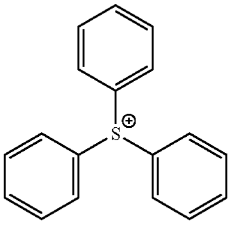

-continued
(ca_1-2)
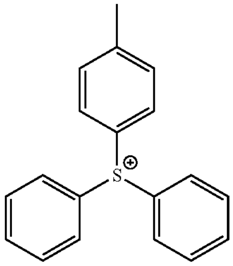
(ca-1-13)
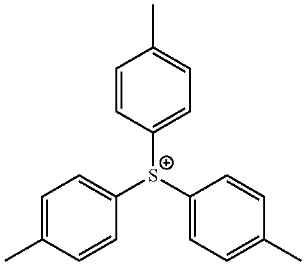
(ca-1-4)
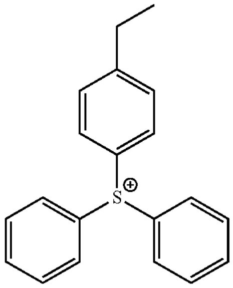
(ca-1-5)
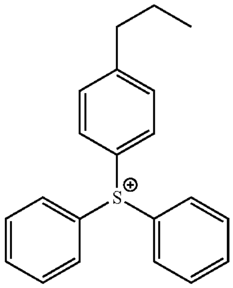
(ca-1-6)
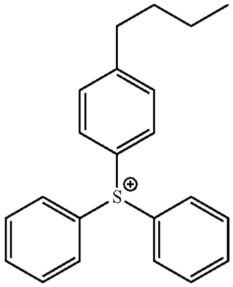
-continued
(ca-1-7)
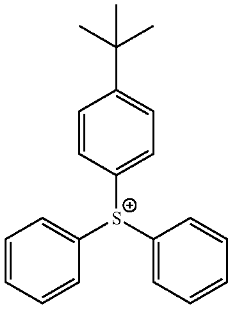
(ca-1-8)
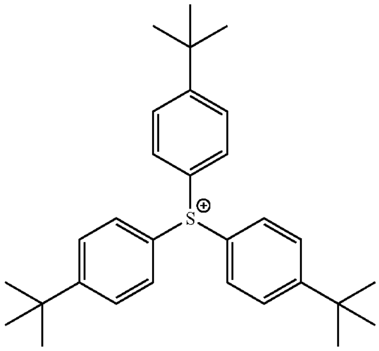
(ca-1-9)
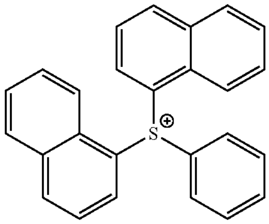
(ca-1-10)
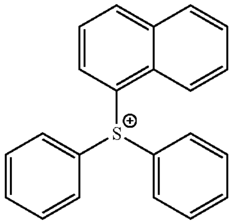
(ca-1-11)
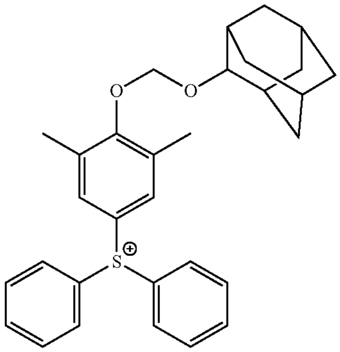

-continued
(ca-1-12)
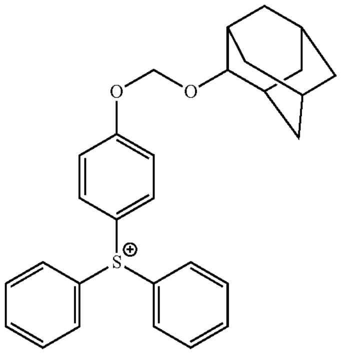
(ca-1-13)
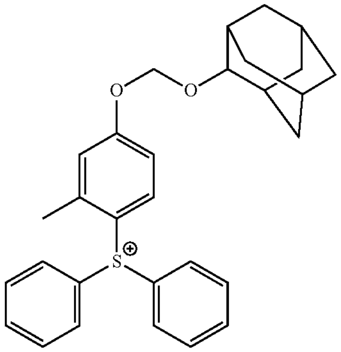
(ca-1-14)
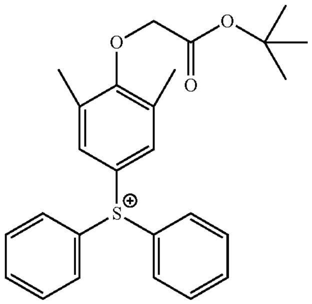
(ca-1-15)
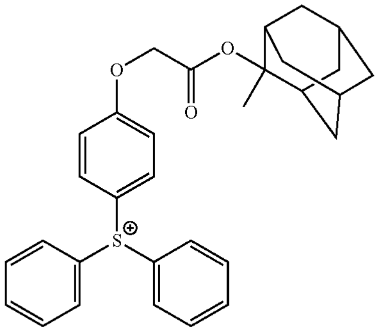
-continued
(ca-1-16)
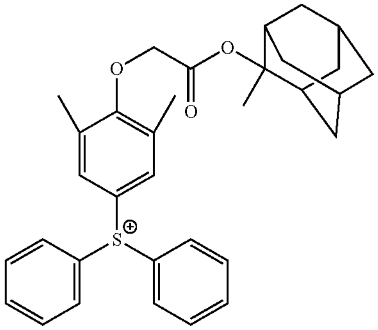
[Chemical Formula 40]
(ca-1-17)
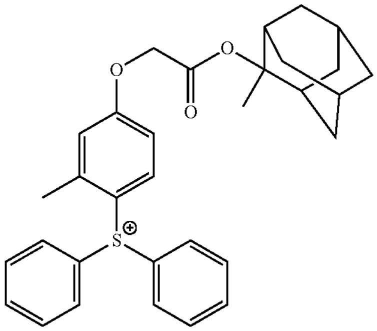
(ca-1-18)
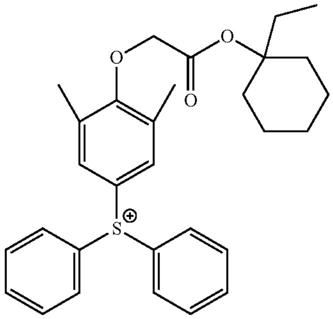
(ca-1-19)
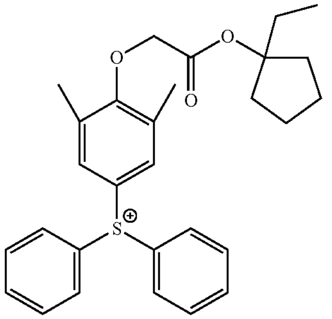

-continued
(ca-1-20)
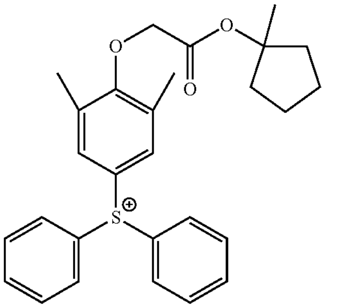
(ca-1-21)
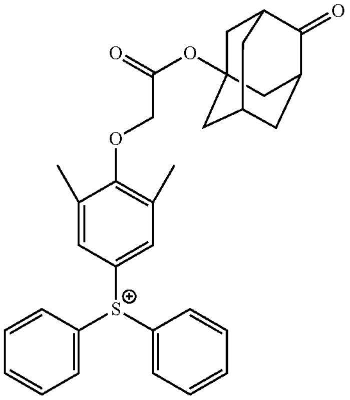
(ca-1-22)
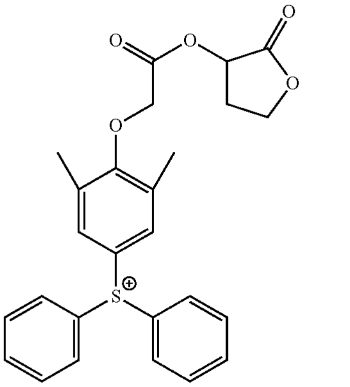
(ca-1-23)
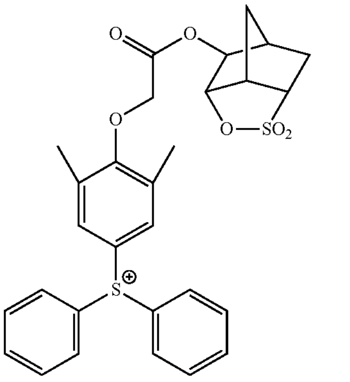
-continued
(ca-1-24)
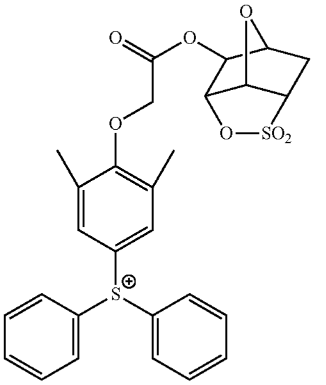
(ca-1-25)
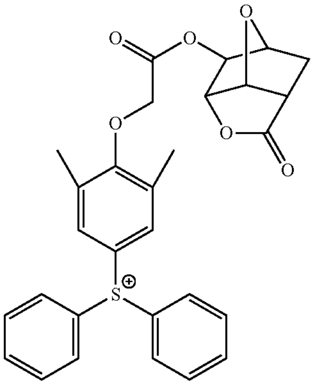
(ca-1-26)
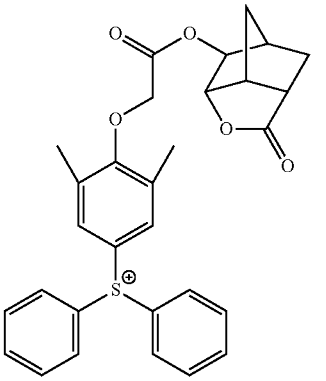
(ca-1-27)
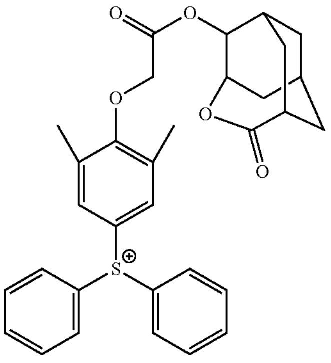

-continued
(ca-1-28)
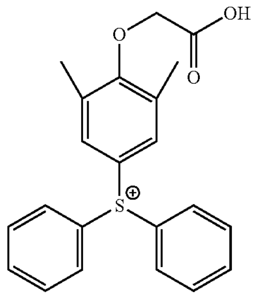
(ca-1-29)
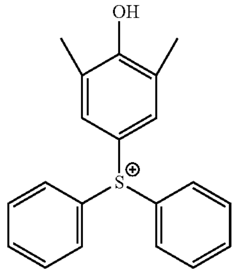
(ca-1-30)
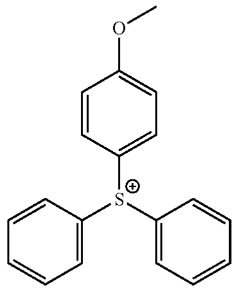
(ca-1-31)
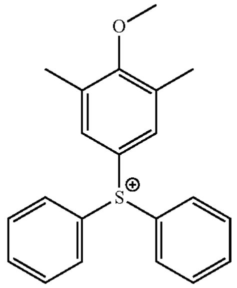
(ca-1-32)
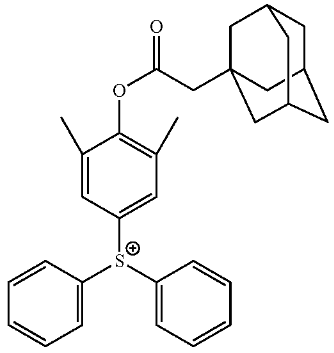
-continued
(ca-1-33)
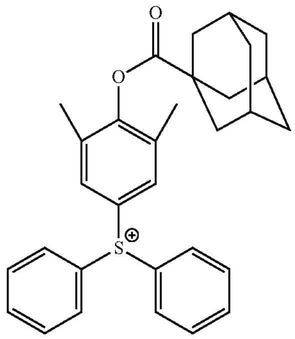
[Chemical Formula 41]
(ca-1-34)
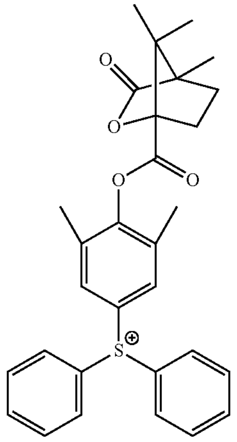
(ca-1-35)
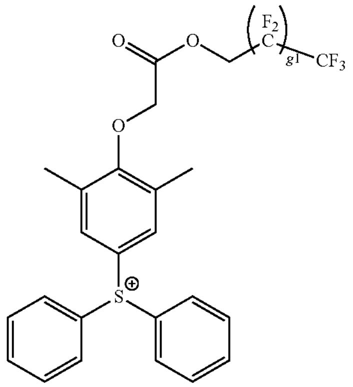
(ca-1-36)
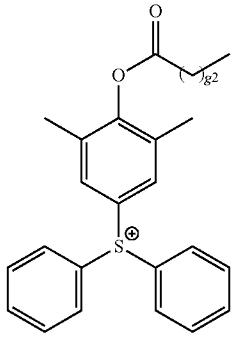

-continued
(ca-1-37)
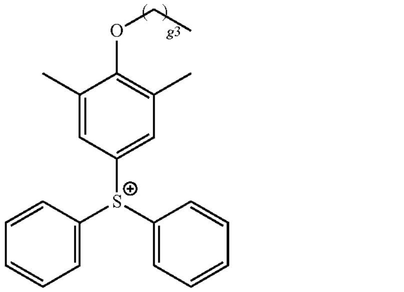
(ca-1-38)
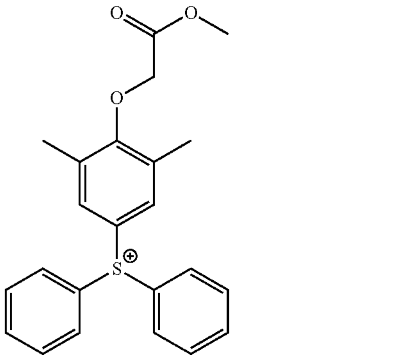
(ca-1-39)
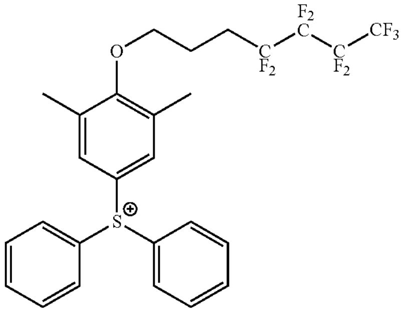
(ca-1-40)
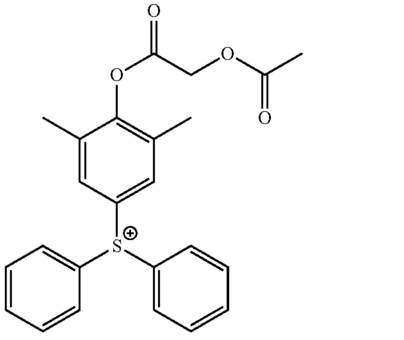
-continued
(ca-1-41)
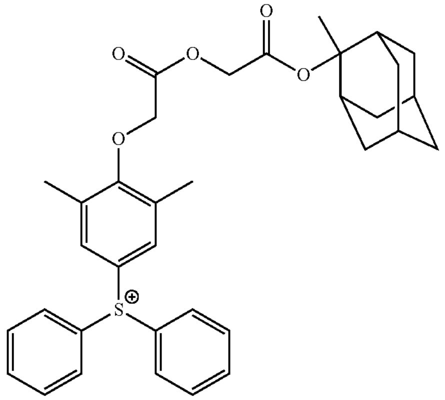
(ca-1-42)
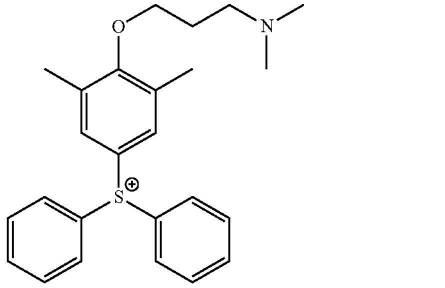
(ca-1-43)
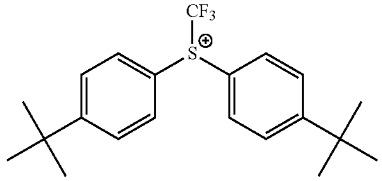
(ca-1-44)
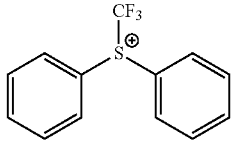
(ca-1-45)
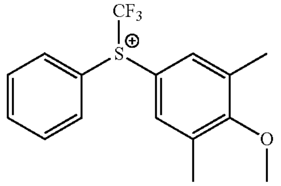
(ca-1-46)
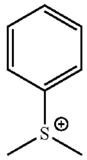
(ca-1-47)
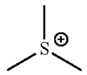

-continued
(ca-1-48)
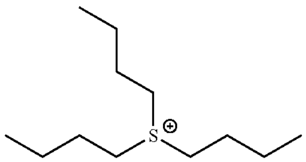
(ca-1-49)
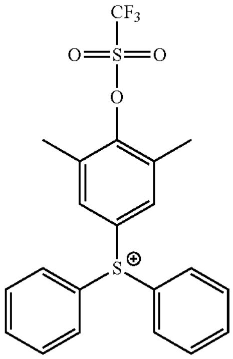
(ca-1-50)
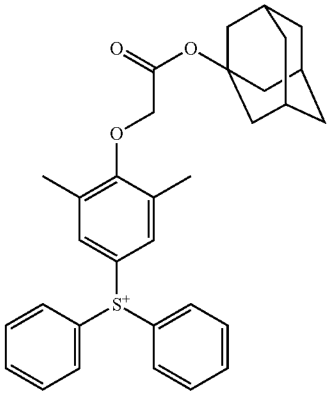
(ca-1-51)
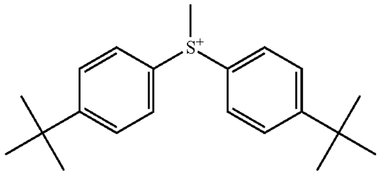
In the formulae, each of g1, g2, and g3 represents a repeating number; g1 represents an integer of from 1 to 5; g2 represents an integer of from 0 to 20; and g3 represents an integer of from 0 to 20.
[Chemical Formula 42]
(ca-1-52)
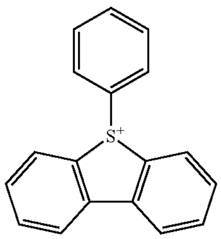
-continued
(ca-1-53)
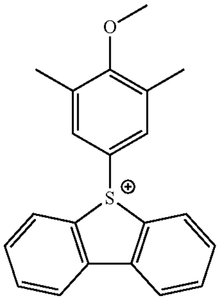
(ca-1-54)
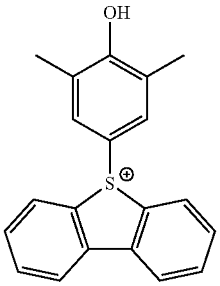
(ca-1-55)
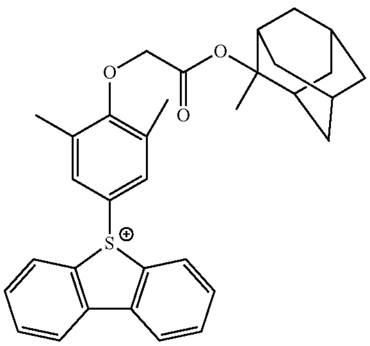
(ca-1-56)
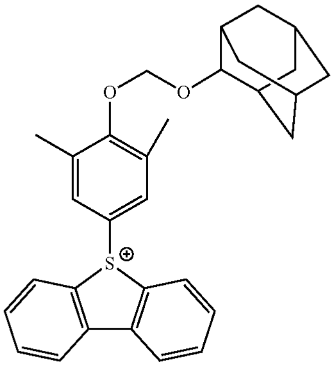
(ca-1-57)
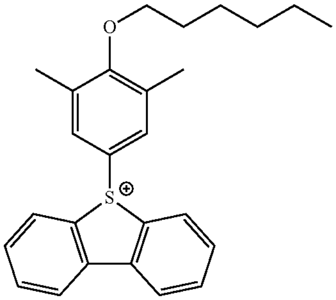

(ca-1-58)
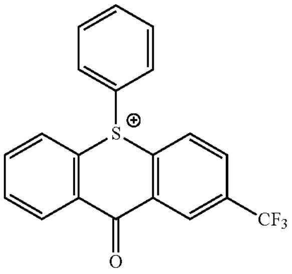
(ca-1-59)
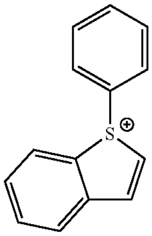
(ca-1-60)
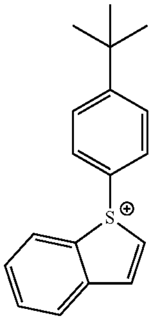
(ca-1-61)
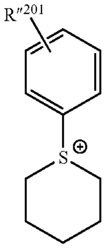
(ca-1-62)
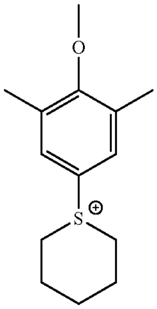
(ca-1-63)
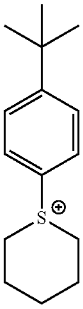
(ca-1-64)
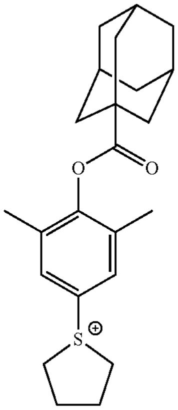
(ca-1-65)
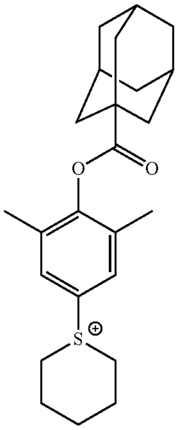
(ca-1-66)
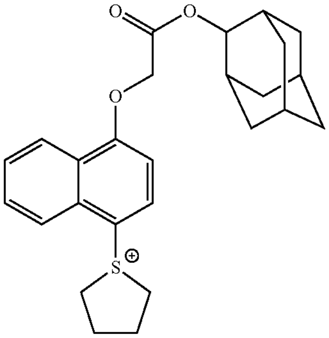

-continued (ca-1-67)

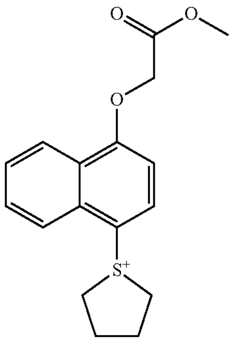

In the formulae, $R''^{201}$ represents a hydrogen atom or a substituent. Examples of the substituent include the same substituents as those exemplified above for the substituent which each of $R^{201}$ to $R^{207}$ and $R^{211}$ to $R^{212}$ may have.

Specifically, suitable examples of the cation represented by the foregoing formula (ca-2) include a diphenyl iodonium cation and a bis(4-tert-butylphenyl)iodonium cation.

Specifically, suitable examples of the cation represented by the foregoing formula (ca-3) include cations represented by the following formulae (ca-3-1) to (ca-3-6), respectively.

[Chemical Formula 43]

(ca-3-1)

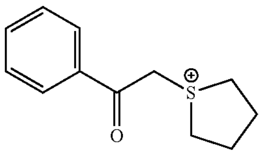

(ca-3-2)

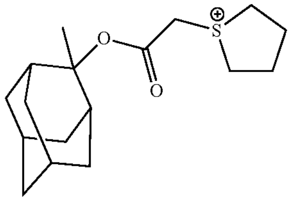

(ca-3-3)

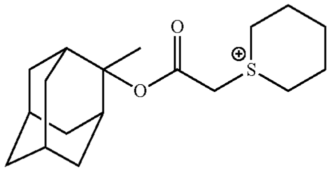

(ca-3-4)

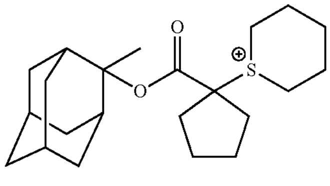

(ca-3-5)

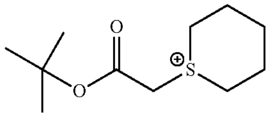

-continued (ca-3-6)

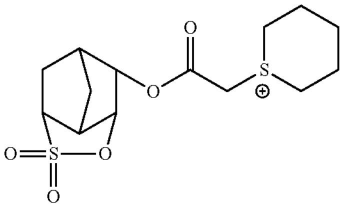

Specifically, suitable examples of the cation represented by the foregoing formula (ca-4) include cations represented by the following formulae (ca-4-1) to (ca-4-2), respectively.

[Chemical Formula 44]

(ca-4-1)

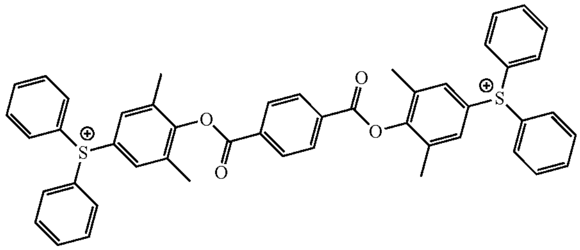

(ca-4-2)

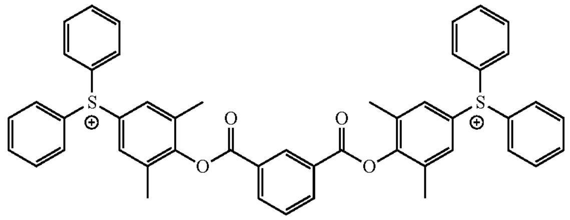

Above all, the cation part $[(M'^{m+})_{1/m}]$ is preferably the cation represented by the general formula (ca-1), and more preferably the cation represented by each of the formulae (ca-1-1) to (ca-1-67).

In the component (B), the above-described acid generator may be used solely, or may be used in combination of two or more kinds thereof.

In the case where the resist composition of the present embodiment contains the component (B), the content of the component (B) is preferably from 0.5 to 60 parts by mass, more preferably from 1 to 50 parts by mass, and still more preferably from 1 to 40 parts by mass based on 100 parts by mass of the component (A). By allowing the content of the component (B) to fall within the foregoing range, the pattern formation is sufficiently performed. In addition, on the occasion of dissolving the respective components of the resist composition in an organic solvent, a uniform solution is obtained, and the storage stability becomes satisfactory, and hence, such is preferable.

[Component (D)]

The resist composition of the present embodiment may further contain, in addition to the component (A), or in addition to the component (A) and the component (B), an acid diffusion controller component (hereinafter referred to as "component (D)").

The component (D) is a compound that acts as a quencher (acid diffusion controller) for trapping an acid generated from the above-described component (B) or the like upon exposure.

The component (D) may be a photodegradable base (D1) which is decomposed upon exposure to lose the acid diffusion controllability (hereinafter referred to as "component (D1)"), or may be a nitrogen-containing organic compound (D2) which is not corresponding to the component (D1) (hereinafter referred to as "component (D2)").

Component (D1)

When a resist composition containing the component (D1) is formed, on the occasion of forming a resist pattern, the contrast between an exposed area and an unexposed area can be enhanced.

The component (D1) is not particularly limited so long as it is a compound which is decomposed upon exposure to lose the acid diffusion controllability, and it is preferably at least one compound selected from the group consisting of a compound represented by the following general formula (d1-1) (hereinafter referred to as "component (d1-1)"), a compound represented by the following general formula (d1-2) (hereinafter referred to as "component (d1-2)"), and a compound represented by the following general formula (d1-3) (hereinafter referred to as "component (d1-3)".

In an exposed area, each of the components (d1-1) to (d1-3) is decomposed to lose the acid diffusion controllability (basicity), and therefore, it does not act as a quencher, whereas in an unexposed area, each of the components (d1-1) to (d1-3) acts as a quencher.

[Chemical Formula 45]

(d1-1)

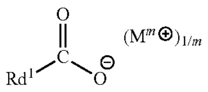

(d1-2)

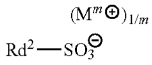

(d1-3)

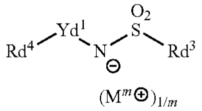

In the formulae, each of $Rd^1$ to $Rd^4$ represents an optionally substituted cyclic group, an optionally substituted chain alkyl group, or an optionally substituted chain alkenyl group, provided that a fluorine atom is not bonded to the carbon atom adjacent to the S atom in $Rd^2$ in the formula (d1-2); $Yd^1$ is a single bond or a divalent connecting groups; m represents an integer of 1 or more; and each of $M^{m+}$s independently represents an m-valent organic cation.

{Component (d1-1)}

Anion Part:

In the formula (d1-1), $Rd^1$ represents an optionally substituted cyclic group, an optionally substituted chain alkyl group, or an optionally substituted chain alkenyl group, and examples thereof include the same groups as those for $R^{101}$ in the foregoing formula (b-1).

Above all, $Rd^1$ is preferably an optionally substituted aromatic hydrocarbon group, an optionally substituted aliphatic cyclic group, or an optionally substituted chain alkyl group. The substituent which such a group may have is preferably a hydroxyl group, a fluorine atom, or a fluorinated alkyl group.

The above-described aromatic hydrocarbon group is more preferably a phenyl group or a naphthyl group.

The above-described aliphatic cyclic group is more preferably a group in which one or more hydrogen atoms are eliminated from a polycycloalkane such as adamantane, norbornane, isobornane, tricyclodecane, and tetracyclododecane.

The above-described chain alkyl group preferably has the carbon number of from 1 to 10. Specifically, examples thereof include a linear alkyl group such as a methyl group, an ethyl group, a propyl group, a butyl group, a pentyl group, a hexyl group, a heptyl group, an octyl group, a nonyl group, and a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

In the case where the above-described chain alkyl group is a fluorinated alkyl group having, as a substituent, a fluorine atom or a fluorinated alkyl group, the carbon number of the fluorinated alkyl group is preferably from 1 to 11, more preferably from 1 to 8, and still more preferably from 1 to 4. The fluorinated alkyl group may contain an atom other than a fluorine atom. Examples of the atom other than a fluorine atom include an oxygen atom, a carbon atom, a hydrogen atom, a sulfur atom, and a nitrogen atom.

$Rd^1$ is preferably a fluorinated alkyl group in which a part or all of the hydrogen atoms constituting the linear alkyl group are substituted with a fluorine atom, and more preferably a fluorinated alkyl group (linear perfluoroalkyl group) in which all of the hydrogen atoms constituting the linear alkyl group are substituted with a fluorine atom.

Preferred specific examples of the anion part of the component (d1-1) are given below.

[Chemical Formula 46]

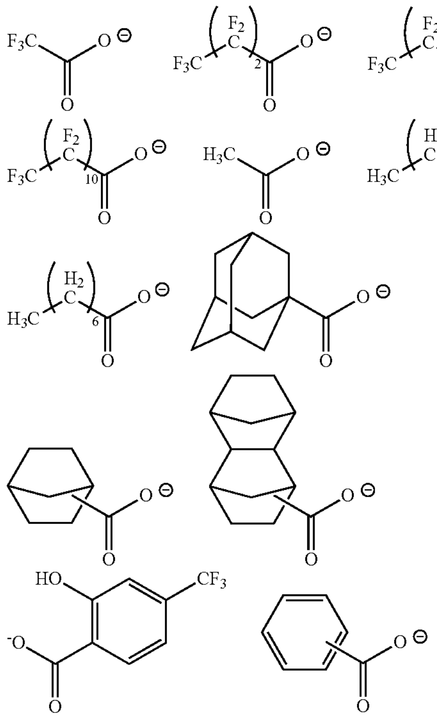

-continued

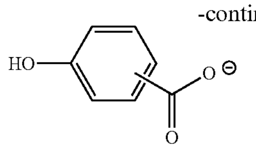

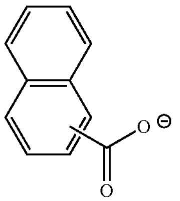

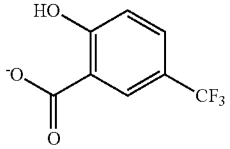

Cation Part:

In the formula (d1-1), $M^{m+}$ represents an m-valent organic cation.

Suitable examples of the organic cation represented by $M^{m+}$ include the same organic cations as those represented by the foregoing general formulae (ca-1) to (ca-4), respectively. Of these, the cations represented by the foregoing formulae (ca-1-1) to (ca-1-67), respectively are more preferable.

The component (d1-1) may be used solely, or may be used in combination of two or more kinds thereof.

{Component (d1-2)}

Anion Part:

In the formula (d1-2), $Rd^2$ represents an optionally substituted cyclic group, an optionally substituted chain alkyl group, or an optionally substituted chain alkenyl group, and examples thereof include the same groups as those for $R^{101}$ in the foregoing formula (b-1).

However, a fluorine atom is not bonded to the carbon atom adjacent to the S atom in $Rd^2$ (substitution with fluorine is not made). According to this, the anion of the component (d1-2) becomes an adequate weak acid anion, so that the quenching ability as the component (D) is enhanced.

$Rd^2$ is preferably an optionally substituted chain alkyl group or an optionally substituted aliphatic cyclic group. The carbon number of the chain alkyl group is preferably from 1 to 10, and more preferably from 3 to 10. The aliphatic cyclic group is more preferably a group in which one or more hydrogen atoms are eliminated from adamantane, norbornane, isobornane, tricyclodecane, tetracyclododecane, or the like (the group may have a substituent); or a group in which one or more hydrogen atoms are eliminated from camphor or the like.

The hydrocarbon group represented by $Rd^2$ may have a substituent. Examples of the substituent include the same substituents as those exemplified above for the substituent which the hydrocarbon group (i.e., the aromatic hydrocarbon group or the aliphatic hydrocarbon group) in $R^1$ in the foregoing formula (d1-1) may have.

Preferred specific examples of the anion part of the component (d1-2) are given below.

[Chemical Formula 47]

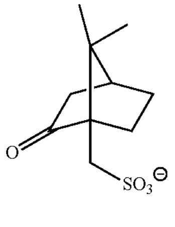

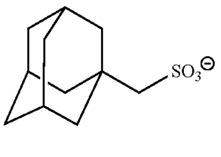

-continued

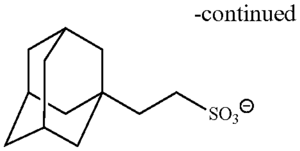

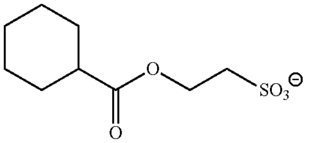

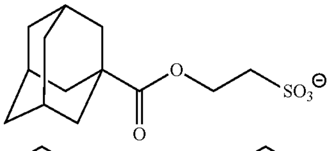

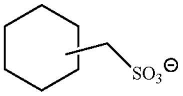

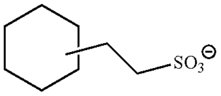

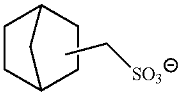

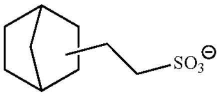

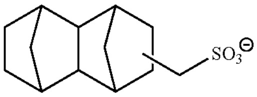

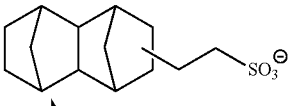

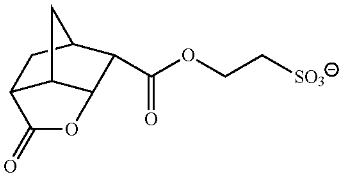

$H_3C-SO_3^{\ominus}$

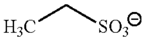

$C_aH_{2a+1}SO_3^-$ (a = 3 ~ 10)

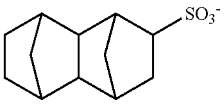

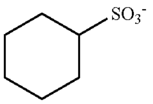

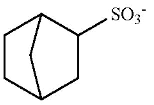

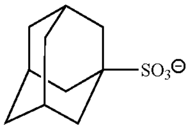

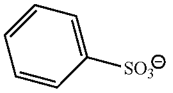

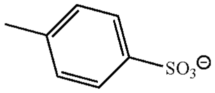

Cation Part:

In the formula (d1-2), $M^{m+}$ represents an m-valent organic cation and is the same as $M^{m+}$ in the foregoing formula (d1-1).

The component (d1-2) may be used solely, or may be used in combination of two or more kinds thereof.

{Component (d1-3)}

Anion Part:

In the formula (d1-3), $Rd^3$ represents an optionally substituted cyclic group, an optionally substituted chain alkyl group, or an optionally substituted chain alkenyl group, and examples thereof include the same groups as those for $R^{101}$ in the foregoing formula (b-1). $Rd^3$ is preferably a fluorine atom-containing cyclic group, a chain alkyl group, or a chain alkenyl group. Above all, $Rd^3$ is more preferably a fluorinated alkyl group, and still more preferably the same fluorinated alkyl group as that described above for $Rd^1$.

In the formula (d1-3), $Rd^4$ represents an optionally substituted cyclic group, an optionally substituted chain alkyl group, or an optionally substituted chain alkenyl group, and examples thereof include the same groups as those for $R^{101}$ in the foregoing formula (b-1).

Above all, $Rd^4$ is preferably an optionally substituted alkyl group, alkoxy group, alkenyl group or cyclic group.

The alkyl group in $Rd^4$ is preferably a linear or branched alkyl group having from 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. A part of the hydrogen atoms of the alkyl group represented by $Rd^4$ may be substituted with a hydroxyl group, a cyano group, or the like.

The alkoxy group in $Rd^4$ is preferably an alkoxy group having from 1 to 5 carbon atoms. Specifically, examples of the alkoxy group having from 1 to 5 carbon atoms include a methoxy group, an ethoxy group, an n-propoxy group, an isopropoxy group, an n-butoxy group, and a tert-butoxy group. Above all, a methoxy group or an ethoxy group is preferable.

Examples of the alkenyl group in $Rd^4$ include the same alkenyl groups as those for $R^{101}$ in the foregoing formula (b-1). Above all, a vinyl group, a propenyl group (allyl group), a 1-methylpropenyl group, or a 2-methylpropenyl group is preferable. Such a group may further have, as a substituent, an alkyl group having from 1 to 5 carbon atoms or a halogenated alkyl group having from 1 to 5 carbon atoms.

Examples of the cyclic group in $Rd^4$ include the same cyclic groups as those for $R^{101}$ in the foregoing formula (b-1). Above all, an alicyclic group in which one or more hydrogen atoms are eliminated from a cycloalkane such as cyclopentane, cyclohexane, adamantane, norbornane, isobornane, tricyclodecane, and tetracyclododecane; or an aromatic group such as a phenyl group and a naphthyl group is preferable. In the case where $Rd^4$ is an alicyclic group, when the resist composition is well dissolved in an organic solvent, lithography properties become satisfactory. In addition, in the case where $Rd^4$ is an aromatic group, in the lithography with EUV or the like as an exposure light source, the resist composition is excellent in terms of light absorption efficiency, and the sensitivity or lithography properties become satisfactory.

In the formula (d1-3), $Yd^1$ represents a single bond or a divalent connecting group.

Though the divalent connecting group in $Yd^1$ is not particularly limited, examples thereof include an optionally substituted divalent hydrocarbon group (e.g., an aliphatic hydrocarbon group or an aromatic hydrocarbon group), and a hetero atom-containing divalent connecting group. Examples of these groups include the same groups as those exemplified above for the optionally substituted divalent hydrocarbon group and the hetero atom-containing divalent connecting group regarding the divalent connecting group represented by $Ya^{21}$ in the foregoing formula (a2-1).

$Yd^1$ is preferably a carbonyl group, an ester bond, an amide bond, an alkylene group, or a combination thereof. The alkylene group is more preferably a linear or branched alkylene group, and still more preferably a methylene group or an ethylene group.

Preferred specific examples of the anion part of the component (d1-3) are given below.

[Chemical Formula 48]

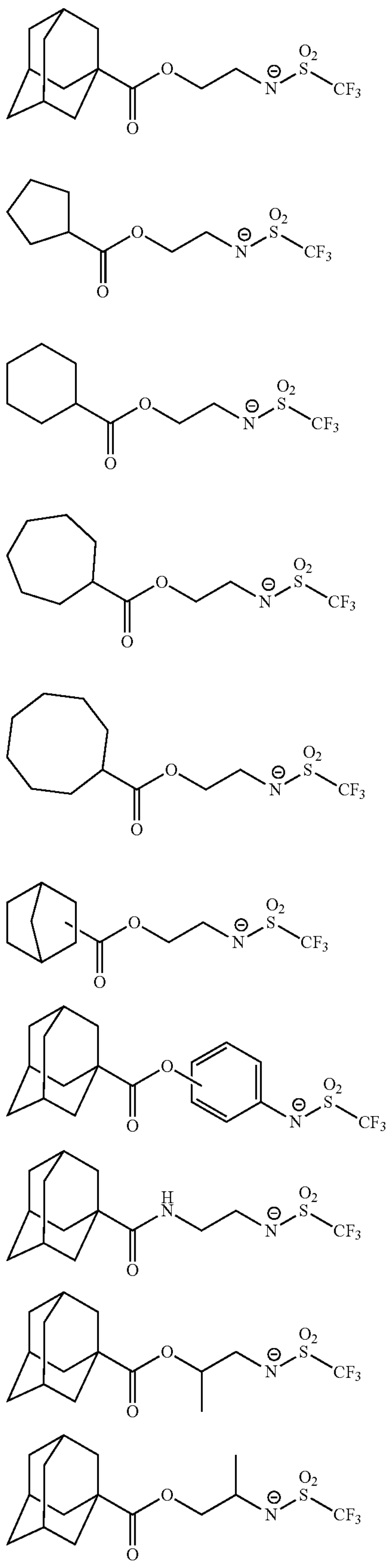

-continued

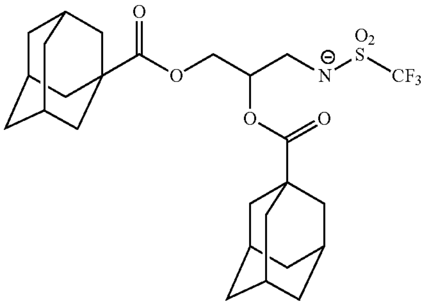

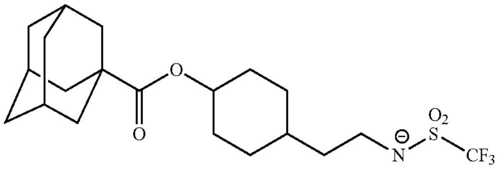

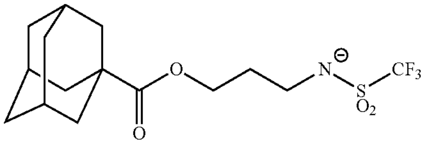

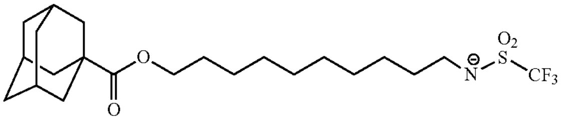

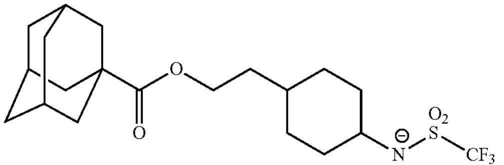

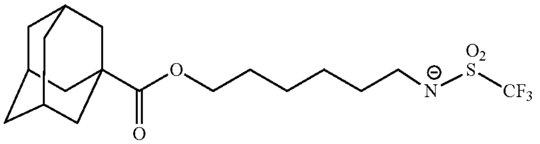

[Chemical Formula 49]

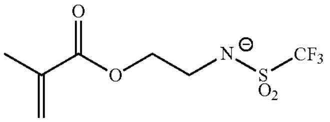

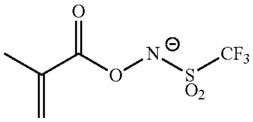

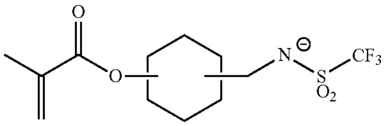

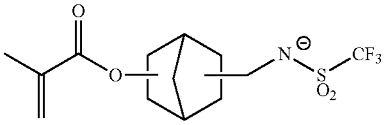

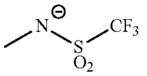

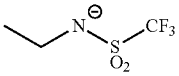

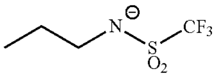

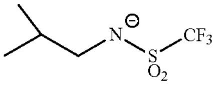

-continued

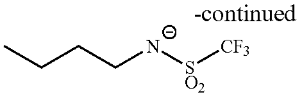

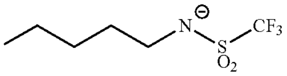

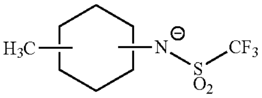

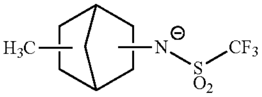

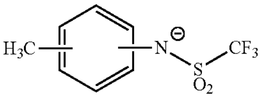

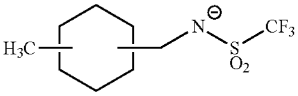

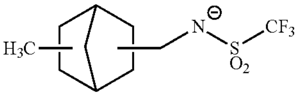

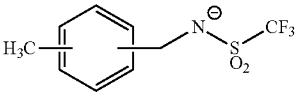

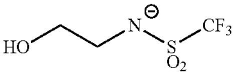

Cation Part:

In the formula (d1-3), $M^{m+}$ represents an m-valent organic cation and is the same as $M^{m+}$ in the foregoing formula (d1-1).

The component (d1-3) may be used solely, or may be used in combination of two or more kinds thereof.

As for the component (D1), only one kind of the above-described (d1-1) to (d1-3) may be used, or a combination of two or more kinds thereof may be used.

The content of the component (D1) is preferably from 0.5 to 10 parts by mass, more preferably from 0.5 to 8 parts by mass, and still more preferably from 1 to 8 parts by mass based on 100 parts by mass of the component (A).

When the content of the component (D1) is the preferred lower limit value or more, especially satisfactory lithography properties and resist pattern shape are obtained. On the other hand, when the content of the component (D1) is not more than the upper limit value, the sensitivity can be kept well, and excellent throughput is revealed.

(Manufacturing Method of Component (D1))

A manufacturing method of each of the above-described component (d1-1) and component (d1-2) is not particularly limited, and each of the component (d1-1) and the component (d1-2) can be manufactured by a known method.

In addition, a manufacturing method of the component (d1-3) is not particularly limited, and the component (d1-3) is manufactured in the same method as a method described in, for example, US-A-2012-0149916.

Component (D2)

As the acid diffusion controller component, a nitrogen-containing organic compound component (hereinafter referred to as "component (D2)") which is not corresponding to the above-described component (D1) may be contained.

The component (D2) is not particularly limited so long as it acts as an acid diffusion controller and is not corresponding to the component (D1), and any known compound may be arbitrarily used. Above all, an aliphatic amine, in particular, a secondary aliphatic amine or a tertiary aliphatic amine, is preferable.

The aliphatic amine refers to an amine having one or more aliphatic groups, and the carbon number of the aliphatic group is preferably from 1 to 12.

Examples of the aliphatic amine include an amine in which at least one of hydrogen atoms of ammonia $NH_3$ is substituted with an alkyl group or a hydroxyalkyl group each having not more than 12 carbon atoms (i.e., an alkylamine or an alkyl alcoholamine) and a cyclic amine.

Specific examples of the alkylamine and the alkyl alcoholamine include a monoalkylamine such as n-hexylamine, n-heptylamine, n-octylamine, n-nonylamine, and n-decylamine; a dialkylamine such as diethylamine, di-n-propylamine, di-n-heptylamine, di-n-octylamine, and dicyclohexylamine; a trialkylamine such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and an alkyl alcoholamine such as diethanolamine, triethanolamine, diisopropanolamine, triisopropanolamine, di-n-octanolamine, and tri-n-octanolamine. Of these, a trialkylamine having from 5 to 10 carbon atoms is more preferable, and tri-n-pentylamine or tri-n-octylamine is especially preferable.

Examples of the cyclic amine include a heterocyclic compound containing a nitrogen atom as a hetero atom. The heterocyclic compound may be a monocyclic compound (aliphatic monocyclic amine), or may be a polycyclic compound (aliphatic polycyclic amine).

Specifically, examples of the aliphatic monocyclic amine include piperidine and piperazine.

The aliphatic polycyclic amine is preferably an aliphatic polycyclic amine having from 6 to 10 carbon atoms. Specifically, examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate, with triethanolamine triacetate being preferable.

In addition, an aromatic amine may also be used as the component (D2).

Examples of the aromatic amine include 4-dimethylaminopyridine, pyrrole, indole, pyrazole, imidazole, and derivatives thereof, as well as tribenzylamine, 2,6-diisopropylaniline, and N-tert-butoxycarbonylpyrrolidine.

The component (D2) may be used solely, or may be used in combination of two or more kinds thereof.

The component (D2) is generally used in an amount ranging from 0.01 to 5 parts by mass based on 100 parts by mass of the component (A). When the amount of the component (D2) falls within the foregoing range, the shape of the resist pattern, the post exposure stability of the latent image formed by the pattern-wise exposure of the resist layer, and the like are enhanced.

[Component (E)]

For the purposes of preventing the deterioration in sensitivity and enhancing the shape of the resist pattern and the post exposure stability of the latent image formed by the pattern-wise exposure of the resist layer, at least one compound (E) (hereinafter referred to as "component (E)") selected from the group consisting of an organic carboxylic acid and a phosphorus oxo acid and a derivative thereof can be contained as an arbitrary component in the resist composition of the present embodiment.

Suitable examples of the organic carboxylic acid include acetic acid, malonic acid, citric acid, malic acid, succinic acid, benzoic acid, and salicylic acid.

Examples of the phosphorus oxo acid include phosphoric acid, phosphonic acid, and phosphinic acid. Of these, phosphonic acid is especially preferable.

Examples of the derivative of a phosphorus oxo acid include an ester in which the hydrogen atom of the above-described oxo acid is substituted with a hydrocarbon group. Examples of the above-described hydrocarbon group include an alkyl group having from 1 to 5 carbon atoms and an aryl group having from 6 to 15 carbon atoms.

Examples of the derivative of phosphoric acid include a phosphoric acid ester such as di-n-butyl phosphate and diphenyl phosphate.

Examples of the derivative of phosphonic acid include a phosphonic acid ester such as dimethyl phosphonate, di-n-butyl phosphonate, phenylphosphonic acid, diphenyl phosphonate, and dibenzyl phosphonate.

Examples of the derivative of phosphinic acid include a phosphinic acid ester and phenylphosphinic acid.

The compound (E) may be used solely, or may be used in combination of two or more kinds thereof.

The compound (E) is generally used in an amount ranging from 0.01 to 5 parts by mass based on 100 parts by mass of the component (A).

[Component (F)]

For the purpose of imparting water repellency to the resist film, a fluorine additive (hereinafter referred to as "component (F)") may be contained in the resist composition of the present embodiment.

A fluorine-containing high-molecular compound described in, for example, JP-A-2010-002870, JP-A-2010-032994, JP-A-2010-277043, JP-A-2011-13569, or JP-A-2011-128226, can be used as the component (F).

More specifically, examples of the component (F) include a polymer having a constituent unit (f1) represented by the following formula (f1-1). The above-described polymer is preferably a polymer (homopolymer) composed of only the constituent unit (f1) represented by the following formula (f1-1); a copolymer of the subject constituent unit (f1) and the above-described constituent unit (a1); or a copolymer of the subject constituent unit (f1), a constituent unit derived from acrylic acid or methacrylic acid, and the above-described constituent unit (a1). Here, the above-described constituent unit (a1) which is copolymerized with the subject constituent unit (f1) is preferably a constituent unit derived from 1-ethyl-1-cyclooctyl (meth)acrylate.

[Chemical Formula 50]

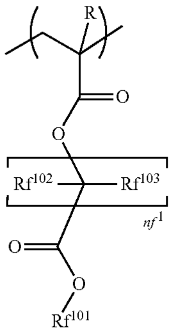

(f1-1)

In the formula, R is the same as that described above; each of $Rf^{102}$ and $Rf^{103}$ independently represents a hydrogen atom, a halogen atom, an alkyl group having from 1 to 5 carbon atoms, or a halogenated alkyl group having from 1 to 5 carbon atoms, and $R^{102}$ and $R^{103}$ may be the same as or different from each other; $nf^1$ represents an integer of from 1 to 5; and $Rf^{101}$ represents a fluorine atom-containing organic group.

In the formula (f1-1), R bonded to the carbon atom at the α-position is the same as that described above. R is preferably a hydrogen atom or a methyl group.

In the formula (f1-1), examples of the halogen atom represented by $Rf^{102}$ and $Rf^{103}$ include a fluorine atom, a chlorine atom, a bromine atom, and an iodine atom, with a fluorine atom being especially preferable. Examples of the alkyl group having from 1 to 5 carbon atoms as represented by $Rf^{102}$ and $Rf^{103}$ include the same alkyl group as that described above for the alkyl group having from 1 to 5 carbon atoms as represented by R. Of these, a methyl group or an ethyl group is preferable. Specifically, examples of the halogenated alkyl group having from 1 to 5 carbon atoms as represented by $Rf^{102}$ and $Rf^{103}$ include a group in which a part or all of the hydrogen atoms of the above-described alkyl group having from 1 to 5 carbon atoms are substituted with a halogen atom. Examples of the halogen atom include a fluorine atom, a chlorine atom, a bromine atom, and an iodine atom, with a fluorine atom being especially preferable. Above all, $Rf^{102}$ and $Rf^{103}$ are preferably a hydrogen atom, a fluorine atom, or an alkyl group having from 1 to 5 carbon atoms, and more preferably a hydrogen atom, a fluorine atom, a methyl group, or an ethyl group.

In the formula (f1-1), $nf^1$ is an integer of from 1 to 5, preferably an integer of from 1 to 3, and more preferably 1 or 2.

In the formula (f1-1), $Rf^{101}$ is a fluorine atom-containing organic group, and preferably a fluorine atom-containing hydrocarbon group.

The fluorine atom-containing hydrocarbon group may be linear, branched, or cyclic, and the carbon number thereof is preferably from 1 to 20, more preferably from 1 to 15, and especially preferably from 1 to 10.

In addition, in the fluorine atom-containing hydrocarbon group, it is preferable that 25% or more of the hydrogen atoms in the hydrocarbon group are fluorinated, and it is more preferable that 50% or more of the hydrogen atoms in the hydrocarbon group are fluorinated. In view of the fact that the hydrophobicity of the resist film at the time of immersion lithography increases, it is especially preferable that 60% or more of the hydrogen atoms in the hydrocarbon group are fluorinated.

Above all, $Rf^{101}$ is especially preferably a fluorinated hydrocarbon group having from 1 to 5 carbon atoms, and most preferably a trifluoromethyl group, $—CH_2—CF_3$, $—CH_2—CF_2—CF_3$, $—CH(CF_3)_2$, $—CH_2—CH_2—CF_3$, or $—CH_2—CH_2—CF_2—CF_2—CF_2—CF_3$.

A mass average molecular weight (Mw) (as reduced into polystyrene by means of gel permeation chromatography (GPC)) of the component (F) is preferably from 1,000 to 50,000, more preferably from 5,000 to 40,000, and most preferably from 10,000 to 30,000. When the mass average molecular weight of the component (F) is not more than the upper limit value of the foregoing range, sufficient solubility in a resist solvent for the use as a resist is revealed, and when it is the lower limit value or more of the foregoing range, satisfactory dry etching resistance and resist pattern cross-sectional shape are revealed.

A dispersity (Mw/Mn) of the component (F) is preferably from 1.0 to 5.0, more preferably from 1.0 to 3.0, and most preferably from 1.2 to 2.5.

The component (F) may be used solely, or may be used in combination of two or more kinds thereof.

The component (F) is used in a proportion of from 0.5 to 10 parts by mass based on 100 parts by mass of the component (A).

If desired, a miscible additive can be further properly added to and contained in the resist composition of the present embodiment. Examples of the miscible additive include an additive resin for improving the performance of the resist film, a dissolution inhibitor, a plasticizer, a stabilizer, a colorant, a halation prevention agent, and a dye.

[Component (S)]

The resist composition of the present embodiment can be manufactured by dissolving the resist materials in an organic solvent (hereinafter sometimes referred to as "component (S)").

The component (S) may be a material capable of dissolving the respective components to be used to form a uniform solution. One or two or more arbitrary materials can be properly selected and used among those which have been conventionally known as a solvent for chemically amplified resist.

Examples thereof include a lactone such as γ-butyrolactone; a ketone such as acetone, methyl ethyl ketone (MEK), cyclohexanone, methyl n-pentyl ketone, methyl isopentyl ketone, and 2-heptanone; a polyhydric alcohol such as ethylene glycol, diethylene glycol, propylene glycol, and dipropylene glycol; a compound having an ester bond, such as ethylene glycol monoacetate, diethylene glycol monoacetate, propylene glycol monoacetate, and dipropylene glycol monoacetate; a polyhydric alcohol derivative including a compound having an ether bond, such as a monoalkyl ether (e.g., monomethyl ether, monoethyl ether, monopropyl ether, monobutyl ether, etc.) or monophenyl ether of the above-described polyhydric alcohols or compound having an ester bond [of these, propylene glycol monomethyl ether acetate (PGMEA) or propylene glycol monomethyl ether (PGME) is preferable]; a cyclic ether such as dioxane; an ester such as methyl lactate, ethyl lactate (EL), methyl acetate, ethyl acetate, butyl acetate, methyl pyruvate, ethyl pyruvate, methyl methoxypropionate, and ethyl ethoxypropionate; an aromatic organic solvent such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene; and dimethyl sulfoxide (DMSO).

These organic solvents may be used solely, or may be used as a mixed solvent of two or more kinds thereof.

Above all, PGMEA, PGME, γ-butyrolactone, EL, or cyclohexanone is preferable.

In addition, a mixed solvent in which PGMEA and a polar solvent are mixed is also preferable. Though a blending ratio (mass ratio) thereof may be properly determined taking into consideration the compatibility between PGMEA and the polar solvent, and the like, it is allowed to fall within the range of preferably from 1/9 to 9/1, and more preferably from 2/8 to 8/2.

More specifically, in the case of blending EL or cyclohexanone as the polar solvent, a mass ratio of PGMEA/EL or cyclohexanone is preferably from 1/9 to 9/1, and more preferably from 2/8 to 8/2. In addition, in the case of blending PGME as the polar solvent, a mass ratio of PGMEA/PGME is preferably from 1/9 to 9/1, more preferably from 2/8 to 8/2, and still more preferably from 3/7 to 7/3. Furthermore, a mixed solvent of PGMEA, PGME, and cyclohexanone is also preferable.

In addition, besides, a mixed solvent of at least one member selected from PGMEA and EL with γ-butyrolactone is also preferable. In that case, a mixing proportion is preferably from 70/30 to 95/5 in terms of a mass ratio of the former/the latter.

A use amount of the component (S) is not particularly limited, and it is properly set up in a concentration at which coating on the substrate or the like can be performed, depending upon the coating film thickness. In general, the component (S) is used such that a solid content of the resist composition falls within the range of from 1 to 20% by mass, and preferably from 2 to 15% by mass.

According to the resist composition of the present invention, in the resist pattern formation in which a rinse treatment is performed after the development treatment, a resist pattern having a satisfactory shape (in particular, a shape with reduced roughness) can be obtained. Though the reasons why such an effect is obtained are not elucidated yet, it may be estimated that in the present invention, by using, as the base material component (A), a high-molecular compound having specified constituent units, namely the constituent unit (a0), the constituent unit (a1), and the constituent unit (a2), a resist film which is hardly affected by the rinse solution (whose rinse resistance is enhanced) on the occasion of the rinse treatment is formed. According to this, on the occasion of the rinse treatment, in particular, even in the case of using a surfactant-containing rinse solution which easily generates the shape change of a resist pattern, by using the resist composition of the present invention, for example, in the formation of a line pattern, the generation of pattern slippage is suppressed, and a resist pattern having a satisfactory shape is obtained.

EXAMPLES

The present invention is hereunder described in more detail by reference to the following Examples, but it should not be construed that the present invention is limited to these Examples.

In the present Examples, a compound represented by a chemical formula (I) is expressed as "Compound (1)", and compounds represented by other chemical formulae are described in the same way.

It is to be noted that in the analysis by means of NMR, an internal standard of $^{13}$C-NMR is tetramethylsilane (TMS).

Manufacturing Example of High-Molecular Compound

Manufacturing Example 1

In a separable flask equipped with a thermometer, a reflex condenser, and a nitrogen-introducing pipe, 20.00 g (117.54 mmoles) of Compound (21), 23.76 g (130.36 mmoles) of Compound (11), and 6.22 g (24.08 mmoles) of Compound (01) were dissolved in 64.21 g of a mixed solvent of propylene glycol 1-monomethyl ether 2-acetate (PM) and cyclohexanone (CH) (PM/CH=1/1 (mass ratio)). 7.20 g (31.28 mmoles) of dimethyl azobisisobutyrate (V-601) as a polymerization initiator was added to and dissolved in this solution to prepare a dropping solution.

34.83 g of a mixed solvent of PM/CH=1/1 (mass ratio) was heated to 80° C., to which was then added dropwise the above-described dropping solution under a nitrogen atmosphere over 4 hours. After completion of the dropwise addition, the reaction solution was heated with stirring for one hour, and thereafter, the reaction solution was cooled to room temperature.

An operation of adding dropwise the resulting reaction polymerization solution to a large amount of a mixed solvent of heptane (Hep) and ethyl acetate (AcOEt) (Hep/AcOEt=4/1 (mass ratio)) to deposit a polymer was performed, and a precipitated white powder was separated by filtration and washed with a mixed solvent of Hep/AcOEt=6/4 (mass ratio), followed by drying to obtain 36.15 g of High-Molecular Compound 1 as a desired material.

With respect to this High-Molecular Compound 1, a mass average molecular weight (Mw) as reduced into standard polystyrene, as determined by the GPC measurement was 7,200, and a molecular weight dispersity (Mw/Mn) was 1.73.

In addition, a copolymerization composition ratio (proportion (molar ratio) of the respective constituent units in the structural formula) determined by means of the carbon 13 nuclear magnetic resonance spectroscopy (600 MHz, $^{13}$C-NMR) was l/m/n=45/45/10.

[Chemical Formula 1]

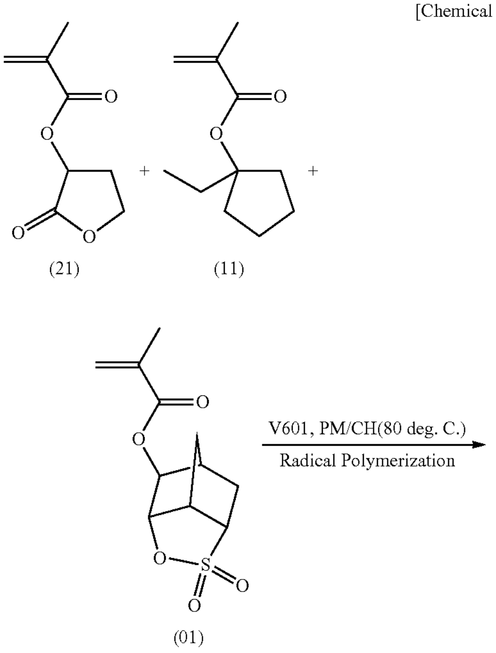

-continued

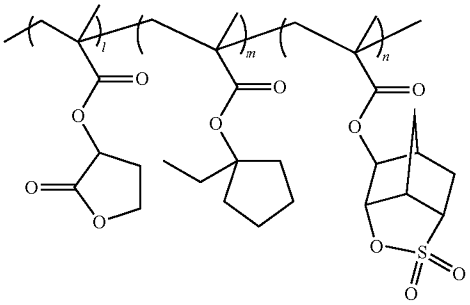

High-Molecular Compound 1

Manufacturing Examples 2 to 29

High-Molecular Compounds 2 to 29 were manufactured in the same manner as that in the above-described Manufacturing Example 1, except that the following compounds capable of providing constituent units constituting each of the high-molecular compounds were used in a molar ratio shown in Table 1.

With respect to each of the resulting High-Molecular Compounds 1 to 29, a mass average molecular weight (Mw) and a molecular weight dispersity (Mw/Mn) are shown in Table 1.

[Chemical Formula 52]

(21)

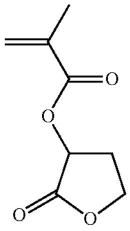

(11)

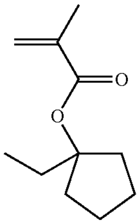

(12)

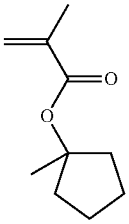

-continued (13)

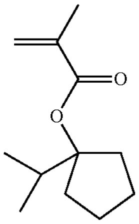

(14)

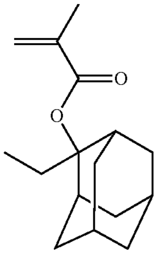

(15)

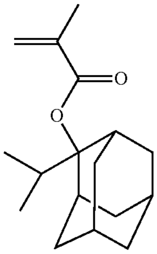

(01)

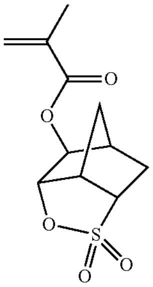

(02)

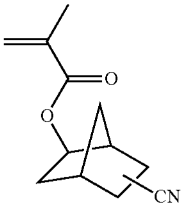

-continued
(03)
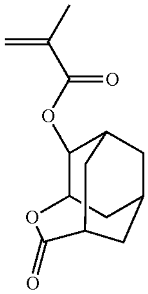
(04)
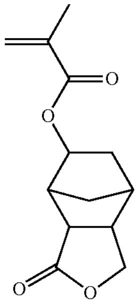
(51)
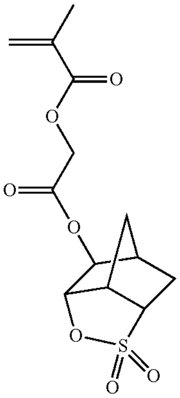
-continued
(52)
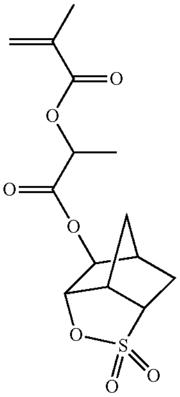
(53)
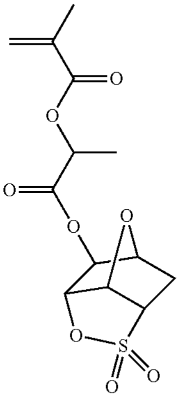
(31)
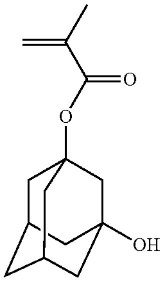
TABLE 1
| High-Molecular | Compounds (molar ratio) | | | | | | | | | | | | | | | |
|---|---|---|---|---|---|---|---|---|---|---|---|---|---|---|---|---|
| Compound | (21) | (11) | (12) | (13) | (14) | (15) | (01) | (02) | (03) | (04) | (51) | (52) | (53) | (31) | Mw | Mw/Mn |
| 1 | 45 | 45 | | | | | 10 | | | | | | | | 7200 | 1.73 |
| 2 | 45 | 45 | | | | | | 10 | | | | | | | 7000 | 1.72 |
| 3 | 45 | 45 | | | | | | | | | 10 | | | | 7200 | 1.65 |
| 4 | 45 | 45 | | | | | | | 10 | | | | | | 6900 | 1.71 |
| 5 | 45 | 45 | | | | | | | | | | 10 | | | 7000 | 1.67 |
| 6 | 45 | 45 | | | | | | | | 10 | | | | | 7000 | 1.73 |
| 7 | 45 | 45 | | | | | | | | | | | 10 | | 6800 | 1.70 |
| 8 | 45 | 30 | | | | | 25 | | | | | | | | 7100 | 1.73 |
| 9 | 45 | 30 | | | | | | 25 | | | | | | | 7200 | 1.74 |
| 10 | 45 | | 30 | | | | 25 | | | | | | | | 6800 | 1.72 |
| 11 | 45 | | 30 | | | | | 25 | | | | | | | 6900 | 1.70 |
| 12 | 45 | | | 30 | | | 25 | | | | | | | | 7200 | 1.69 |
| 13 | 45 | | | 30 | | | | 25 | | | | | | | 6900 | 1.72 |
| 14 | 60 | 30 | | | | | 10 | | | | | | | | 7000 | 1.70 |
| 15 | 60 | 30 | | | | | | 10 | | | | | | | 6800 | 1.73 |
| 16 | 50 | 50 | | | | | | | | | | | | | 6800 | 1.62 |
| 17 | 50 | | | | 50 | | | | | | | | | | 6800 | 1.71 |

TABLE 1-continued

| High-Molecular | Compounds (molar ratio) | | | | | | | | | | | | | | |
|---|---|---|---|---|---|---|---|---|---|---|---|---|---|---|---|
| Compound | (21) | (11) | (12) | (13) | (14) | (15) | (01) | (02) | (03) | (04) | (51) | (52) | (53) | (31) | Mw | Mw/Mn |
| 18 | 45 | 45 | | | | | | | | | | | | 10 | 7100 | 1.64 |
| 19 | 45 | 30 | | | | | | | | | | | | 25 | 7300 | 1.63 |
| 20 | 60 | 30 | | | | | | | | | | | | 10 | 7100 | 1.65 |
| 21 | 45 | | | | 45 | | | | | | | | | 10 | 6700 | 1.66 |
| 22 | 45 | | | | 30 | | 25 | | | | | | | | 6900 | 1.70 |
| 23 | 45 | | | | 30 | | | 25 | | | | | | | 7100 | 1.76 |
| 24 | 45 | | | | | 30 | 25 | | | | | | | | 6800 | 1.75 |
| 25 | 45 | | | | | 30 | | 25 | | | | | | | 7000 | 1.72 |
| 26 | 30 | 30 | | | | | 40 | | | | | | | | 7200 | 1.70 |
| 27 | 30 | 30 | | | | | | 40 | | | | | | | 7000 | 1.74 |
| 28 | 60 | 20 | | | | | 20 | | | | | | | | 6800 | 1.64 |
| 29 | 60 | 20 | | | | | | 20 | | | | | | | 6800 | 1.70 |

Preparation of Resist Composition

Examples 1 to 20 and Comparative Examples 1 to 9

Resist compositions of the respective Examples were prepared by mixing and dissolving respective components shown in Tables 2 and 3.

TABLE 2

| | Component (A) | Component (B) | Component (D) | Component (E) | Component (F) | Component (S) |
|---|---|---|---|---|---|---|
| Example 1 | (A)-1 [100] | (B)-1 [11.4] | (D)-1 [3.56] | (E)-1 [0.21] | (F)-1 [3.3] | (S)-1 [3200] |
| Example 2 | (A)-2 [100] | (B)-1 [11.4] | (D)-1 [3.56] | (E)-1 [0.21] | (F)-1 [3.3] | (S)-1 [3200] |
| Comparative Example 1 | (A)-3 [100] | (B)-1 [11.4] | (D)-1 [3.56] | (E)-1 [0.21] | (F)-1 [3.3] | (S)-1 [3200] |
| Example 3 | (A)-4 [100] | (B)-1 [11.4] | (D)-1 [3.56] | (E)-1 [0.21] | (F)-1 [3.3] | (S)-1 [3200] |
| Comparative Example 2 | (A)-5 [100] | (B)-1 [11.4] | (D)-1 [3.56] | (E)-1 [0.21] | (F)-1 [3.3] | (S)-1 [3200] |
| Example 4 | (A)-6 [100] | (B)-1 [11.4] | (D)-1 [3.56] | (E)-1 [0.21] | (F)-1 [3.3] | (S)-1 [3200] |
| Comparative Example 3 | (A)-7 [100] | (B)-1 [11.4] | (D)-1 [3.56] | (E)-1 [0.21] | (F)-1 [3.3] | (S)-1 [3200] |
| Example 5 | (A)-8 [100] | (B)-1 [11.4] | (D)-1 [3.56] | (E)-1 [0.21] | (F)-1 [3.3] | (S)-1 [3200] |
| Example 6 | (A)-9 [100] | (B)-1 [11.4] | (D)-1 [3.56] | (E)-1 [0.21] | (F)-1 [3.3] | (S)-1 [3200] |
| Example 7 | (A)-10 [100] | (B)-1 [11.4] | (D)-1 [3.56] | (E)-1 [0.21] | (F)-1 [3.3] | (S)-1 [3200] |
| Example 8 | (A)-11 [100] | (B)-1 [11.4] | (D)-1 [3.56] | (E)-1 [0.21] | (F)-1 [3.3] | (S)-1 [3200] |
| Example 9 | (A)-12 [100] | (B)-1 [11.4] | (D)-1 [3.56] | (E)-1 [0.21] | (F)-1 [3.3] | (S)-1 [3200] |
| Example 10 | (A)-13 [100] | (B)-1 [11.4] | (D)-1 [3.56] | (E)-1 [0.21] | (F)-1 [3.3] | (S)-1 [3200] |
| Example 11 | (A)-14 [100] | (B)-1 [11.4] | (D)-1 [3.56] | (E)-1 [0.21] | (F)-1 [3.3] | (S)-1 [3200] |
| Example 12 | (A)-15 [100] | (B)-1 [11.4] | (D)-1 [3.56] | (E)-1 [0.21] | (F)-1 [3.3] | (S)-1 [3200] |

TABLE 3

| | Component (A) | Component (B) | Component (D) | Component (E) | Component (F) | Component (S) |
|---|---|---|---|---|---|---|
| Comparative Example 4 | (A)-16 [100] | (B)-1 [11.4] | (D)-1 [3.56] | (E)-1 [0.21] | (F)-1 [3.3] | (S)-1 [3200] |
| Comparative Example 5 | (A)-17 [100] | (B)-1 [11.4] | (D)-1 [3.56] | (E)-1 [0.21] | (F)-1 [3.3] | (S)-1 [3200] |
| Comparative Example 6 | (A)-18 [100] | (B)-1 [11.4] | (D)-1 [3.56] | (E)-1 [0.21] | (F)-1 [3.3] | (S)-1 [3200] |
| Comparative | (A)-19 | (B)-1 | (D)-1 | (E)-1 | (F)-1 | (S)-1 |

TABLE 3-continued

| | Component (A) | Component (B) | Component (D) | Component (E) | Component (F) | Component (S) |
|---|---|---|---|---|---|---|
| Example 7 | [100] | [11.4] | [3.56] | [0.21] | [3.3] | [3200] |
| Comparative | (A)-20 | (B)-1 | (D)-1 | (E)-1 | (F)-1 | (S)-1 |
| Example 8 | [100] | [11.4] | [3.56] | [0.21] | [3.3] | [3200] |
| Comparative | (A)-21 | (B)-1 | (D)-1 | (E)-1 | (F)-1 | (S)-1 |
| Example 9 | [100] | [11.4] | [3.56] | [0.21] | [3.3] | [3200] |
| Example 13 | (A)-22 | (B)-1 | (D)-1 | (E)-1 | (F)-1 | (S)-1 |
| | [100] | [11.4] | [3.56] | [0.21] | [3.3] | [3200] |
| Example 14 | (A)-23 | (B)-1 | (D)-1 | (E)-1 | (F)-1 | (S)-1 |
| | [100] | [11.4] | [3.56] | [0.21] | [3.3] | [3200] |
| Example 15 | (A)-24 | (B)-1 | (D)-1 | (E)-1 | (F)-1 | (S)-1 |
| | [100] | [11.4] | [3.56] | [0.21] | [3.3] | [3200] |
| Example 16 | (A)-25 | (B)-1 | (D)-1 | (E)-1 | (F)-1 | (S)-1 |
| | [100] | [11.4] | [3.56] | [0.21] | [3.3] | [3200] |
| Example 17 | (A)-26 | (B)-1 | (D)-1 | (E)-1 | (F)-1 | (S)-1 |
| | [100] | [11.4] | [3.56] | [0.21] | [3.3] | [3200] |
| Example 18 | (A)-27 | (B)-1 | (D)-1 | (E)-1 | (F)-1 | (S)-1 |
| | [100] | [11.4] | [3.56] | [0.21] | [3.3] | [3200] |
| Example 19 | (A)-28 | (B)-1 | (D)-1 | (E)-1 | (F)-1 | (S)-1 |
| | [100] | [11.4] | [3.56] | [0.21] | [3.3] | [3200] |
| Example 20 | (A)-29 | (B)-1 | (D)-1 | (E)-1 | (F)-1 | (S)-1 |
| | [100] | [11.4] | [3.56] | [0.21] | [3.3] | [3200] |

In Tables 2 and 3, the numerical values in the square brackets express blending amounts (parts by mass), and the respective symbols have the following meanings.

(A)-1 to (A)-29: High-Molecular Compounds 1 to 29 described above (B)-1: Acid generator composed of a compound represented by the following chemical formula (B)-1

(D)-1: Acid diffusion controller composed of a compound represented by the following chemical formula (D)-1

(E)-1: Salicylic acid (F)-1: High-molecular compound represented by the following chemical formula (F)-1. A mass average molecular weight (Mw) as reduced into standard polystyrene, as determined by the GPC measurement is 23,100, and a molecular weight dispersity (Mw/Mn) is 1.78. A copolymerization composition ratio (proportion (molar ratio) of the respective constituent units in the structural formula) determined by means of the carbon 13 nuclear magnetic resonance spectroscopy (600 MHz, $^{13}$C-NMR) is l/m=77/23.

(S)-1: Mixed solvent of PGMEA/PGME/cyclohexanone=45/30/25 (mass ratio)

[Chemical Formula 53]

(B)-1

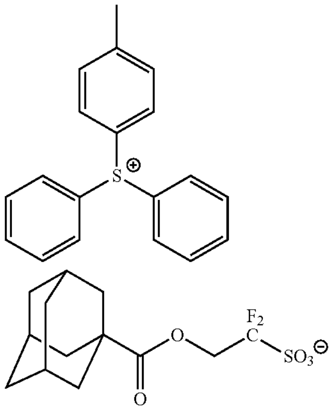

-continued (D)-1

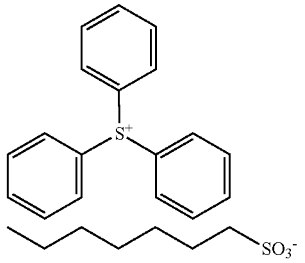

(F)-1

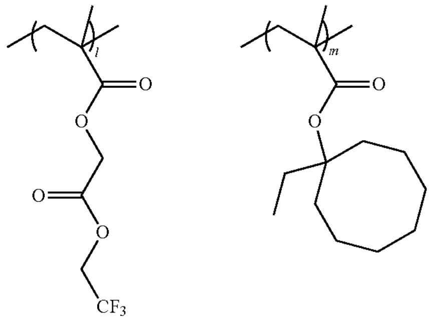

<Preparation of Rinse Solution>

A rinse solution which is used on the occasion of a rinse treatment in the <Formation of resist pattern> as described later was prepared. Specifically, each of three kinds of nonionic surfactants described below was dissolved in pure water, thereby obtaining aqueous solutions having a nonionic surfactant concentration of 0.05% by mass (Rinse Solution 1, Rinse Solution 2, and Rinse Solution 3).

General formula of nonionic surfactant:

$$R''—O—(PO)_y\text{-}(EO)_x—H$$

R″, PO, EO, x, and y are the same as those described above.

Nonionic surfactant used for Rinse Solution 1: R″=dodecyl group, x=7, y=0

Nonionic surfactant used for Rinse Solution 2: R″=tridecyl group, x=9, y=3

Nonionic surfactant used for Rinse Solution 3: R″=dodecyl group, x=10, y=4

It is to be noted that as the three kinds of nonionic surfactants, those synthesized in conformity with the respective manufacturing methods described in Comparative Example 1, Example 2, and Example 1 in Japanese Patent No. 4323249 were used.

<Formation of Resist Pattern>

A resist pattern was formed using the resist composition of each of the Examples by a resist pattern formation method as shown below.

An organic antireflection film composition "ARC29A" (a trade name, manufactured by Brewer Science, Inc.) was coated on a 12-inch silicon wafer by using a spinner and baked for drying on a hot plate at 205° C. for 60 seconds, thereby forming an organic antireflection film having a thickness of 90 nm.

Subsequently, each of the above-described resist compositions was coated on the organic antireflection film by using a spinner and subjected to a prebake (PAB) treatment for drying on a hot plate at 130° C. for 60 seconds, thereby forming a resist film having a thickness of 90 nm.

Subsequently, the resist film having a topcoat formed thereon was selectively irradiated with an ArF excimer laser (193 nm) through a mask (6% halftone) using, as a target, a line-and-space resist pattern (hereinafter referred to as "LS pattern") having a line width of 49 nm and a pitch of 98 nm by using an ArF liquid immersion lithography apparatus, NSR-S609B (manufactured by Nikon Corporation, NA (numerical aperture)=1.07, Cross-pole (0.78/0.97) with PLANO).

Then, after exposure at 85° C. for 60 seconds, a heating (PEB) treatment was performed, and an alkali development treatment with a 2.38% by mass tetramethylammonium hydroxide (TMAH) aqueous solution "NMD-3" (a trade name, manufactured by Tokyo Ohka Kogyo Co., Ltd.) was further performed at 23° C. for 10 seconds.

Subsequently, a rinse treatment with each of the rinse solutions (Rinse Solution 1, Rinse Solution 2, and Rinse Solution 3) was performed for 10 seconds, followed by drying by shaking.

Thereafter, post bake was performed under a condition at 100° C. for 60 seconds.

As a result, in all of the Examples, an LS pattern in which a line pattern having a width of 49 nm was arranged at regular intervals (pitch: 98 nm) was formed on the resist film.

[Evaluation of Resist Pattern Shape]

The LS pattern formed in the above-described <Formation of resist pattern> was observed from the upper side using a scanning electron microscope (a trade name: SU-8000, manufactured by Hitachi High-Technologies Corporation), and the generation state of "pattern slippage" was evaluated on the basis of evaluation criteria shown in FIG. 1. The results are shown in Table 4.

FIG. 1 is an SEM image of a line pattern observed from the upper side, showing evaluation criteria in evaluating such a resist pattern shape.

In FIG. 1, Evaluation "A" shows the state in which the generation of pattern slippage is not perceived; Evaluation "B" shows the state in which pattern slippage is partially generated; and Evaluation "C" shows the state in which pattern slippage is entirely generated.

[Evaluation of Optimum Exposure Dose (Eop)]

An optimum exposure dose Eop (mJ/cm$^2$) at which an LS pattern of the target size by the above-described resist pattern formation method was determined. The results are shown in Table 4.

[Evaluation of Line Width Roughness (LWR)]

In the LS pattern formed in the above-described <Formation of resist pattern>, the line width was measured at 400 points in the line longitudinal direction using a critical dimension SEM (scanning electron microscope, accelerating voltage: 300 V, a trade name: S-9380, manufactured by Hitachi High-Technologies Corporation). A value of 3 times (3s) the standard deviation (s) was determined from a result thereof, and an averaged value regarding the 3s at the 400 points was calculated as a yardstick showing LWR. The results are shown in terms of "LWR (nm)" in Table 4. It is meant that the smaller this 3s value is, not only the smaller the line width roughness is, but the more uniform the width of the LS pattern is.

TABLE 4

| | Pattern slippage | | | Eop (mJ/cm$^2$) | | | LWR (nm) | | |
|---|---|---|---|---|---|---|---|---|---|
| | Rinse Solution 1 | Rinse Solution 2 | Rinse Solution 3 | Rinse Solution 1 | Rinse Solution 2 | Rinse Solution 3 | Rinse Solution 1 | Rinse Solution 2 | Rinse Solution 3 |
| Example 1 | A | A | A | 20 | 20 | 20 | 4.7 | 4.5 | 4.4 |
| Example 2 | A | A | B | 21 | 21 | — | 4.6 | 4.4 | — |
| Comparative Example 1 | A | B | C | 20 | — | — | 4.9 | — | — |
| Example 3 | A | A | B | 21 | 21 | — | 5.2 | 5.0 | — |
| Comparative Example 2 | A | B | C | 21 | — | — | 5.2 | — | — |
| Example 4 | A | A | B | 22 | 22 | — | 5.0 | 4.8 | — |
| Comparative Example 3 | A | B | C | 21 | — | — | 4.9 | — | — |
| Example 5 | A | A | A | 24 | 24 | 24 | 4.5 | 4.3 | 4.2 |
| Example 6 | A | A | A | 24 | 24 | 24 | 4.6 | 4.4 | 4.1 |
| Example 7 | A | A | A | 27 | 27 | 27 | 5.0 | 4.8 | 4.4 |
| Example 8 | A | A | A | 27 | 27 | 27 | 5.0 | 4.8 | 4.4 |
| Example 9 | A | A | A | 21 | 21 | 22 | 5.4 | 5.1 | 4.7 |
| Example 10 | A | A | A | 21 | 21 | 22 | 5.4 | 5.1 | 4.7 |
| Example 11 | A | A | A | 22 | 22 | 22 | 4.6 | 4.3 | 4.0 |
| Example 12 | A | A | A | 22 | 22 | 22 | 4.4 | 4.2 | 3.9 |
| Comparative Example 4 | C | C | C | — | — | — | — | — | — |

TABLE 4-continued

| | Pattern slippage | | | Eop (mJ/cm$^2$) | | | LWR (nm) | | |
|---|---|---|---|---|---|---|---|---|---|
| | Rinse Solution 1 | Rinse Solution 2 | Rinse Solution 3 | Rinse Solution 1 | Rinse Solution 2 | Rinse Solution 3 | Rinse Solution 1 | Rinse Solution 2 | Rinse Solution 3 |
| Comparative Example 5 | C | C | C | — | — | — | — | — | — |
| Comparative Example 6 | C | C | C | — | — | — | — | — | — |
| Comparative Example 7 | C | C | C | — | — | — | — | — | — |
| Comparative Example 8 | C | C | C | — | — | — | — | — | — |
| Comparative Example 9 | C | C | C | — | — | — | — | — | — |
| Example 13 | A | A | A | 24 | 23 | 23 | 6.3 | 5.9 | 5.5 |
| Example 14 | A | A | A | 23 | 23 | 23 | 6.0 | 5.7 | 5.3 |
| Example 15 | A | A | A | 22 | 22 | 22 | 6.4 | 6.0 | 5.6 |
| Example 16 | A | A | A | 22 | 22 | 22 | 6.4 | 6.0 | 5.6 |
| Example 17 | A | A | A | 24 | 24 | 24 | 8.7 | 8.2 | 7.6 |
| Example 18 | A | A | A | 24 | 24 | 24 | 8.2 | 7.8 | 7.2 |
| Example 19 | A | A | A | 33 | 33 | 33 | 8.3 | 7.7 | 7.4 |
| Example 20 | A | A | A | 34 | 33 | 33 | 8.4 | 7.7 | 7.3 |

It is understood from the results of Table 4 that in forming a resist pattern by performing the rinse treatment after the development treatment, by using each of the resist compositions of Examples 1 to 20, even in the case of using any of the rinse solutions, the generation of pattern slippage is suppressed, and a resist pattern having a satisfactory shape can be formed.

In addition to the above, it is also understood that in Examples 1 to 20, a resist pattern with high sensitivity and reduced roughness can be formed.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist pattern formation method comprising:

forming a resist film on a support by using a resist composition, containing a base material component (A) whose solubility in the developing solution changes by the action of an acid, the base material component (A) containing a high-molecular compound (A1) having a constituent unit (a0) represented by the following general formula (a0-1), a constituent unit (a1) containing an acid decomposable group whose polarity increases by the action of an acid, and a constituent unit (a2) containing a group represented by the following general formula (a2-r-1);

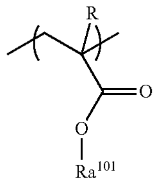

(a0-1)

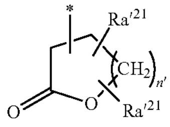

(a2-r-1)

wherein R represents a hydrogen atom, an alkyl group having from 1 to 5 carbon atoms, or a halogenated alkyl group having from 1 to 5 carbon atoms; Ra$^{01}$ represents an —$SO_2$-containing polycyclic ring, and the —$SO_2$-containing polycyclic ring is directly bonded to an oxygen atom of the ester bond of the general formula (a0-1); each of Ra'$^{21}$s independently represents a hydrogen atom, an alkyl group, an alkoxy group, a halogen atom, a halogenated alkyl group, a hydroxyl group, —COOR", —OC(═O)R", a hydroxyalkyl group, or a cyano group; R" represents a hydrogen atom or an alkyl group; n' represents an integer of from 0 to 2; and * represents a valence bond;

exposing the resist film;

developing the resist film; and after developing the resist film, performing a rinse treatment using a nonionic surfactant aqueous solution, wherein the nonionic surfactant is represented by the following formula:

$$R''—O—(PO)_y\text{-}(EO)_x—H$$

wherein R″ represents a linear or branched alkyl group having from 8 to 30 carbon atoms; PO represents an oxypropylene group; EO represents an oxyethylene group; x is from 5 to 15; and y is from 3 to 15.

2. The resist pattern formation method according to claim 1, wherein the constituent unit (a1) is a constituent unit (a1c) containing an aliphatic monocyclic group-containing group as the acid decomposable group.

3. The resist pattern formation method according to claim 2, wherein a proportion of the constituent unit (a1c) is not more than 45% by mole relative to a total sum of all of the constituent units constituting the high-molecular compound (A1), and a proportion of the constituent unit (a0) is from 10 to 25% by mole relative to a total sum of all of the constituent units constituting the high-molecular compound (A1).

4. The resist pattern formation method according to claim 1, wherein the nonionic surfactant is a polyoxyalkylene alkyl ether.

5. The resist pattern formation method according to claim 1, wherein a blending amount of the surfactant in the nonionic surfactant aqueous solution is from 0.001 to 5% by mass relative to the whole amount of the rinse solution.

6. The resist pattern formation method according to claim 1, wherein the constituent unit (a1) is a constituent unit (a1c) containing an aliphatic monocyclic group-containing group as the acid decomposable group.

7. The resist pattern formation method according to claim 6, wherein the high-molecular compound (A1) is a high-molecular compound composed of a repeating structure of the constituent unit (a0) containing a group represented by the following general formula (a0-r-7), the constituent unit (a1c), and the constituent unit (a2)

(a0-r-7)

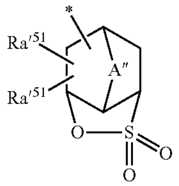

wherein each of Ra'51s independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; and A" represents an alkylene group having from 1 to 5 carbon atoms, which may include an oxygen atom or a sulfur atom, an oxygen atom, or a sulfur atom.

8. The resist pattern formation method according to claim 7, wherein a proportion of the constituent unit (a1c) is not more than 45% by mole relative to a total sum of all of the constituent units constituting the high-molecular compound (A1), and a proportion of the constituent unit (a0) is from 10 to 25% by mole relative to a total sum of all of the constituent units constituting the high-molecular compound (A1).

* * * * *